United States Patent
Nishimura et al.

(10) Patent No.: US 7,638,261 B2
(45) Date of Patent: Dec. 29, 2009

(54) RADIATION-SENSITIVE RESIN COMPOSITION

(75) Inventors: Yukio Nishimura, Tokyo (JP); Hiroyuki Ishii, Tokyo (JP); Isao Nishimura, Tokyo (JP); Eiichi Kobayashi, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 12/348,171

(22) Filed: Jan. 2, 2009

(65) Prior Publication Data

US 2009/0148790 A1 Jun. 11, 2009

Related U.S. Application Data

(63) Continuation of application No. 10/533,223, filed as application No. PCT/JP03/13560 on Oct. 23, 2003, now Pat. No. 7,521,169.

(30) Foreign Application Priority Data

| Oct. 29, 2002 | (JP) | ............................. 2002-315021 |
| Jul. 4, 2003 | (JP) | ............................. 2003-192477 |

(51) Int. Cl.
    G03F 7/00      (2006.01)
    G03F 7/004     (2006.01)
(52) U.S. Cl. .................................. 430/270.1; 430/913
(58) Field of Classification Search .............. 430/270.1, 430/913
    See application file for complete search history.

(56) References Cited

U.S. PATENT DOCUMENTS

| 6,784,312 B2 | 8/2004 | Miyazawa et al. |
| 6,939,662 B2 | 9/2005 | Mizutani et al. |
| 7,108,951 B2 | 9/2006 | Sasaki et al. |

FOREIGN PATENT DOCUMENTS

| EP | 1048983 A1 | 11/2000 |
| EP | 1319981 A2 | 6/2003 |
| EP | 1341038 | 9/2003 |
| JP | 2002-303979 | 3/1984 |
| JP | 59045439 | 3/1984 |
| JP | 04226461 | 8/1992 |
| JP | 2002-072484 | 9/1995 |
| JP | 07234511 | 9/1995 |
| JP | 2001-188347 | 7/2001 |
| JP | 2002-162745 | 6/2002 |
| JP | 2002-169287 | 6/2002 |
| JP | 2002-182393 | 6/2002 |
| JP | 2003-140349 | 5/2003 |
| JP | 2003-241386 | 8/2003 |
| JP | 2003-337419 | 11/2003 |
| JP | 2003-345022 | 12/2003 |
| JP | 2004-046098 | 2/2004 |

*Primary Examiner*—Amanda C. Walke
(74) *Attorney, Agent, or Firm*—Morris, Manning & Martin, LLP; Christopher W. Raimund

(57) ABSTRACT

A radiation-sensitive resin composition suitable as a chemically-amplified resist useful for microfabrication utilizing various types of radiation such as deep ultraviolet rays represented by a KrF excimer laser or ArF excimer laser. The radiation-sensitive resin composition of the present invention comprises: (A) a resin comprising a recurring unit (1-1) shown by the following formula (I-1) and (B) a radiation-sensitive acid generator such as 1-(4-n-butoxynaphthyl)tetrahydrothiophenium nonafluoro-n-butanesulfonate. The radiation-sensitive resin composition may further comprise (C) an acid diffusion controller such as phenylbenzimidazole.

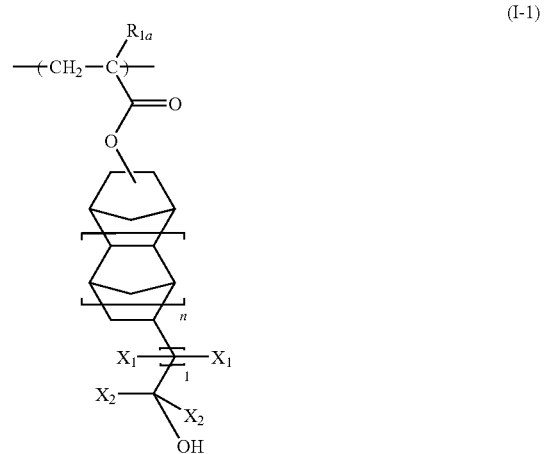

15 Claims, No Drawings

RADIATION-SENSITIVE RESIN COMPOSITION

This application is a continuation of U.S. patent application Ser. No. 10/533,223, which is a national stage entry of International Application No. PCT/JP03/13560, filed on Oct. 23, 2003. Each of the aforementioned applications is incorporated by reference herein in its entirety.

TECHNICAL FIELD

The present invention relates to a radiation-sensitive resin composition. More particularly, the present invention relates to a radiation-sensitive resin composition suitable as a chemically-amplified resist useful for microfabrication utilizing various types of radiation, for example, deep ultraviolet rays such as a KrF excimer laser or ArF excimer laser, charged particle rays such as electron beams, or X-rays such as synchrotron radiation.

BACKGROUND ART

In the field of microfabrication represented by the manufacture of integrated circuit devices, lithographic technology enabling microfabrication with a line width of 0.20 μm or less has been demanded in order to increase the degree of integration in recent years.

In a conventional lithographic process, near ultraviolet rays such as i-line radiation have been generally used. However, it is difficult to perform microfabrication with a line width of a sub-quarter micron level using near ultraviolet rays.

Therefore, in order to enable microfabrication with a line width of 0.20 μm or less, utilization of radiation with a shorter wavelength has been studied. Deep ultraviolet rays represented by a bright line spectrum of a mercury lamp and an excimer laser, X-rays, electron beams, and the like can be given as radiation with a shorter wavelength. Of these, a KrF excimer laser (wavelength: 248 nm) and an ArF excimer laser (wavelength: 193 nm) have gained attention.

As a radiation-sensitive resin composition applicable to the excimer laser radiation, a number of compositions utilizing a chemical amplification effect between a component having an acid-dissociable functional group and a component generating an acid (hereinafter called "photoacid generator") upon irradiation (hereinafter called "exposure") have been proposed. Such a composition is hereinafter called a chemically-amplified radiation-sensitive composition.

As the chemically-amplified radiation-sensitive composition, JP-A-59-45439 discloses a composition comprising a polymer containing a t-butyl ester group of carboxylic acid or a t-butylcarbonate group of phenol and a photoacid generator. This composition utilizes the effect of the polymer to release a t-butyl ester group or t-butyl carbonate group in the polymer by the action of an acid generated upon exposure to form an acidic group such as a carboxylic group or a phenolic hydroxyl group, which allows the exposed area on the resist film to be readily soluble in an alkaline developer.

Many conventional chemically-amplified radiation-sensitive compositions use a phenol resin as a base. If the composition contains such a resin, deep ultraviolet rays used as radiation for exposure are absorbed in the resin due to aromatic rings and cannot sufficiently reach the lower layers of the resist film. Because of this, the dose of the radiation is greater in the upper layers and is smaller in the lower layers of the resist film. This causes a resist pattern to be thinner in the upper portion but to be thicker toward the lower portion, thereby forming a trapezoid shape after development. No sufficient resolution can be obtained from such a resist film. If the resist pattern after development is in the shape of a trapezoid, desired dimensional accuracy cannot be achieved in a succeeding step such as an etching step or ion implantation step. Moreover, if the shape of the upper part of the resist pattern is not rectangular, the rate of removal of the resist by dry etching is increased, whereby it is difficult to control etching conditions.

The shape of the resist pattern can be improved by increasing the radiation transmittance of the resist film. For example, (meth)acrylate resins represented by polymethylmethacrylate are desirable from the viewpoint of radiation transmittance due to the superior transparency to deep ultraviolet rays. JP-A-4-226461 discloses a chemically-amplified radiation-sensitive resin composition using a methacrylate resin. However, this composition has insufficient dry etching resistance due to the absence of an aromatic ring, although the composition excels in microfabrication performance. Therefore, this composition also has difficulty in performing etching with high accuracy and cannot satisfy transparency to radiation and dry etching resistance at the same time.

A method of introducing an alicyclic ring into the resin component in the composition instead of an aromatic ring has been known as a means of improving dry etching resistance without impairing radiation transmittance of the resist made from a chemically-amplified radiation-sensitive resin composition. A chemically-amplified radiation-sensitive resin composition using a (meth)acrylate resin having an alicyclic ring is proposed in JP-A-7-234511, for example.

This composition, however, comprises groups which are comparatively easily dissociated by conventional acids (for example, an acetal functional group such as a tetrahydropyranyl group) and groups which are comparatively difficult to be dissociated by an acid (for example, a t-butyl functional group such as a t-butyl ester group, t-butylcarbonate group) as an acid-dissociable functional group in the resin component. The resin component having the former acid-dissociable functional group provides a resist with favorable basic properties, particularly excellent sensitivity and pattern formability, but the composition has a problem with storage stability. The resin component having the latter acid-dissociable functional group, on the other hand, provides a composition with good storage stability, but the resist has a problem with its basic properties, particularly with sensitivity and pattern formability. In addition, inclusion of an alicyclic structure in the resin components of this composition increases hydrophobicity of the resin, resulting in poor adhesion to substrates.

In view of recent progress in the microfabrication of semiconductor devices, development of a novel resin component exhibiting high transmittance of radiations, having excellent basic properties as a resist, and suitable for use in chemically-amplified radiation-sensitive compositions which can be adapted for short wavelength radiations represented by deep ultraviolet rays has been undertaken (for example, refer to JP-A-2002-72484). However, there have been no resin components satisfying all of these requirements.

DISCLOSURE OF THE INVENTION

An object of the present invention is to provide a radiation-sensitive resin composition having high transparency to radiation, excelling in basic properties as a resist such as sensitivity, resolution, dry etching resistance, and pattern shape, and, in particular, producing only minimal development defects.

Specifically, the present invention provides the following radiation-sensitive resin compositions.

<1> A radiation-sensitive resin composition comprising:

(A) a resin which comprises a recurring unit (1-1) shown by the following formula (I-1):

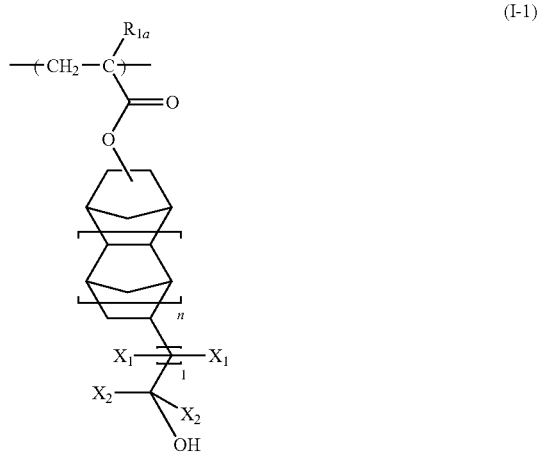

(I-1)

wherein $R_{1a}$ represents a hydrogen atom, a methyl group, a hydroxyalkyl group having 1-4 carbon atoms, or a perfluoroalkyl group having 1-4 carbon atoms, $X_1$ and $X_2$ individually represent a hydrogen atom, a fluorine atom, an alkyl group having 1-4 carbon atoms, or a fluoroalkyl group having 1-4 carbon atoms, l is an integer of 0-5, and n is an integer of 0-2, the resin being insoluble or scarcely soluble in alkali, but becoming alkali soluble by the action of an acid, and (B) a photoacid generator.

<2> The radiation-sensitive resin composition described in <1> above, wherein the resin further comprises a recurring unit (1-2) shown by the following formula (I-2):

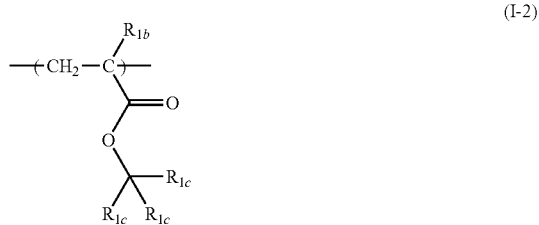

(I-2)

wherein $R_{1b}$ represents a hydrogen atom or a methyl group, and $R_{1c}$, individually represents a monovalent alicyclic hydrocarbon group having 4-20 carbon atoms or a derivative thereof, or a linear or branched alkyl group having 1-4 carbon atoms, provided that (1) at least one of the $R_{1c}$ groups is a monovalent alicyclic hydrocarbon group having 4-20 carbon atoms, or (2) any two of the $R_{1c}$ groups form, in combination and together with the carbon atom with which these groups bond, a divalent alicyclic hydrocarbon group having 4-20 carbon atoms or a derivative thereof, with the other $R_{1c}$ group being a monovalent alicyclic hydrocarbon group having 4-20 carbon atoms or a derivative thereof, or a linear or branched alkyl group having 1-4 carbon atoms.

<3> The radiation sensitive resin composition described in <2> above, wherein the group —$C(R_{1c})_3$ in the formula (I-2) is a 1-alkyl-1-cycloalkyl group, 2-alkyl-2-adamantyl group, (1-alkyl-1-adamantyl)alkyl group, or (1-alkyl-1-norbornyl)alkyl group.

<4> The radiation-sensitive resin composition described in <1> above, wherein the resin does not contain a lactone ring.

<5> The radiation-sensitive resin composition described in <4> above, wherein the content of the recurring unit (1-1) in the resin is 40-90 mol % in 100 mol % of the total recurring units forming the resin.

<6> The radiation-sensitive resin composition described in <1> above, wherein the resin further comprises a recurring unit (1-3) shown by the following formula (I-3):

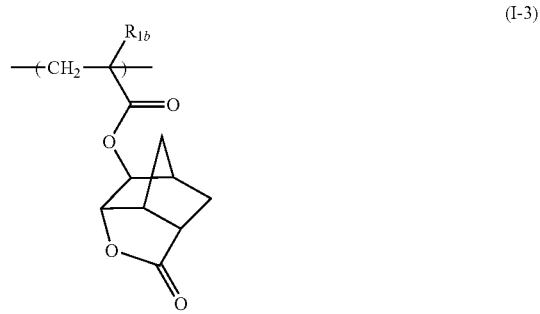

(I-3)

wherein $R_{1b}$ represents a hydrogen atom or a methyl group.

<7> The radiation-sensitive resin composition described in <6> above, wherein the content of the recurring unit (1-1) in the resin is 5-25 mol % in 100 mol % of the total recurring units forming the resin.

<8> The radiation-sensitive resin composition described in <1> above, wherein the resin further comprises a recurring unit (1-4) shown by the following formula (I-4):

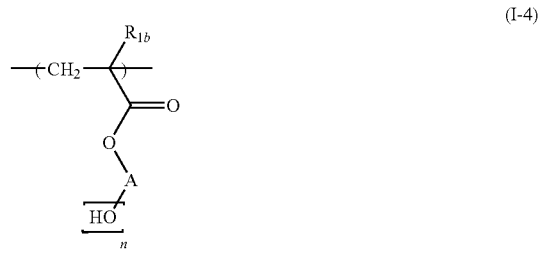

(I-4)

wherein $R_{1b}$ represents a hydrogen atom or a methyl group, A represents a linear or branched alkyl or alkylene group having 1-4 carbon atoms or a monovalent or divalent alicyclic hydrocarbon group having 4-20 carbon atoms or a derivative thereof, and n is an integer of 0-2.

<9> The radiation-sensitive resin composition described in <1> above, further comprising (C) an acid diffusion controller.

The radiation-sensitive resin composition of the present invention is useful as a chemically-amplified resist sensitive to active rays, particularly deep ultraviolet rays represented, for example, by a KrF excimer laser (wavelength 248 nm) or an ArF excimer laser (wavelength: 193 nm). In addition, the radiation-sensitive resin composition of the present invention exhibits high resolution and excels in sensitivity, pattern shape, and etching resistance due to the high radiation transmittance. Furthermore, the radiation-sensitive resin composition of the present invention produces development defects only to a minimal extent due to small fluctuation of patterns after etching and excellent solubility, particularly, in developing solutions. The composition also exhibits excellent adhesion with substrates and produces a superior skirt configuration. Therefore, the radiation-sensitive resin composition of the present invention is very suitable for manufacturing integrated circuit elements which are demanded to become further miniaturized in the future.

Resolution of resist patterns can be improved even more when the resin (A) comprises the recurring unit (1-1) together with other specific recurring units (hereinafter referred to as "other recurring units").

DETAILED DESCRIPTION OF THE INVENTION AND PREFERRED EMBODIMENT

The present invention will now be described in detail.
The nomenclature basis of the polyalicyclic skeletons used in the following description is as follows.

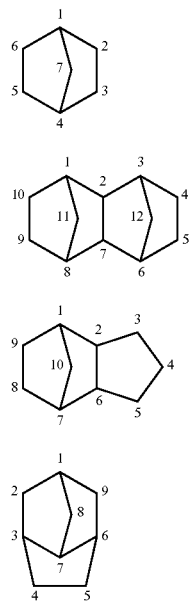

In the above formulas, the skeleton (A) is named bicyclo [2.2.1]heptane, (B) is named tetracyclo[6.2.1.1$^{3,6}$.0$^{2,7}$]dodecane, (C) is named tricyclo[5.2.0$^{2,6}$]decane, and (D) is named tricyclo[4.2.1.0$^{3,7}$]nonane. In the following description, the nomenclatures (A) to (D) are followed.

(1) Resin (A)

The resin (A) contained in the radiation-sensitive resin composition of the present invention is a polymer comprising a recurring unit shown by the above formula (I-1) (hereinafter referred to as "recurring unit (1-1)").

The resin (A) of the present invention is insoluble or scarcely soluble in alkali, but becomes easily soluble in alkali by the action of an acid. The term "alkali insoluble or scarcely alkali-soluble" used herein indicates the following properties of the resin (A). Specifically, in the case of developing a film using only the resin (A) instead of a resist film under alkaline development conditions employed when forming a resist pattern of the resist film formed from a radiation-sensitive resin composition containing the resin (A), the term "alkali insoluble or scarcely alkali-soluble" refers to properties in which 50% or more of the initial thickness of the resist film remains after the development.

The substituent $R_{1a}$ forming the above recurring unit (1-1) represents one of the group selected from a hydrogen atom, a methyl group, a hydroxyalkyl group having 1-4 carbon atoms, and a perfluoroalkyl group having 1-4 carbon atoms. Preferable examples are a hydrogen atom, methyl group, ethyl group, monofluoromethyl group, difluoromethyl group, trifluoromethyl group, hydroxymethyl group, 2-hydroxyethyl group, and the like. Of these, the hydrogen atom, methyl group, trifluoromethyl group, and hydroxymethyl group are preferable.

$X_1$ and $X_2$ forming the above recurring unit (1-1) individually represent one of the group selected from a hydrogen atom, a fluorine atom, an alkyl group having 1-4 carbon atoms, and a fluoroalkyl group having 1-4 carbon atoms. As examples of the alkyl groups, a methyl group, ethyl group, n-propyl group, i-propyl group, n-butyl group, 2-methylpropyl group, 1-methylpropyl group, and t-butyl group can be given. As examples of the fluoroalkyl group, a monofluoromethyl group, difluoromethyl group, trifluoromethyl group, 1-fluoroethyl group, 1,2-difluoroethyl group, 1,1,2,2-tetrafluoroethyl group, and the like can be given. As the group $X_1$, a hydrogen atom, fluorine atom, methyl group, and trifluoromethyl group are preferable. As the group $X_2$, a fluorine atom and trifluoromethyl group are preferable. As the combination of $X_1$ and $X_2$, a combination of a hydrogen atom for $X_1$ and a trifluoromethyl group for $X_2$, a combination of a fluorine atom for $X_1$ and a trifluoromethyl group for $X_2$, and the like are preferable.

1 in the formula (I-1) is an integer of 0-5, and preferably an integer of 0-3. n is an integer of 0-2, and preferably 0 or 1.

As monomers that provide the recurring unit (1-1) having the above substituents $R_{1a}$, $X_1$, and $X_2$, compounds shown by the following formula (II) can be given.

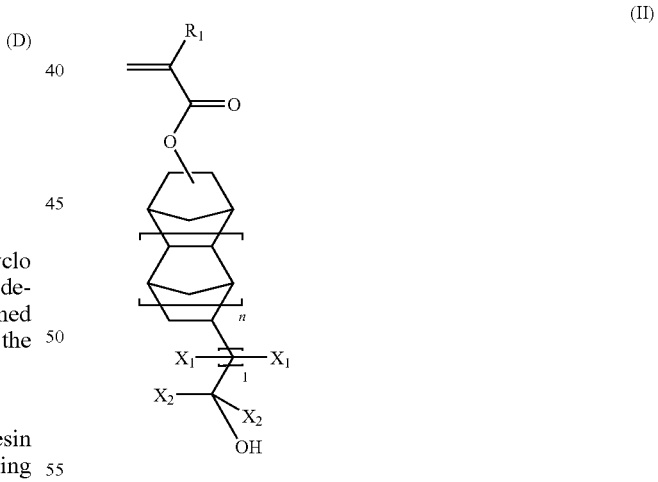

wherein $R_{1a}$ represents a hydrogen atom, a methyl group, a hydroxyalkyl group having 1-4 carbon atoms, or a perfluoroalkyl group having 1-4 carbon atoms, $X_1$ and $X_2$ individually represent a hydrogen atom, a fluorine atom, an alkyl group having 1-4 carbon atoms, or a fluoroalkyl group having 1-4 carbon atoms, 1 is an integer of 0-5, and n is an integer of 0-2.

The compounds shown by the above formula (II) can be obtained by the following method, for example.

<1> 5-(2,2-ditrifluoromethyl-2-hydroxyethyl)bicyclo [2.2.1]hept-2(3)-yl formate is obtained by the Michael addition reaction of 5-(2,2-ditrifluoromethyl-2-hydroxyethyl)bicyclo[2.2.1]hept-2-ene with formic acid. ("-2(3)-" here indicates that bonding sites are 2-position or 3-position and that the compound includes isomers. Hereinafter the same.).

<2> The compound obtained in <1> is hydrolyzed with a base such as sodium carbonate or the like to obtain 5-(2,2-ditrifluoromethyl-2-hydroxyethyl)bicyclo[2.2.1]heptan-2(3)-ol.

<3> Next, the compound obtained in <2> is reacted with, for example, n-butyl lithium in an amount of two equivalents to obtain a compound in which two alcohol groups are capped, followed by de-hydrochloric acid reaction in the presence of one equivalent of acid chloride of (meth)acrylic acid and a base to selectively react alcohols at 2-position and 3-position with (meth)acrylic acid, thereby obtaining the compound providing the recurring unit (1-1).

The following compounds are particularly preferable among the compounds providing the recurring unit (1-1).

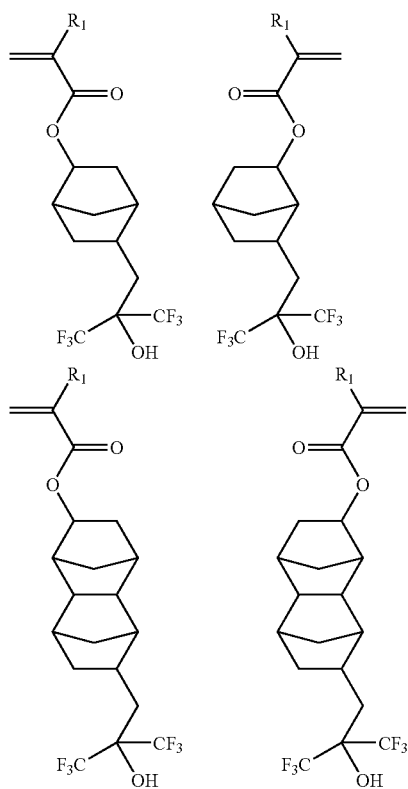

Either one type or two more types of the recurring unit (1-1) may be present in the resin (A).

The resin (A) may be formed either only from the recurring unit (1-1) or from the recurring unit (1-1) and other recurring units, but is preferably a copolymer containing the other recurring units. In the latter case, there are no specific limitations to the types and the like of the other recurring units. The content of the recurring unit depends on the types and the like of the other recurring units, but is usually 5-90 mol %, preferably 10-80 mol %, particularly preferably 10-60 mol %, and still more preferably 10-50 mol % of the total amount of the recurring units. If the content of the recurring unit (1-1) is less than 10 mol %, solubility in solvents, adhesion to substrates, and resolution of the resulting resist tend to decrease. If more than 90 wt %, on the other hand, resist pattern resolution tends to be impaired.

As examples of the other recurring units, recurring units shown by the following formulas (III) or (IV) can be given.

wherein $R_2$ represents a monovalent organic group and n is an integer of 0-2.

wherein $R_3$ represents a hydrogen atom, methyl group, hydroxylalkyl group having 1-4 carbon atoms, or perfluoroalkyl group having 1-4 carbon atoms and $R_4$ represents a monovalent organic group.

Examples of the monovalent organic group $R_2$ forming the recurring unit of the above formula (III) (hereinafter referred to as "recurring unit (2)") include, but are not limited to, organic groups shown by the following formulas (2-1) to (2-4).

In the organic group (2-1), $X_1$ and $X_2$ individually represent a hydrogen atom, fluorine atom, alkyl group having 1-4 carbon atoms, or fluoroalkyl group having 1-4 carbon atoms, and n is an integer of 0-5. In the organic group (2-2), $R_5$ may represent a divalent organic group having a linear, branched, or cyclic skeleton, in which case, X represents a hydrogen atom, hydroxyl group, carboxyl group, nitro group, cyano group, or amino group, or $R_5$ may not be present, in which case, X represents a carboxyl group or a cyano group. In the organic group (2-3), $R_6$ individually represents a monovalent alicyclic hydrocarbon group having 4-20 carbon atoms or a derivative thereof, or an alkyl group having 1-4 carbon atoms or a derivative thereof. In the organic group (2-4), $R_7$ represents an alkyl group having 1-6 carbon atoms or a derivative thereof, a cycloalkyl group having 5-10 carbon atoms or a derivative thereof, a monovalent polyalicyclic hydrocarbon group having 4-20 carbon atoms or a derivative thereof, or a lactone ring.

In the above recurring unit (2), when the substituent $R_2$ is the above organic group (2-1), a methyl group, ethyl group, n-propyl group, i-propyl group, n-butyl group, 2-methylpropyl group, 1-methylpropyl group, and t-butyl group can be given as examples of the alkyl group represented by $X_1$ or $X_2$. As examples of the fluoroalkyl group represented by $X_1$ or $X_2$, a monofluoromethyl group, difluoromethyl group, trifluoromethyl group, 1-fluoroethyl group, 1,2-difluoroethyl group, and 1,1,2,2-tetrafluoroethyl group can be given. As $X_1$, a hydrogen atom, fluorine atom, and trifluoromethyl group are preferable. As $X_2$, a hydrogen atom, fluorine atom, and trifluoromethyl group are preferable. Therefore, as the organic group (2-1) bonded to the main chain at the 1-position, a hydroxymethyl group, 2-hydroxymethyl group, 3-hydroxypropyl group, 1-fluoro-1-hydroxymethyl group, 1,1-difluoro-1-hydroxymethyl group, 1,2-difluoro-2-hydroxymethyl group, 1,1,2,2-tetrafluoro-2-hydroxymethyl group, 2-trifluoromethyl-2-hydroxyethyl group, and 2,2-ditrifluoromethyl-2-hydroxyethyl group are preferable.

In the above recurring unit (2), when the substituent $R_2$ is the above organic group (2-2), as examples of the $R_5$ which may form the substituent $R_2$, an alkylene group such as a methylene group, ethylene group, n-propylene group, isopropylene group, n-butylene group, and isobutylene group; a divalent organic group derived from a cycloalkane such as cyclopentane, cyclohexane, cycloheptane, and cyclooctane; a divalent organic group derived from adamantane; a divalent organic group derived from bicyclo[2.2.1]heptane; and a divalent organic group derived from tetracyclo[6.2.1.1$^{3,6}$.0$^{2,7}$]dodecane can be given. Of these groups, a methylene group, ethylene group, divalent organic group derived from adamantane, and divalent organic group derived from bicyclo[2.2.1]heptane are preferable.

In the above case, as examples of X forming the organic group (2-2), a hydrogen atom, hydroxyl group, carboxyl group, nitro group, cyano group, and amino group can be given. Of these, a hydrogen atom, hydroxyl group, and nitro group are preferable.

When $R_5$ is not present in the organic group (2-2), X forms the substituent $R_2$ as is. Examples include a carboxyl group and cyano group.

Therefore, as the above organic group (2-2), indicated as a residue bonded to an oxygen atom, a hydrogen atom, a hydroxymethyl group, 2-hydroxyethyl group, 3-hydroxypropyl group, 3-hydroxyadamant-1-yl group, 5(6)-hydroxybicyclo[2.2.1]hept-2-yl group, 9(10)-hydroxytetracyclo[6.2.1.1$^{3,6}$.0$^{2,7}$]dodec-4-yl group, carboxyl group, carboxymethyl group, 2-carboxyethyl group, 3-carboxypropyl group, 3-carboxyadamantan-1-yl group, 5(6)-carboxybicyclo[2.2.1]hept-2-yl group, 9(10)-carboxytetracyclo[6.2.1.1$^{3,6}$.0$^{2,7}$]dodec-4-yl group, cyano group, cyanomethyl group, 2-cyanoethyl group, 3-cyanopropyl group, 3-cyanoadamantan-1-yl group, 5(6)-cyanobicyclo[2.2.1]hept-2-yl group, 9(10)-cyanotetracyclo[6.2.1.1$^{3,6}$.0$^{2,7}$]dodec-4-yl group, and the like can be given.

In the above recurring unit (2), when the substituent $R_2$ is the above organic group (2-3) and the substituent $R_6$ is an alicyclic hydrocarbon group, a cyclobutyl group, cyclopentyl group, cyclohexyl group, cycloheptyl group, and cyclooctyl group can be given as examples of the substituent $R_6$. As examples of derivatives of such an alicyclic hydrocarbon group, groups in which the one or more hydrogen atoms on the alicyclic hydrocarbon group are substituted with one or more substituents such as a hydroxyl group; a carboxyl group; an oxy group (=O); a hydroxyalkyl group having 1-4 carbon atoms such as a hydroxymethyl group, 1-hydroxyethyl group, 2-hydroxyethyl group, 1-hydroxypropyl group, 2-hydroxypropyl group, 3-hydroxypropyl group, 2-hydroxybutyl group, 3-hydroxybutyl group, and 4-hydroxybutyl group; an alkoxyl group having 1-4 carbon atoms such as a methoxy group, ethoxy group, n-propoxy group, i-propoxy group, n-butoxy group, 2-methylpropoxy group, 1-methylpropoxy group, and t-butoxy group; a cyano group; a cyanoalkyl group having 2-5 carbon atoms such as a cyanomethyl group, 2-cyanoethyl group, 3-cyanopropyl group, and 4-cyanobutyl group; and the like can be given. Of these substituents, a hydroxyl group, carboxyl group, hydroxymethyl group, cyano group, and cyanomethyl group are preferable.

When the substituent $R_6$ is an alkyl group, as examples of the alkyl groups, a methyl group, ethyl group, n-propyl group, i-propyl group, n-butyl group, 1-methylpropyl group, 2-methylpropyl group, and t-butyl group can be given. Of these groups, a methyl group and an ethyl group are preferable. As examples of derivatives of such an alkyl group, groups in which the one or more hydrogen atoms on the alkyl group are substituted with one or more substituents such as a hydroxyl group; a carboxyl group; an oxy group (=O); a hydroxyalkyl group having 1-4 carbon atoms such as a hydroxymethyl group, 1-hydroxyethyl group, 2-hydroxyethyl group, 1-hydroxypropyl group, 2-hydroxypropyl group, 3-hydroxypropyl group, 2-hydroxybutyl group, 3-hydroxybutyl group, and 4-hydroxybutyl group; an alkoxyl group having 1-4 carbon atoms such as a methoxy group, ethoxy group, n-propoxy group, i-propoxy group, n-butoxy group, 2-methylpropoxy group, 1-methylpropoxy group, and t-butoxy group; a cyano group; a cyanoalkyl group having 2-5 carbon atoms such as a cyanomethyl group, 2-cyanoethyl group, 3-cyanopropyl group, and 4-cyanobutyl group; and the like can be given. Of these substituents, a hydroxyl group, carboxyl group, hydroxymethyl group, cyano group, and cyanomethyl group are preferable.

Among the substituents $R_6$ in the organic group (2-3), all three substituents may be the same, two among the three substituents may be the same, or all three substituents may differ from each other.

As examples of the organic group (2-3) in which two among three substituents are the same and another substituent $R_6$ is an alicyclic hydrocarbon group, the following groups can be given.

(6-1)

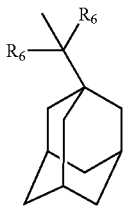

-continued

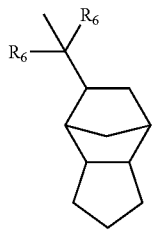
(6-2)

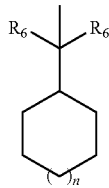
(6-3)

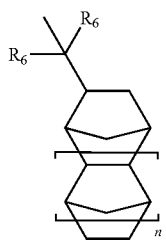
(6-4)

In the above groups (6-3) and (6-4), n is an integer of 0-2.

In the above organic group (2-3), the two substituents $R^6$ may form in combination a divalent alicyclic hydrocarbon group having 4-20 carbon atoms or a derivative thereof. The following examples can be given.

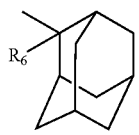
(6-5)

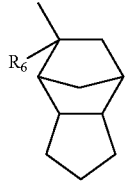
(6-6)

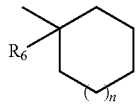
(6-7)

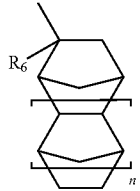
(6-8)

In the above groups (6-7) and (6-8), n is an integer of 0-2.

As the group having the above structure, bicyclo[2.2.1] heptane, tricyclo[6.2.1.1$^{2,7}$]decane, tetracyclo[5.2.1.0$^{2,6}$] dodecane, and the like can be given.

Therefore, as examples of the above organic group (2-3), in terms of the residue bonding to the oxygen atom in the ester group, which is represented by the group —C(R$_6$)$_3$, the following groups can be given:

trialkylmethyl groups such as a t-butyl group, 3-methyl-3-butyl group, 2-methyl-2-butyl group, 2-ethyl-2-butyl group, 3-ethyl-3-butyl group, and 3-methyl-3-pentyl group;

alkylcycloalkyl groups such as 2-methyladamantan-2-yl group,
2-methyl-3-hydroxyadamantan-2-yl group, 2-methyl-3-cyanoadamantan-2-yl group,
2-ethyladamantan-2-yl group, 2-ethyl-3-hydroxyadamantan-2-yl group,
2-ethyl-3-cyanoadamantan-2-yl group, 8-methyltricyclo[5.2.1.0$^{2,6}$]decan-8-yl group,
8-methyl-4-hydroxytricyclo[5.2.1.0$^{2,6}$]decan-8-yl group,
8-methyl-4-cyanotricyclo[5.2.1.0$^{2,6}$]decan-8-yl group,
8-ethyltricyclo[5.2.1.0$^{2,6}$]decan-8-yl group,
8-ethyl-4-hydroxytricyclo[5.2.1.0$^{2,6}$]decan-8-yl group,
8-ethyl-4-cyanotricyclo[5.2.1.0$^{2,6}$]decan-8-yl group, 1-methylcyclopentyl group,
1-ethylcyclopentyl group, 1-methylcyclohexyl group, 1-ethylcyclohexyl group,
2-methylcyclopentyl group, 2-ethylcyclopentyl group, 2-methylbicyclo[2.2.1]hept-2-yl group, 2-methyl-5(6)-hydroxybicyclo[2.2.1]hept-2-yl group,
2-methyl-5-cyanobicyclo[2.2.1]hept-2-yl group, 2-ethylbicyclo[2.2.1]hept-2-yl group,
2-ethyl-5(6)-hydroxybicyclo[2.2.1]hept-2-yl group,
2-ethyl-5(6)-cyanobicyclo[2.2.1]hept-2-yl group,
4-methyltetracyclo[6.2.1.1$^{3,6}$.0$^{2,7}$]dodecan-4-yl group,
4-methyl-9(10)-hydroxytetracyclo[6.2.1.1$^{3,6}$.0$^{2,7}$]dodecan-4-yl group,
4-methyl-9(10)-cyanotetracyclo[6.2.1.1$^{3,6}$.0$^{2,7}$]dodecan-4-yl group,
4-ethyl-tetracyclo[6.2.1.1$^{3,6}$.0$^{2,7}$]dodecan-4-yl group,
4-ethyl-9(10)-hydroxytetracyclo[6.2.1.1$^{3,6}$.0$^{2,7}$]dodecan-4-yl group, and
4-ethyl-9(10)-cyanotetracyclo[6.2.1.1$^{3,6}$.0$^{2,7}$]dodecan-4-yl group;

dialkylcycloalkylmethyl groups such as 1-cyclopentyl-1-methylethyl group,
1-cyclohexyl-1-methylethyl group, 1-cycloheptyl-1-methylethyl group,
1-bicyclo[2.2.1]hept-2-yl-1-methylethyl group,
1-tricyclo[5.2.1.0$^{2,6}$]decan-8-yl-1-methylethyl group,
1-tetracyclo[7.5.2.1.0$^{2,7}$]dodecan-4-yl-1-methylethyl group,
1-adamantan-1-yl-1-methylethyl group, 1-(2(3)-hydroxycyclopentyl)-1-methylethyl group, 1-(3(4)-hydroxycyclohexyl)-1-methylethyl group,
1-(3(4)-hydroxycycloheptyl)-1-methylethyl group,
1-(5(6)-hydroxybicyclo[2.2.1]hept-2-yl)-1-methylethyl group,
1-(4-hydroxytricyclo[5.2.1.0$^{2,6}$]decan-8-yl)-1-methylethyl group,
1-(9(10)-hydroxytetracyclo[6.2.1.1$^{3,6}$.0$^{2,7}$]dodecan-4-yl)-1-methylethyl group,
1-(3-hydroxyadamantan-1-yl)-1-methylethyl group,
1-(2(3)-cyanocyclopentyl)-1-methylethyl group,
1-(3(4)-cyanocyclohexyl)-1-methylethyl group,
1-(3(4)-cyanocycloheptyl)-1-methylethyl group,
1-(5(6)-cyanobicyclo[2.2.1]hept-2-yl)-1-methylethyl group,
1-(4-cyanotricyclo[5.2.1.0$^{2,6}$]decan-8-yl)-1-methylethyl group,
1-(9(10)-cyanotetracyclo[6.2.1.1$^{3,6}$.0$^{2,7}$]dodecan-4-yl)-1-methylethyl group, and 1-(3-cyanoadamantan-1-yl)-1-methylethyl group;
alkyldicycloalkylmethyl groups such as 1,1-dicyclopentylethyl group,
1,1-dicyclohexylethyl group, 1,1-dicycloheptylethyl group,
1,1-dibicyclo[2.2.1]hept-2-ylethyl group, 1,1-ditricyclo[5.2.1.0$^{2,6}$]decan-8-ylethyl group,
1,1-di(tetracyclo[6.2.1.1$^{3,6}$.0$^{2,7}$]dodecan-4-yl)ethyl group, 1,1-diadamantan-1-ylethyl group, 1,1-di(2(3)-hydroxycyclopentyl)ethyl group,
1,1-di(3(4)-hydroxycyclohexyl)ethyl group, 1,1-di(3(4)-hydroxycycloheptyl)ethyl group,
1,1-di(5(6)-hydroxybicyclo[2.2.1]hept-2-yl)ethyl group,
1,1-di(4-hydroxytricyclo[5.2.1.0$^{2,6}$]decan-8-yl)ethyl group,
1,1-di(9(10)-hydroxytetracyclo[6.2.1.1$^{3,6}$.0$^{2,7}$]dodecan-4-yl)ethyl group,
1,1-di(3-hydroxyadamantan-1-yl)ethyl group, 1,1-di(2(3)-cyanocyclopentyl)ethyl group,
1,1-di(3(4)-cyanocyclohexyl)ethyl group, 1,1-di(3(4)-cyanocycloheptyl)ethyl group,
1,1-di(5(6)-cyanobicyclo[2.2.1]hept-2-yl)ethyl group,
1,1-di(4-cyanotricyclo[5.2.1.0$^{2,6}$]decan-8-yl)ethyl group,
1,1-di(9(10)-cyanotetracyclo[6.2.1.1$^{3,6}$.0$^{2,7}$]dodecan-4-yl)ethyl group, and
1,1-di(3-cyanoadamantan-1-yl)ethyl group.

Of the above organic groups, t-butyl group, 2-methyl-2-propyl group,
2-methyl-2-butyl group, 2-ethyl-2-butyl group, 3-ethyl-3-butyl group,
2-methyladamantan-2-yl group, 2-methyl-3-hydroxyadamantan-2-yl group,
2-ethyladamantan-2-yl group, 8-methyltricyclo[5.2.1:0$^{2,6}$]decan-8-yl group,
8-ethyltricyclo[5.2.1.0$^{2,6}$]decan-8-yl group, 1-methylcyclopentyl group,
1-ethylcyclopentyl group, 1-methylcyclohexyl group, 1-ethylcyclohexyl group,
2-methylbicyclo[2.2.]hept-2-yl group, 2-ethylbicyclo[2.2.1]hept-2-yl group,
4-methyltetracyclo[6.2.1.1$^{3,6}$.0$^{2,7}$]dodecan-4-yl group,
4-ethyltetracyclo[6.2.1.1$^{3,6}$.0$^{2,7}$]dodecan-4-yl group, 1-cyclohexyl-1-methylethyl group,
1-bicyclo[2.2.1]hept-2-yl-1-methylethyl group,
1-tricyclo[5.2.1.0$^{2,6}$]decan-8-yl-1-methylethyl group,
1-tetracyclo[6.2.1.1$^{3,6}$.0$^{2,7}$]dodecan-4-yl-1-methylethyl group,
1-adamantan-1-yl-1-methylethyl group, 1-(2(3)-hydroxycyclopentyl)-1-methylethyl group, 1-(3(4)-hydroxycyclohexyl)-1-methylethyl group,
1-(3(4)-hydroxycycloheptyl)-1-methylethyl group, 1-(3-hydroxyadamantan-1-yl)-1-methylethyl group, 1,1-dicyclohexylethyl group,
1,1-dibicyclo[2.2.1]hept-2-ylethyl group, 1,1-ditricyclo[5.2.1.0$^{2,6}$]decan-8-ylethyl group,
1,1-di(tetracyclo[6.2.1.1$^{3,6}$.0$^{2,7}$]dodecan-4-yl)ethyl group, and 1,1-diadamantan-1-ylethyl group are preferable.

In the above recurring unit (2), when the substituent $R_2$ is the above organic group (2-4), a methyl group, ethyl group, n-propyl group, i-propyl group, n-butyl group, 2-methylpropyl group, 1-methylpropyl group, n-pentyl group, and n-hexyl group can be given as examples of the alkyl group represented by the substituent $R_7$ which forms the substituent $R_2$. Of these groups, a methyl group and an ethyl group are preferable. As examples of derivatives of such an alkyl group, groups in which the one or more hydrogen atoms on the alkyl group are substituted with one or more substituents such as a hydroxyl group; a carboxyl group; an oxy group (=O); a hydroxyalkyl group having 1-4 carbon atoms such as a hydroxymethyl group, 1-hydroxyethyl group, 2-hydroxyethyl group, 1-hydroxypropyl group, 2-hydroxypropyl group, 3-hydroxypropyl group, 2-hydroxybutyl group, 3-hydroxybutyl group, and 4-hydroxybutyl group; an alkoxyl group having 1-4 carbon atoms such as a methoxy group, ethoxy group, n-propoxy group, i-propoxy group, n-butoxy group, 2-methylpropoxy group, 1-methylpropoxy group, and t-butoxy group; a cyano group; a cyanoalkyl group having 2-5 carbon atoms such as a cyanomethyl group, 2-cyanoethyl group, 3-cyanopropyl group, and 4-cyanobutyl group; and the like can be given.

When the substituent $R_7$ forming the substituent $R_2$ is a cycloalkyl group, a cyclopentyl group, cyclohexyl group, cycloheptyl group, cyclooctyl group, and the like can be given as examples of such a cycloalkyl group. Of these, cyclopentyl group, cyclohexyl group, cycloheptyl group, and cyclooctyl group are preferable. As examples of derivatives of such a cycloalkyl group, groups in which the one or more hydrogen atoms on the cycloalkyl group are substituted with one or more substituents such as a hydroxyl group; a carboxyl group; an oxy group (=O); a hydroxyalkyl group having 1-4 carbon atoms such as a hydroxymethyl group, 1-hydroxyethyl group, 2-hydroxyethyl group, 1-hydroxypropyl group, 2-hydroxypropyl group, 3-hydroxypropyl group, 2-hydroxybutyl group, 3-hydroxybutyl group, and 4-hydroxybutyl group; an alkoxyl group having 1-4 carbon atoms such as a methoxy group, ethoxy group, n-propoxy group, i-propoxy group, n-butoxy group, 2-methylpropoxy group, 1-methylpropoxy group, and t-butoxy group; a cyano group; a cyanoalkyl group having 2-5 carbon atoms such as a cyanomethyl group, 2-cyanoethyl group, 3-cyanopropyl group, and 4-cyanobutyl group; and the like can be given.

When the substituent $R_7$ forming the substituent $R_2$ is a polyalicyclic hydrocarbon group, groups derived from a polyalicyclic hydrocarbon such as adamantane, bicyclo[2.2.1]heptane, 7,7-dimethylbicyclo[2.2.1]heptane, tricyclo[5.2.1.0$^{2,6}$]decane, or tetracyclo[6.2.1.1$^{3,6}$.0$^{2,7}$]dodecane can be given as examples. Of these, groups derived from adamantane, bicyclo[2.2.1]heptane, 7,7-dimethylbicyclo[2.2.1]heptane, or tricyclo[5.2.1.0$^{2,6}$]decane are preferable. As derivatives of the polyalicyclic hydrocarbon group, groups in which the one or more hydrogen atoms on the polyalicyclic hydrocarbon group are substituted with one or more above-mentioned functional groups can be given.

The substituent $R_7$ forming the substituent $R_2$ may also be a group having a lactone ring shown below.

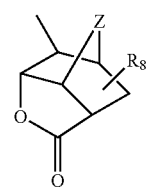

(7-1)

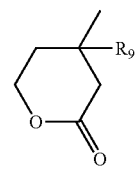

(7-2)

-continued

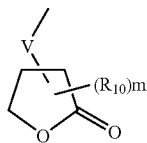

(7-3)

In the substituent (7-1), $R_8$ represents a hydrogen atom, alkyl group having 1-5 carbon atoms, or alkoxyl group having 1-5 carbon atoms and Z represents a methylene group, dimethylmethylene group, oxygen atom, sulfur atom. In the substituent (7-2), $R_9$ represents a hydrogen atom, alkyl group having 1-5 carbon atoms, or alkoxyl group having 1-5 carbon atoms. n is an integer of 0-2. In the substituent (7-3), $R_{10}$ represents a hydrogen atom, alkyl group having 1-5 carbon atoms, or alkoxyl group having 1-5 carbon atoms and V represents a methylene group. m is an integer of 0-4, As the alkyl group used for the substituent $R_8$ forming the substituent (7-1), the substituent $R_9$ forming the substituent (7-2), and the substituent $R_{10}$ forming the substituent (7-3), a methyl group, ethyl group, n-propyl group, i-propyl group, n-butyl group, 1-methylpropyl group, 2-methylpropyl group, t-butyl group, n-pentyl group, and the like can be given. As the alkoxyl group used for the substituent $R_8$ forming the substituent (7-1), the substituent $R_9$ forming the substituent (7-2), and the substituent $R_{10}$ forming the substituent (7-3), a methoxy group, ethoxy group, n-propoxy group, i-propoxy group, n-butoxy group, 1-methylpropoxy group, 2-methylpropoxy group, t-butoxy group, n-pentyloxy group, and the like can be given.

Z in the above substituent (7-1) may not be present. V in the above substituent (7-3) may not be present.

Therefore, as preferable examples of the above organic group (2-4), in terms of the residue bonding to the oxygen atom in the ester group, the following groups can be given: alkyl groups such as a methyl group, ethyl group, n-propyl group, cyclopentyl group, cyclohexyl group, adamantan-1-yl group, bicyclo[2.2.1]hept-2-yl group,
7,7-dimethylbicyclo[2.2.1]hept-1-yl group, tricyclo[5.2.1.0$^{2,6}$]decan-8-yl group, and
tetracyclo[6.2.1.1$^{3,6}$.0$^{2,7}$]dodecan-4-yl group; and
groups with a lactone ring such as a 5-oxo-4-oxa-tricyclo[4.2.1.0$^{3,7}$]nonan-2-yl group,
9-methoxycarbonyl-5-oxo-4-oxa-tricyclo[4.2.1.0$^{3,7}$]nonan-2-yl group,
7-oxo-6-oxabicyclo[3.2.1]octan-4-yl group,
2-methoxycarbonyl-7-oxo-6-oxa-bicyclo[3.2.1]octan-4-yl group,
2-oxotetrahydropyran-4-yl group, 4-methyl-2-oxotetrahydropyran-4-yl group,
4-ethyl-2-oxotetrahydropyran-4-yl group, 4-propyl-2-oxotetrahydropyran-4-yl group,
5-oxotetrahydrofuran-3-yl group, 2,2-dimethyl-5-oxotetrahydrofuran-3-yl group,
4,4-dimethyl-5-oxotetrahydrofuran-3-yl group, 2-oxotetrahydrofuran-3-yl group,
4,4-dimethyl-2-oxotetrahydrofuran-3-yl group, 5,5-dimethyl-2-oxotetrahydrofuran-3-yl group, 2-oxotetrahydrofuran-3-yl group, 5-oxotetrahydrofuran-2-ylmethyl group,
3,3-dimethyl-5-oxotetrahydrofuran-2-ylmethyl group, and
4,4-dimethyl-5-oxotetrahydrofuran-2-ylmethyl group.

The following compounds can be given as examples of monomers providing the recurring unit (2): 5-hydroxymethylbicyclo[2.2.1]hept-2-ene,
5-(2-hydroxyethyl)bicyclo[2.2.1]hept-2-ene,
5-(3-hydroxypropyl)bicyclo[2.2.1]hept-2-ene,
5-(1-fluoro-1-hydroxymethyl)bicyclo[2.2.1]hept-2-ene,
5-(1,1-difluoro-1-hydroxymethyl)bicyclo[2.2.1]hept-2-ene,
5-(1,2-difluoro-2-hydroxymethyl)bicyclo[2.2.1]hept-2-ene,
5-(1,1,2,2-tetrafluoro-2-hydroxymethyl)bicyclo[2.2.1]hept-2-ene,
5-(2-trifluoromethyl-2-hydroxyethyl)bicyclo[2.2.1]hept-2-ene,
5-(2,2-ditrifluoromethyl-2-hydroxyethyl)bicyclo[2.2.1]hept-2-ene,
bicyclo[2.2.1]hept-2-ene, 5-methylbicyclo[2.2.1]hept-2-ene,
5-ethylbicyclo[2.2.1]hept-2-ene, 5-butylbicyclo[2.2.1]hept-2-ene,
5-hexylbicyclo[2.2.1]hept-2-ene, 5-octylbicyclo[2.2.1]hept-2-ene,
5-hydroxybicyclo[2.2.1]hept-2-ene, (3-hydroxyadamantan-1-yl)
bicyclo[2.2.1]hept-2-ene-5-carboxylate, (5(6)-hydroxybicyclo[2.2.1]hept-2-yl)
bicyclo[2.2.1]hept-2-ene-5-carboxylate, (9(10)-hydroxytetracyclo[6.2.1.1$^{3,6}$.0$^{2,7}$]dodecan-4-yl)
bicyclo[2.2.1]hept-2-ene-5-carboxylate, bicyclo[2.2.1]hept-2-ene-5-carboxylic acid,
bicyclo[2.2.1]hept-2-ene-5-acetic acid, bicyclo[2.2.1]hept-2-ene-5-ethanecarboxylic
acid, bicyclo[2.2.1]hept-2-ene-5-propionic acid, 5-cyanobicyclo[2.2.1]hept-2-ene,
5-cyanomethylbicyclo[2.2.1]hept-2-ene, 5-(2-cyanoethyl)bicyclo[2.2.1]hept-2-ene,
5-(3-cyanopropyl)bicyclo[2.2.1]hept-2-ene, t-butyl bicyclo[2.2.1]hept-2-ene-5-carboxylate, (2-methyl-2-propyl)
bicyclo[2.2.1]hept-2-ene-5-carboxylate, (2-methyl-2-butyl, 2-ethyl-2-butyl)
bicyclo[2.2.1]hept-2-ene-5-carboxylate, (3-ethyl-3-butyl)
bicyclo[2.2.1]hept-2-ene-5-carboxylate, (2-methyladamantan-2-yl)
bicyclo[2.2.1]hept-2-ene-5-carboxylate, (2-methyl-3-hydroxyadamantan-2-yl)
bicyclo[2.2.1]hept-2-ene-5-carboxylate, (2-ethyladamantan-2-yl)
bicyclo[2.2.1]hept-2-ene-5-carboxylate, (8-methyltricyclo[5.2.1.0$^{2,6}$]decan-8-yl)
bicyclo[2.2.1]hept-2-ene-5-carboxylate, (8-ethyltricyclo[5.2.1.0$^{2,6}$]decan-8-yl)
bicyclo[2.2.1]hept-2-ene-5-carboxylate, (1-methylcyclopentyl)
bicyclo[2.2.1]hept-2-ene-5-carboxylate, (1-ethylcyclopentyl)
bicyclo[2.2.1]hept-2-ene-5-carboxylate, (1-methylcyclohexyl)
bicyclo[2.2.1]hept-2-ene-5-carboxylate, (1-ethylcyclohexyl)
bicyclo[2.2.1]hept-2-ene-5-carboxylate, (2-methylbicyclo[2.2.1]hept-2-yl)
bicyclo[2.2.1]hept-2-ene-5-carboxylate, (2-ethylbicyclo[2.2.1]hept-2-yl)
bicyclo[2.2.1]hept-2-ene-5-carboxylate,
(4-methyltetracyclo[6.2.1.1$^{3,6}$.0$^{2,7}$]dodecan-4-yl)bicyclo[2.2.1]hept-2-ene-5-carboxylate,
(4-ethyl-tetracyclo[6.2.1.1$^{3,6}$.0$^{2,7}$]dodecan-4-yl)bicyclo[2.2.1]hept-2-ene-5-carboxylate,
(1-cyclohexyl-1-methylethyl)bicyclo[2.2.1]hept-2-ene-5-carboxylate,
(1-bicyclo[2.2.1]hept-2-yl-1-methylethyl)bicyclo[2.2.1]hept-2-ene-5-carboxylate,
(1-tricyclo[5.2.1.0$^{2,6}$]dec-8-yl-1-methylethyl)bicyclo[2.2.1]hept-2-ene-5-carboxylate, (1-tetracyclo[6.2.1.1$^{3,6}$.0$^{2,7}$]dodec-4-yl-1-methylethyl)
bicyclo[2.2.1]hept-2-ene-5-carboxylate, (1-adamantan-1-yl-1-methylethyl)
bicyclo[2.2.1]hept-2-ene-5-carboxylate, (1-(2(3)-hydroxy-cyclopentyl)-1-methylethyl)
bicyclo[2.2.1]hept-2-ene-5-carboxylate, (1-(3 (4)-hydroxy-cyclohexyl)-1-methylethyl)
bicyclo[2.2.1]hept-2-ene-5-carboxylate, (1-(3 (4)-hydroxy-cycloheptyl)-1-methylethyl)
bicyclo[2.2.1]hept-2-ene-5-carboxylate, (1-(3-hydroxyadamantan-1-yl)-1-methy ethyl-1,1-dicyclohexylethyl)bicyclo[2.2.1]hept-2-ene-5-carboxylate,
(1,1-dibicyclo[2.2.1]hept-2-ylethyl)bicyclo[2.2.1]hept-2-ene-5-carboxylate,
(1,1-ditricyclo[5.2.1.0$^{2,6}$]dec-8-ylethyl)bicyclo[2.2.1]hept-2-ene-5-carboxylate,
(1,1-di(tetracyclo[6.2.1.1$^{3,6}$.0$^{2,7}$]dodecan-4-yl)ethyl) bicyclo[2.2.1]hept-2-ene-5-carboxylate, (1,1-diadamantan-1-ylethyl)
bicyclo[2.2.1]hept-2-ene-5-carboxylate, methyl bicyclo[2.2.1]hept-2-ene-5-carboxylate,
ethyl bicyclo[2.2.1]hept-2-ene-5-carboxylate, n-propyl bicyclo[2.2.1]hept-2-ene-5-carboxylate, cyclopentyl bicyclo[2.2.1]hept-2-ene-5-carboxylate, cyclohexyl bicyclo[2.2.1]hept-2-ene-5-carboxylate, (adamantan-1-yl) bicyclo[2.2.1]hept-2-ene-5-carboxylate, (bicyclo[2.2.1]hept-2-yl)
bicyclo[2.2.1]hept-2-ene-5-carboxylate, (7,7-dimethylbicyclo[2.2.1]hept-1-yl)
bicyclo[2.2.1]hept-2-ene-5-carboxylate, (tricyclo[5.2.1.0$^{2,6}$]dec-8-yl)
bicyclo[2.2.1]hept-2-ene-5-carboxylate, (tetracyclo[6.2.1.1$^{3,6}$.0$^{2,7}$]dodec-4-yl)
bicyclo[2.2.1]hept-2-ene-5-carboxylate; (5-oxo-4-oxatricyclo[4.2.1.0$^{3,7}$]nonan-2-yl)
bicyclo[2.2.1]hept-2-ene-5-carboxylate, (9-methoxycarbonyl-5-oxo-4-oxatricyclo[4.2.1.0$^{3,7}$]nonan-2-yl)
bicyclo[2.2.1]hept-2-ene-5-carboxylate, (7-oxo-6-oxabicyclo[3.2.1]octan-4-yl)bicyclo[2.2.1]hept-2-ene-5-carboxylate,
(2-methoxycarbonyl-7-oxo-6-oxabicyclo[3.2.1]octan-4-yl) bicyclo[2.2.1]hept-2-ene-5-carboxylate,
(2-oxotetrahydropyran-4-yl)bicyclo[2.2.1]hept-2-ene-5-carboxylate,
(4-methyl-2-oxotetrahydropyran-4-yl)bicyclo[2.2.1]hept-2-ene-5-carboxylate,
(4-ethyl-2-oxotetrahydropyran-4-yl)bicyclo[2.2.1]hept-2-ene-5-carboxylate,
(4-propyl-2-oxotetrahydropyran-4-yl)bicyclo[2.2.1]hept-2-ene-5-carboxylate,
(5-oxotetrahydrofuran-3-yl)bicyclo[2.2.1]hept-2-ene-5-carboxylate,
(2,2-dimethyl-5-oxotetrahydrofuran-3-yl)bicyclo[2.2.1]hept-2-ene-5-carboxylate,
(4,4-dimethyl-5-oxotetrahydrofuran-3-yl)bicyclo[2.2.1]hept-2-ene-5-carboxylate,
(2-oxotetrahydrofuran-3-yl)bicyclo[2.2.1]hept-2-ene-5-carboxylate,
(4,4-dimethyl-2-oxotetrahydrofuran-3-yl)bicyclo[2.2.1]hept-2-ene-5-carboxylate,
(5,5-dimethyl-2-oxotetrahydrofuran-3-yl)bicyclo[2.2.1]hept-2-ene-5-carboxylate,
(2-oxotetrahydrofuran-3-yl)bicyclo[2.2.1]hept-2-ene-5-carboxylate,
(5-oxotetrahydrofuran-2-ylmethyl)bicyclo[2.2.1]hept-2-ene-5-carboxylate,
(3,3-dimethyl-5-oxotetrahydrofuran-2-ylmethyl) bicyclo[2.2.1]hept-2-ene-5-carboxylate,
(4,4-dimethyl-5-oxotetrahydrofuran-2-ylmethyl) bicyclo[2.2.1]hept-2-ene-5-carboxylate,
9-hydroxymethyltetracyclo[6.2.1.1$^{3,6}$.0$^{2,7}$]dodec-4-ene,
9-(2-hydroxyethyl)tetracyclo[6.2.1.1$^{3,6}$.0$^{2,7}$]dodec-4-ene,
9-(3-hydroxypropyl)tetracyclo[6.2.1.1$^{3,6}$.0$^{2,7}$]dodec-4-ene,
9-(1-fluoro-1-hydroxymethyl)tetracyclo[6.2.1.1$^{3,6}$.0$^{2,7}$]dodec-4-ene,
9-(1,1-fluoro-1-hydroxymethyl)tetracyclo[6.2.1.1$^{3,6}$.0$^{2,7}$]dodec-4-ene,
9-(1,2-difluoro-2-hydroxymethyl)tetracyclo[6.2.1.1$^{3,6}$.0$^{2,7}$]dodec-4-ene,
9-(1,1,2,2-tetrafluoro-2-hydroxymethyl)tetracyclo[6.2.1.1$^{3,6}$.0$^{2,7}$]dodec-4-ene,
9-(2-trifluoromethyl-2-hydroxyethyl)tetracyclo[6.2.1.1$^{3,6}$.0$^{2,7}$]dodec-4-ene,
9-(2,2-ditrifluoromethyl-2-hydroxyethyl)tetracyclo[6.2.1.1$^{3,6}$.0$^{2,7}$]dodec-4-ene,
tetracyclo[6.2.1.1$^{3,6}$.0$^{2,7}$]dodec-4-ene,
9-methyltetracyclo[6.2.1.1$^{3,6}$.0$^{2,7}$]dodec-4-ene,
9-ethyltetracyclo[6.2.1.1$^{3,6}$.0$^{2,7}$]dodec-4-ene,
9-butyltetracyclo[6.2.1.1$^{3,6}$.0$^{2,7}$]dodec-4-ene,
9-hexyltetracyclo[6.2.1.1$^{3,6}$.0$^{2,7}$]dodec-4-ene,
9-octyltetracyclo[6.2.1.1$^{3,6}$.0$^{2,7}$]dodec-4-ene,
9-hydroxytetracyclo[6.2.1.1$^{3,6}$.0$^{2,7}$]dodec-4-ene,
(3-hydroxyadamantan-1-yl)tetracyclo[6.2.1.1$^{3,6}$.0$^{2,7}$]dodec-4-ene-9-carboxylate,
(5(6)-hydroxybicyclo[2.2.1]hept-2-yl) tetracyclo[6.2.1.1$^{3,6}$.0$^{2,7}$]dodec-4-ene-9-carboxylate,
(9 (10)-hydroxytetracyclo[6.2.1.1$^{3,6}$.0$^{2,7}$]dodec-4-yl] tetracyclo[6.2.1.1$^{3,6}$.0$^{2,7}$]dodec-4-ene-9-carboxylate,
tetracyclo[6.2.1.1$^{3,6}$.0$^{2,7}$]dodec-4-ene-9-carboxylic acid,
tetracyclo[6.2.1.1$^{3,6}$.0$^{2,7}$]dodec-4-ene-9-acetic acid,
tetracyclo[6.2.1.1$^{3,6}$.0$^{2,7}$]dodec-4-ene-9-ethane carboxylic acid,
tetracyclo[6.2.1.1$^{3,6}$.0$^{2,7}$]dodec-4-ene-9-propionic acid,
9-cyanotetracyclo[6.2.1.1$^{3,6}$.0$^{2,7}$]dodec-4-ene,
9-cyanomethyltetracyclo[6.2.1.1$^{3,6}$.0$^{2,7}$]dodec-4-ene,
9-(2-cyanoethyl)tetracyclo[6.2.1.1$^{3,6}$.0$^{2,7}$]dodec-4-ene,
9-(3-cyanopropyl)tetracyclo[6.2.1.1$^{3,6}$.0$^{2,7}$]dodec-4-ene,
t-butyl tetracyclo[6.2.1.1$^{3,6}$.0$^{2,7}$]dodec-4-ene-9-carboxylate,
(2-methyl-2-propyl)tetracyclo[6.2.1.1$^{3,6}$.0$^{2,7}$]dodec-4-ene-9-carboxylate,
(2-methyl-2-butyl, 2-ethyl-2-butyl)tetracyclo[6.2.1.1$^{3,6}$.0$^{2,7}$]dodec-4-ene-9-carboxylate,
(3-ethyl-3-butyl)tetracyclo[6.2.1.1$^{3,6}$.0$^{2,7}$]dodec-4-ene-9-carboxylate,
(2-methyladamantan-2-yl)tetracyclo[6.2.1.1$^{3,6}$.0$^{2,7}$]dodec-4-ene-9-carboxylate,
(2-methyl-3-hydroxyadamantan-2-yl) tetracyclo[6.2.1.1$^{3,6}$.0$^{2,7}$]dodec-4-ene-9-carboxylate,
(2-ethyladamantan-2-yl)tetracyclo[6.2.1.1$^{3,6}$.0$^{2,7}$]dodec-4-ene-9-carboxylate,
(8-methyltricyclo[5.2.1.0$^{2,6}$]decan-8-yl) tetracyclo[6.2.1.1$^{3,6}$.0$^{2,7}$]dodec-4-ene-9-carboxylate,
(8-ethyltricyclo[5.2.1.0$^{2,6}$]decan-8-yl) tetracyclo[6.2.1.1$^{3,6}$.0$^{2,7}$]dodec-4-ene-9-carboxylate,
(1-methylcyclopentyl)tetracyclo[6.2.1.1$^{3,6}$.0$^{2,7}$]dodec-4-ene-9-carboxylate,
(1-ethylcyclopentyl)tetracyclo[6.2.1.1$^{3,6}$.0$^{2,7}$]dodec-4-ene-9-carboxylate,
(1-methylcyclohexyl)tetracyclo[6.2.1.1$^{3,6}$.0$^{2,7}$]dodec-4-ene-9-carboxylate,
(1-ethylcyclohexyl)tetracyclo[6.2.1.1$^{3,6}$.0$^{2,7}$]dodec-4-ene-9-carboxylate, (2-methylbicyclo[2.2.1]hept-2-yl)tetracyclo[6.2.1.1$^{3,6}$.0$^{2,7}$]dodec-4-ene-9-carboxylate,
(2-ethylbicyclo[2.2.1]hept-2-yl)tetracyclo[6.2.1.1$^{3,6}$.0$^{2,7}$]dodec-4-ene-9-carboxylate,
(4-methyltetracyclo[6.2.1.1$^{3,6}$.0$^{2,7}$]dodec-4-yl] tetracyclo[6.2.1.1$^{3,6}$.0$^{2,7}$]dodec-4-ene-9-carboxylate,
(4-ethyltetracyclo[6.2.1.1$^{3,6}$.0$^{2,7}$]dodec-4-yl] tetracyclo[6.2.1.1$^{3,6}$.0$^{2,7}$]dodec-4-ene-9-carboxylate,
(1-cyclohexyl-1-methylethyl)tetracyclo[6.2.1.1$^{3,6}$.0$^{2,7}$]dodec-4-ene-9-carboxylate,
(1-bicyclo[2.2.1]hept-2-yl-1-methylethyl) tetracyclo[6.2.1.1$^{3,6}$.0$^{2,7}$]dodec-4-ene-9-carboxylate,
(1-tricyclo[5.2.1.0$^{2,6}$]dec-8-yl-1-methyl ethyl) tetracyclo[6.2.1.1$^{3,6}$.0$^{2,7}$]dodec-4-ene-9-carboxylate,
(1-tetracyclo[6.2.1.1$^{3,6}$.0$^{2,7}$]dodec-4-yl-1-methylethyl]tetracyclo[6.2.1.1$^{3,6}$.0$^{2,7}$]dodec-4-ene-9-carboxylate,
(1-adamantan-1-yl-1-methylethyl)tetracyclo[6.2.1.1$^{3,6}$.0$^{2,7}$]dodec-4-ene-9-carboxylate,
(1-(2(3)-hydroxycyclopentyl)-1-methylethyl) tetracyclo[6.2.1.1$^{3,6}$.0$^{2,7}$]dodec-4-ene-9-carboxylate,
(1-(3(4)-hydroxycyclohexyl)-1-methylethyl) tetracyclo[6.2.1.1$^{3,6}$.0$^{2,7}$]dodec-4-ene-9-carboxylate,
(1-(3 (4)-hydroxycycloheptyl)-1-methylethyl) tetracyclo[6.2.1.1$^{3,6}$.0$^{2,7}$]dodec-4-ene-9-carboxylate,
(1-(3-hydroxyadamantan-1-yl)-1-methylethyl) tetracyclo[6.2.1.1$^{3,6}$.0$^{2,7}$]dodec-4-ene-9-carboxylate,
(1,1-dicyclohexylethyl)tetracyclo[6.2.1.1$^{3,6}$.0$^{2,7}$]dodec-4-ene-9-carboxylate,
(1,1-dibicyclo[2.2.1]hept-2-ylethyl)tetracyclo[6.2.1.1$^{3,6}$.0$^{2,7}$]dodec-4-ene-9-carboxylate,
(1,1-ditricyclo[5.2.1.0$^{2,6}$]dec-8-ylethyl) tetracyclo[6.2.1.1$^{3,6}$.0$^{2,7}$]dodec-4-ene-9-carboxylate,
(1,1-di(tetracyclo[6.2.1.1$^{3,6}$.0$^{2,7}$]dodec-4-yl)ethyl) tetracyclo[6.2.1.1$^{3,6}$.0$^{2,7}$]dodec-4-ene-9-carboxylate,
(1,1-diadamantan-1-ylethyl)tetracyclo[6.2.1.1$^{3,6}$.0$^{2,7}$]dodec-4-ene-9-carboxylate,
methyl tetracyclo[6.2.1.1$^{3,6}$.0$^{2,7}$]dodec-4-ene-9-carboxylate,
ethyl tetracyclo[6.2.1.1$^{3,6}$.0$^{2,7}$]dodec-4-ene-9-carboxylate,
n-propyl bicyclo[2.2.1]hept-2-ene-5-carboxylate,
cyclopentyl tetracyclo[6.2.1.1$^{3,6}$.0$^{2,7}$]dodec-4-ene-9-carboxylate,
cyclohexyl tetracyclo[6.2.1.1$^{3,6}$.0$^{2,7}$]dodec-4-ene-9-carboxylate,
(adamantan-1-yl)tetracyclo[6.2.1.1$^{3,6}$.0$^{2,7}$]dodec-4-ene-9-carboxylate,
(bicyclo[2.2.1]hept-2-yl)tetracyclo[6.2.1.1$^{3,6}$.0$^{2,7}$]dodec-4-ene-9-carboxylate,
(7,7-dimethylbicyclo[2.2.1]hept-1-yl) tetracyclo[6.2.1.1$^{3,6}$.0$^{2,7}$]dodec-4-ene-9-carboxylate,
(tricyclo[5.2.1.0$^{2,6}$]dec-8-yl)tetracyclo[6.2.1.1$^{3,6}$.0$^{2,7}$]dodec-4-ene-9-carboxylate,
(tetracyclo[6.2.1.1$^{3,6}$.0$^{2,7}$]dodec-4-yl]tetracyclo[6.2.1.1$^{3,6}$.0$^{2,7}$]dodec-4-ene-9-carboxylate;
(5-oxo-4-oxa-tricyclo[4.2.1.0$^{3,7}$]non-2-yl) tetracyclo[6.2.1.1$^{3,6}$.0$^{2,7}$]dodec-4-ene-9-carboxylate,
(9-methoxycarbonyl-5-oxo-4-oxa-tricyclo[4.2.1.0$^{3,7}$]non-2-yl) tetracyclo[6.2.1.1$^{3,6}$.0$^{2,7}$]dodec-4-ene-9-carboxylate,
(7-oxo-6-oxabicyclo[3.2.1]oct-4-yl)tetracyclo[6.2.1.1$^{3,6}$.0$^{2,7}$]dodec-4-ene-9-carboxylate,
(2-methoxycarbonyl-7-oxo-6-oxabicyclo[3.2.1]oct-4-yl) tetracyclo[6.2.1.1$^{3,6}$.0$^{2,7}$]dodec-4-ene-9-carboxylate,
(2-oxotetrahydropyran-4-yl)tetracyclo[6.2.1.1$^{3,6}$.0$^{2,7}$]dodec-4-ene-9-carboxylate,
(4-methyl-2-oxotetrahydropyran-4-yl) tetracyclo[6.2.1.1$^{3,6}$.0$^{2,7}$]dodec-4-ene-9-carboxylate,
(4-ethyl-2-oxotetrahydropyran-4-yl) tetracyclo[6.2.1.1$^{3,6}$.0$^{2,7}$]dodec-4-ene-9-carboxylate,
(4-propyl-2-oxotetrahydropyran-4-yl) tetracyclo[6.2.1.1$^{3,6}$.0$^{2,7}$]dodec-4-ene-9-carboxylate,
(5-oxotetrahydrofuran-3-yl)tetracyclo[6.2.1.1$^{3,6}$.0$^{2,7}$]dodec-4-ene-9-carboxylate,
(2,2-dimethyl-5-oxotetrahydrofuran-3-yl) tetracyclo[6.2.1.1$^{3,6}$.0$^{2,7}$]dodec-4-ene-9-carboxylate,
(4,4-dimethyl-5-oxotetrahydrofuran-3-yl) tetracyclo[6.2.1.1$^{3,6}$.0$^{2,7}$]dodec-4-ene-9-carboxylate,
(2-oxotetrahydrofuran-3-yl)tetracyclo[6.2.1.1$^{3,6}$.0$^{2,7}$]dodec-4-ene-9-carboxylate,
(4,4-dimethyl-2-oxotetrahydrofuran-3-yl) tetracyclo[6.2.1.1$^{3,6}$.0$^{2,7}$]dodec-4-ene-9-carboxylate,
(5,5-dimethyl-2-oxotetrahydrofuran-3-yl) tetracyclo[6.2.1.1$^{3,6}$.0$^{2,7}$]dodec-4-ene-9-carboxylate,
(2-oxotetrahydrofuran-3-yl)tetracyclo[6.2.1.1$^{3,6}$.0$^{2,7}$]dodec-4-ene-9-carboxylate,
(5-oxotetrahydrofuran-2-ylmethyl)tetracyclo[6.2.1.1$^{3,6}$.0$^{2,7}$]dodec-4-ene-9-carboxylate,
(3,3-dimethyl-5-oxotetrahydrofuran-2-ylmethyl) tetracyclo[6.2.1.1$^{3,6}$.0$^{2,7}$]dodec-4-ene-9-carboxylate,
(4,4-dimethyl-5-oxotetrahydrofuran-2-ylmethyl) tetracyclo[6.2.1.1$^{3,6}$.0$^{2,7}$]dodec-4-ene-9-carboxylate, and the like.

As the substituent $R_3$ forming the recurring unit of the above formula (IV) (hereinafter referred to as "recurring unit (3)"), the same groups as mentioned above as examples of the substituent $R_1$ in the recurring unit (1) can be given.

As examples of the substituent $R_4$ forming the recurring unit (3), the following organic groups can be given.

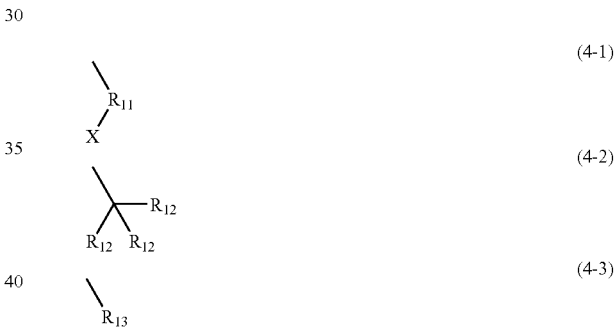

In the organic group (4-1), $R_{11}$ may represent a divalent organic group having a linear, branched, or cyclic skeleton, in which case, X represents a hydrogen atom, hydroxyl group, carboxyl group, nitro group, cyano group, or amino group, or $R_{11}$ may not be present, in which case, X represents a carboxyl group or a cyano group. In the organic group (4-2), $R_{12}$ individually represents an alicyclic hydrocarbon group having 4-20 carbon atoms or a derivative thereof, or an alkyl group having 1-4 carbon atoms. In the organic group (4-3), $R_{13}$ represents an alkyl group having 1-6 carbon atoms or a derivative thereof, a cycloalkyl group having 5-10 carbon atoms or a derivative thereof, a polyalicyclic hydrocarbon group having 4-20 carbon atoms or a derivative thereof, or a lactone ring.

As the substituent $R_{11}$ in the organic group (4-1), the same groups mentioned above as examples of $R_5$ in the above organic group (2-2) can be given. A particularly preferable substituent $R_{11}$ is the group A which can form the above-mentioned recurring unit (1-4) shown by the formula (I-4), specifically a linear or branched alkyl or alkylene group having 1-4 carbon atoms (such as a methylene group, ethylene group, propylene group) or a monovalent or divalent alicyclic hydrocarbon group having 4-20 carbon atoms or a derivative thereof.

As the substituent $R_{12}$ in the organic group (4-2), the same groups mentioned above as examples of $R_6$ in the above organic group (2-3) can be given. A particularly preferable substituent $R_{12}$ is a group that can form the recurring unit (1-2) shown by the formula (I-2), specifically the groups $R_{1c}$. The groups $R_{1c}$ in the above formula (I-2) individually represent a monovalent alicyclic hydrocarbon group having 4-20 carbon atoms or a derivative thereof, or a linear or branched alkyl group having 1-4 carbon atoms, provided that (1) at least one $R_{1c}$ group is a monovalent alicyclic hydrocarbon group having 4-20 carbon atoms, or (2) any two of the $R_{1c}$ groups form, in combination and together with the carbon atoms to which the two $R_{1c}$ groups bond, a divalent alicyclic hydrocarbon group having 4-20 carbon atoms or a derivative thereof, with the remaining $R_{1c}$ groups being a monovalent alicyclic hydrocarbon group having 4-20 carbon atoms or a derivative thereof, or a linear or branched alkyl group having 1-4 carbon atoms. The substituent $R_{12}$ is preferably $R_{1c}$ satisfying either the requirement (1) or (2) above. In addition, the group —C($R_{1c}$)$_3$ in the formula (I-2) is preferably a 1-alkyl-1-cycloalkyl group, 2-alkyl-2-adamantyl group, (1-alkyl-1-adamantyl)alkyl group, or (1-alkyl-1-norbornyl)alkyl group.

Although there are no specific limitations to the proportion of the recurring unit (1-1) and the recurring unit (1-2) in the resin (A) which contains both of these recurring units, the content of the recurring unit (1-1) in the total 100 mol % of all recurring units in the resin (A) is usually 40-90 mol %, preferably 40-80 mol %, and still more preferably 60-80 mol %. If the content of the recurring unit (1-1) is less than 40 mol %, developability decreases and development defects tend to be easily produced. If more than 90 wt %, on the other hand, resolution performance tends to be impaired. Moreover, when possessing a large amount of the recurring unit (1-1), the resin (A) preferably does not contain a functional group originating from a lactone skeleton. If the resin (A) possessing a large amount of the recurring unit (1-1) contains a functional group originating from a lactone skeleton, not only does solubility of the resist in a solvent decrease, but patterns also tend to swell.

As the substituent $R_{13}$ in the organic group (4-3), the same groups mentioned above as examples of the substituent $R_7$ in the above organic group (2-4) can be given. A particularly preferable substituent $R_{13}$ is a functional group originating from a lactone skeleton which can form the recurring unit (1-3) shown by the formula (I-3).

Although there are no specific limitations to the proportion of the recurring unit (1-1), the recurring unit (1-2), and the recurring unit (1-3) in the resin (A) which contains all of these recurring units, the content of the recurring unit (1-1) when the resin (A) contains a functional group originating from a lactone skeleton is preferably smaller than its content when the resin (A) does not contain a functional group originating from a lactone skeleton. Specifically, the content of the recurring unit (1-1) in the total 100 mol % of all recurring units in the resin (A) is 5-25 mol %, and preferably 5-20 mol %. If the content of the recurring unit (1-1) is less than 5 mol %, resolution as a resist tends to decrease. If more than 25 wt %, on the other hand, patterns tend to readily swell and collapse.

The following compounds can be given as examples of monomers providing the recurring unit (3):
hydroxymethyl (meth)acrylate, 2-hydroxymethyl 1-(meth)acrylate, 3-hydroxypropyl 1-(meth)acrylate, 1-fluoro-1-hydroxymethyl 1-(meth)acrylate,
1,1-difluoro-1-hydroxymethyl 1-(meth)acrylate, 1,2-difluoro-2-hydroxymethyl 1-(meth)acrylate, 1,1,2,2-tetrafluoro-2-hydroxymethyl 1-(meth)acrylate,
2-trifluoromethyl-2-hydroxyethyl 1-(meth)acrylate,
2,2-ditrifluoromethyl-2-hydroxyethyl 1-(meth)acrylate, (meth)acrylic acid,
3-hydroxyadamant-1-yl (meth)acrylate, 5(6)-hydroxybicyclo[2.2.1]hept-2-yl (meth)acrylate, 9(10)-hydroxytetracyclo[6.2.1.1$^{3,6}$.0$^{2,7}$]dodec-4-yl (meth)acrylate,
carboxymethyl (meth)acrylate, 2-carboxyethyl (meth)acrylate, 3-carboxypropyl (meth)acrylate, 3-carboxyadamant-1-yl (meth)acrylate,
5(6)-carboxybicyclo[2.2.1]hept-2-yl (meth)acrylate,
9(10)-carboxytetracyclo[6.2.1.1$^{3,6}$.0$^{2,7}$]dodec-4-yl (meth)acrylate, cyanomethyl (meth)acrylate, 2-cyanoethyl 1-(meth)acrylate, 3-cyanopropyl 1-(meth)acrylate,
3-cyanoadamantan-1-yl (meth)acrylate, 5(6)-cyanobicyclo[2.2.1]hept-2-ylethyl (meth)acrylate, 9(10)-cyanotetracyclotetracyclo[6.2.1.1$^{3,6}$.0$^{2,7}$]dodec-4-yl (meth)acrylate,
t-butyl (meth)acrylate, 2-methyl-2-propyl (meth)acrylate, 2-methyl-2-butyl (meth)acrylate, 2-ethyl-2-butyl (meth)acrylate, 3-ethyl-3-butyl (meth)acrylate,
2-methyladamantan-2-yl (meth)acrylate, 2-methyl-3'-hydroxyadamantan-2-yl (meth)acrylate, 2-ethyladamantan-2-yl (meth)acrylate,
8-methyltricyclo[5.2.1.0$^{2,6}$]decan-8-yl (meth)acrylate,
8-ethyltricyclo[5.2.1.0$^{2,6}$]decan-8-yl (meth)acrylate,
1-methylcyclopentyl (meth)acrylate, 1-ethylcyclopentyl (meth)acrylate,
1-methylcyclohexyl (meth)acrylate, 1-ethylcyclohexyl (meth)acrylate,
2-methylbicyclo[2.2.1]hept-2-yl (meth)acrylate,
2-ethylbicyclo[2.2.1]hept-2-yl (meth)acrylate,
4-methyltetracyclo[6.2.1.1$^{3,6}$.0$^{2,7}$]dodec-4-yl (meth)acrylate,
4-ethyltetracyclo[6.2.1.1$^{3,6}$.0$^{2,7}$]dodec-4-yl (meth)acrylate,
1-cyclohexyl-1-methylethyl (meth)acrylate,
1-bicyclo[2.2.1]hept-2-yl-1-methylethyl(meth)acrylate,
1-tricyclo[5.2.1.0$^{2,6}$]dec-8-yl-1-methylethyl (meth)acrylate,
1-tetracyclo[6.2.1.1$^{3,6}$.0$^{2,7}$]dodec-4-yl-1-methylethyl (meth)acrylate,
1-adamantan-1-yl-1-methylethyl (meth)acrylate,
1-(2(3)-hydroxycyclopentyl)-1-methylethyl (meth)acrylate,
1-(3(4)-hydroxycyclohexyl)-1-methylethyl (meth)acrylate,
1-(3(4)-hydroxycycloheptyl)-1-methylethyl (meth)acrylate,
1-(3-hydroxyadamantan-1-yl)-1-methylethyl (meth)acrylate,
1,1-dicyclohexylethyl (meth)acrylate, 1,1-dibicyclo[2.2.1]hept-2-ylethyl (meth)acrylate,
1,1-ditricyclo[5.2.1.0$^{2,6}$]dec-8-ylethyl (meth)acrylate,
1,1-di(tetracyclo[6.2.1.1$^{3,6}$.0$^{2,7}$]dodec-4-yl)ethyl (meth)acrylate,
1,1-diadamantan-1-yl-1-ethyl (meth)acrylate, methyl (meth)acrylate, ethyl (meth)acrylate, n-propyl (meth)acrylate, cyclopentyl (meth)acrylate, cyclohexyl (meth)acrylate, adamantan-1-yl (meth)acrylate, bicyclo[2.2.1]hept-2-yl (meth)acrylate,
7,7-dimethylbicyclo[2.2.1]hept-1-yl (meth)acrylate,
tricyclo[5.2.1.0$^{2,6}$]dec-8-yl (meth)acrylate, tetracyclo[6.2.1.1$^{3,6}$.0$^{2,7}$]dodec-4-yl (meth)acrylate, 5-oxo-4-oxatricyclo[4.2.1.0$^{3,7}$]non-2-yl (meth)acrylate,
9-methoxycarbonyl-5-oxo-4-oxa-tricyclo[4.2.1.0$^{3,7}$]non-2-yl (meth)acrylate,
7-oxo-6-oxabicyclo[3.2.1]octan-4-yl (meth)acrylate,
2-methoxycarbonyl-7-oxo-6-oxa-bicyclo[3.2.1]oct-4-yl (meth)acrylate,
2-oxotetrahydropyran-4-yl (meth)acrylate,
4-methyl-2-oxotetrahydropyran-4-yl (meth)acrylate,
4-ethyl-2-oxotetrahydropyran-4-yl (meth)acrylate,
4-propyl-2-oxotetrahydropyran-4-yl (meth)acrylate,
5-oxotetrahydrofuran-3-yl (meth)acrylate, 2,2-dimethyl-5-oxotetrahydrofuran-3-yl (meth)acrylate,
4,4-dimethyl-5-oxotetrahydrofuran-3-yl (meth)acrylate,
2-oxotetrahydrofuran-3-yl (meth)acrylate,
4,4-dimethyl-2-oxotetrahydrofuran-3-yl (meth)acrylate,
5,5-dimethyl-2-oxotetrahydrofuran-3-yl (meth)acrylate,
2-oxotetrahydrofuran-3-yl (meth)acrylate,
5-oxotetrahydrofuran-2-yl (meth)acrylate,
3,3-dimethyl-5-oxotetrahydrofuran-2-yl (meth)acrylate,
4,4-dimethyl-5-oxotetrahydrofuran-2-yl (meth)acrylate, and the like.

Either one type or two or more types of the above recurring units (2) and (3) may be present in the resin (A).

The total amount of the recurring units (2) and/or (3) is usually 80 mol % or less, preferably 70 mol % or less, and still more preferably 60 mol % or less of the total amount of the recurring units, although the specific amount differs according to the types of the recurring units (2) and (3). If the content of the recurring units (2) and/or (3) is more than 80 mol %, not only does adhesion to the substrate and developability tend to decrease, but also the effect of reducing development defects tends to be impaired. When the resin (A) has a functional group originating from a lactone skeleton, a rather large content of the recurring units (2) and/or (3) is preferable, specifically, 70 mol % or more, and particularly 80 mol % or more.

As other monomer units forming the resin (A), monomer units formed from the following monomers can be given: monofunctional monomers, which include vinyl esters such as vinyl acetate, vinyl propionate, and vinyl butyrate; unsaturated nitrile compounds such as (meth)acrylonitrile, α-chloroacrylonitrile, crotonitrile, maleinitrile, fumaronitrile, mesaconitrile, citraconitrile, and itaconitrile; unsaturated amide compounds such as (meth)acrylamide, N,N-dimethyl (meth)acrylamide, crotonamide, maleinamide, fumaramide, mesaconamide, citraconamide, and itaconamide; other nitrogen-containing vinyl compounds such as N-vinyl-ε-caprolactam, N-vinylpyrrolidone, vinylpyridine, and vinylimidazole; unsaturated carboxylic acids (anhydrides) such as crotonic acid, maleic acid, maleic anhydride, fumaric acid, itaconic acid, itaconic anhydride, citraconic acid, citraconic anhydride, and mesaconic acid; and polyfunctional monomers such as methylene glycol di(meth)acrylate, ethylene glycol di(meth)acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl)benzene di(meth)acrylate, 1,3-bis(2-hydroxypropyl)benzene di(meth)acrylate, 1,2-adamantanediol di(meth)acrylate, 1,3-adamantanediol di(meth)acrylate, 1,4-adamantanediol di(meth)acrylate, and tricyclodecanyldimethylol di(meth)acrylate.

Either one type or two or more types of these recurring units may be present in the resin (A).

The content of these recurring units is usually 20 mol % or less, and preferably 10 mol % or less of the total content of the recurring units.

As examples of the resin (A) of the present invention, resins having the following monomer units can be given. There are no specific limitations to the order and proportion of the monomer units forming the resin (A).

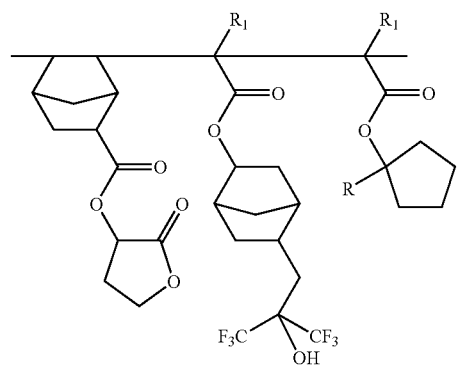

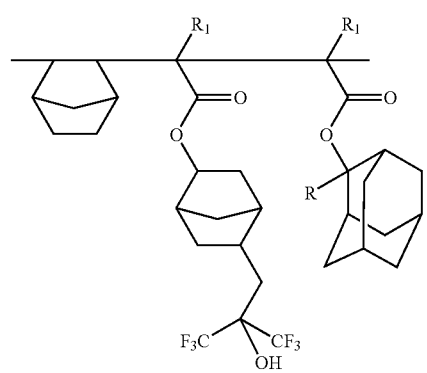

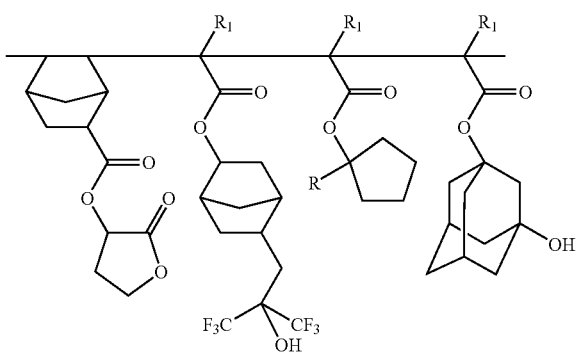

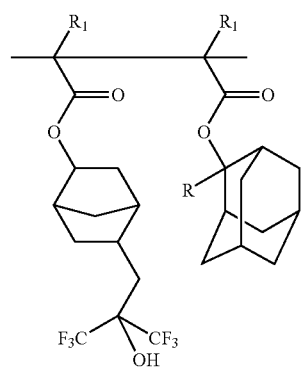

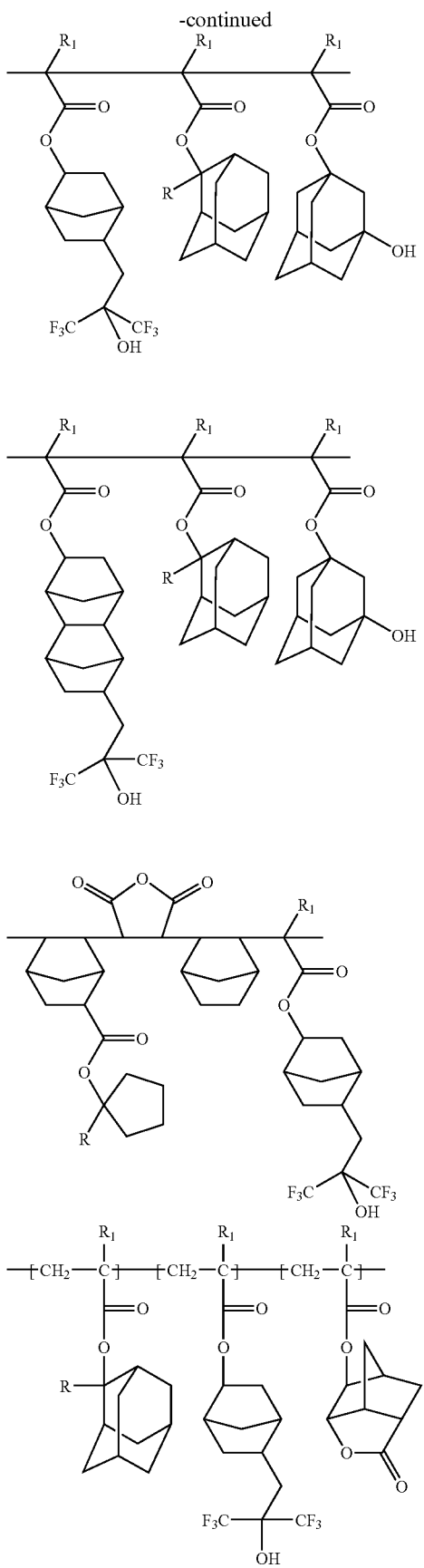
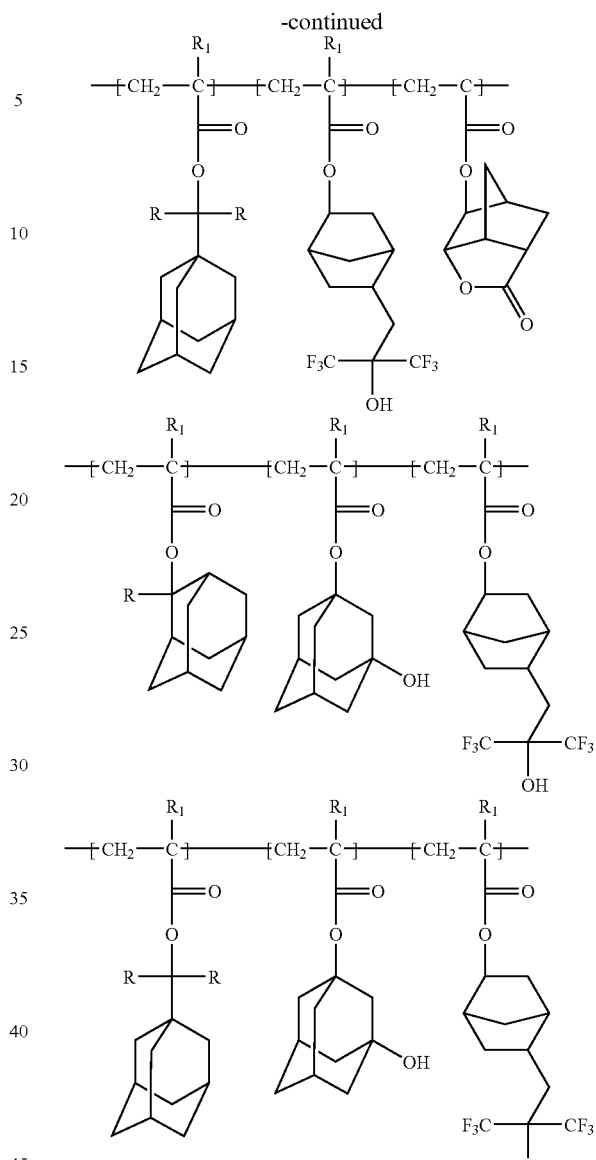

In all the above formulas, $R_1$ represents a hydrogen atom, methyl group, hydroxylalkyl group having 1-4 carbon atoms, or perfluoroalkyl group having 1-4 carbon atoms and R represents a methyl or ethyl group.

The polystyrene-reduced weight average molecular weight (hereinafter referred to as "Mw") of the resin (A) determined by gel permeation chromatography (GPC) is usually 1,000-300,000, preferably 2,000-200,000, and still more preferably 3,000-100,000. If the Mw is less than 1,000, heat resistance as a resist may decrease. If the Mw exceeds 300,000, developability as a resist may decrease.

The ratio of Mw to the number average molecular weight (hereinafter referred to as "Mn") determined at the same time as the Mw (Mw/Mn) by GPC is usually 1-5, and preferably 1-3.

The resin (A) can be used either individually or in combinations of two or more in the radiation-sensitive resin composition of the present invention.

The resin (A) is prepared by polymerizing a mixture of monomers providing each of the above recurring units in an appropriate solvent in the presence of a chain transfer agent, as required, using a radical polymerization initiator such as hydroperoxides, dialkyl peroxides, diacyl peroxides, or azo compounds.

As examples of the solvent which can be used for the polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, methyl propionate, and propylene glycol monomethyl ether acetate; alkyllactones such as γ-butyrolactone; ethers such as tetrahydrofuran, dimethoxyethanes, and diethoxyethanes; alkylketones such as 2-butanone, 2-heptanone, and methyl isobutyl ketone; cycloalkylketones such as cyclohexanone; alcohols such as 2-propanol and propylene glycol monomethyl ether; and the like can be given. These solvents can be used either individually or in combinations of two or more.

The polymerization temperature is usually 40-120° C., and preferably 50-100° C. The reaction time is usually 1-48 hours, and preferably 1-24 hours.

It is preferable that the resin (A) of the present invention has a high purity. It is preferable that not only the resin is almost free from impurities such as halogens or metals, but also the content of residual monomers and oligomers should be less than the prescribed amount, for example, the content determined by HPLC should be 0.1 wt % or less. Satisfying these requirements not only improves sensitivity, resolution, process stability, and pattern configuration of the resist obtained from the radiation-sensitive resin composition of the present invention even more, but ensures a resist with only a small change in foreign matter content and sensitivity over time.

As examples of a purification method for the resin (A) thus obtained, the following methods can be given. As a method for removing impurities such as metals, a method of putting metals in the polymer solution to be adsorbed using a zeta-potential filter, a method of causing the metals to be in a chelate state by washing the polymer solution with an acidic aqueous solution such as oxalic acid or sulfonic acid and removing the metals, and the like can be given. As a method for removing the residual monomers and oligomer components to a content less than a specific level, a liquid-liquid extraction method in which the residual monomers and oligomer components are removed by combining washing with water and a suitable solvent, a purification method in a liquid state such as ultrafiltration in which only the monomers and oligomer components with a molecular weight less than a specific value are extracted and removed, a reprecipitation method in which the residual monomers and the like are removed by adding the polymer solution to a poor solvent dropwise, thereby causing the polymer solution to coagulate in the poor solvent, and a purification method in a solid state in which the resin slurry separated by filtration is washed with a poor solvent can be given. These methods may be used in combination.

(2) Radiation-Sensitive Acid Generator (B)

The radiation-sensitive acid generator (hereinafter referred to as "acid generator (B)") is a compound which generates an acid upon exposure to radiation such as visible rays, ultraviolet rays, deep ultraviolet rays, electron beams, and X-rays.

The acid generator (B) causes an acid-dissociating group such as an alkyl adamantyl group, t-butyl group, or tetrahydropyranyl group in the resin (A) to dissociate by the action of the acid generated upon exposure to radiation. As a result, the exposed area on the resist film is rendered soluble in an alkaline developer to form a positive-tone resist pattern. The acid generator (B) consists of a parent nucleus and a generated acid.

<2-1> Generated Acid

As the generated acid, sulfonic acid compounds, carboxylic-acid compounds, imide compounds, and the like can be given. Specific compounds include the compounds shown by the following formulas (V) to (IX).

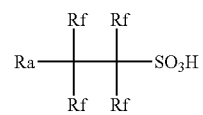

(V)

wherein Ra represents a hydrogen atom, fluorine atom, alkyl group having 1-20 carbon atoms, fluoroalkyl group having 1-20 carbon atoms, cyclic hydrocarbon group having 3-20 carbon atoms, or a cyclic fluoro-hydrocarbon group having 3-20 carbon atoms, wherein the cyclic hydrocarbon group and cyclic fluoro-hydrocarbon group may have a substituent. Rf represents a fluorine atom or trifluoromethyl group.

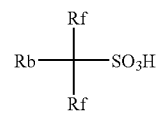

(VI)

wherein Rb represents a hydrogen atom, alkyl group having 1-20 carbon atoms, cyclic hydrocarbon group having 3-20 carbon atoms, or a cyclic fluoro-hydrocarbon group having 3-20 carbon atoms, wherein the cyclic hydrocarbon group and cyclic fluoro-hydrocarbon group may have a substituent, Rf represents a fluorine atom or trifluoromethyl group, and Rf is a hydrogen atom, fluorine atom, methyl group, or trifluoromethyl group.

Rs—SO$_3$H  (VII)

wherein Rs represents an alkyl group having 1-20 carbon atoms or cyclic hydrocarbon group having 3-20 carbon atoms, wherein the cyclic hydrocarbon group may have a substituent.

Rc—COOH  (VIII)

wherein Rc represents an alkyl group having 1-20 carbon atoms, or fluoroalkyl group having 1-20 carbon atoms, cyclic hydrocarbon group having 3-20 carbon atoms, or a cyclic fluoro-hydrocarbon group having 3-20 carbon atoms, wherein the cyclic hydrocarbon group and cyclic fluoro-hydrocarbon group may have a substituent.

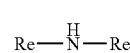

(IX)

wherein Re represents Rg—SO₂— or Rg—CO— (wherein Rg is the same group as Ra mentioned above).

When the substituent Ra in the formula (V), the substituent Rb in the formula (VI), the substituent Rs in the formula (VII), the substituent Rc in the formula (VIII), or the substituent Rg included in the substituent Re in the formula (IX) is an alkyl group, such an alkyl group may be either linear or branched. As examples, a methyl group, ethyl group, n-propyl group, i-propyl group, n-butyl group, i-butyl group, sec-butyl group, t-butyl group, n-pentyl group, n-hexyl group, n-heptyl group, n-octyl group, 2-ethylhexyl group, nonyl group, decyl group, and dodecyl group can be given.

When the substituent Ra in the formula (V), the substituent Rc in the formula (VIII), or the substituent Rg included in the substituent Re in the formula (IX) is a fluoroalkyl group, such a fluoroalkyl group may be either linear or branched. As examples, a trifluoromethyl group, pentafluoroethyl group, heptafluoro-n-propyl group, heptafluoro-i-propyl group, nonafluoro-n-butyl group, nonafluoro-i-butyl group, nonafluoro-sec-butyl group, nonafluoro-t-butyl group, perfluoro-n-pentyl group, perfluoro-n-hexyl group, perfluoro-n-heptyl group, and perfluoro-n-octyl group can be given.

When the substituent Ra in the formula (V), the substituent Rb in the formula (VI), the substituent Rs in the formula (VII), the substituent Rc in the formula (VIII), or the substituent Rg included in the substituent Re in the formula (IX) is a cyclic hydrocarbon group, the cyclic hydrocarbon group may be either an alicyclic hydrocarbon group or a hydrocarbon group containing an aromatic ring. Examples include a cyclopropyl group, cyclobutyl group, cyclopentyl group, cycloheptyl group, cyclooctyl group, phenyl group, tolyl group, xylyl group, benzyl group, and naphthyl group. When the substituent Ra in the formula (V), the substituent Rb in the formula (VI), the substituent Rc in the formula (VIII), or the substituent Rg included in the substituent Re in the formula (IX) is a cyclic fluoro-hydrocarbon group, the cyclic hydrocarbon group may be either an alicyclic hydrocarbon group or a hydrocarbon group containing an aromatic ring. As examples of the cyclic fluoro-hydrocarbon group, groups in which at least one hydrogen atom of the above-mentioned cyclic hydrocarbon group is replaced with a fluorine atom can be given.

When the above cyclic hydrocarbon group and cyclic fluoro-hydrocarbon group have an additional substituent, given as examples of such substituent groups are a phenyl group, 2-naphtyl group, cycloalkyl group, bicyclo[2.2.1]heptan-2-yl group, tetracyclo[6.2.1.1$^{3,6}$.0$^{2,7}$]dodecan-4-yl group, adamantan-1-yl group, camphor group, and derivatives thereof.

Accordingly, as specific examples of the acid shown by the above formula (V), linear or branched fluoroalkyl sulfonic acids, 2-alicyclic skeleton substitutents having an alicyclic skeleton at the 2-position can be mentioned.

As the linear or branched fluoroalkyl sulfonic acids, trifluoromethanesulfonic acid, pentafluoroethanesulfonic acid, heptafluoro-n-propanesulfonic acid, nonafluoro-n-butanesulfonic acid, perfluoro-n-octanesulfonic acid, 1,1,2,2-tetrafluoro-n-propanesulfonic acid, 1,1,2,2-tetrafluoro-n-butanesulfonic acid, 1,1,2,2-tetrafluoro-n-octanesulfonic acid, and the like can be given.

As the 2-alicyclic skeleton substitutents having an alicyclic skeleton at the 2-position, a 1,1,2,2-tetrafluoroethanesulfonic acid, 1-trifluoromethyl-1,2,2-trifluoroethanesulfonic acid, 2-trifluoromethyl-1,1,2-trifluoroethanesulfonic acid, 1,2-ditrifluoromethyl-1,2-difluoroethanesulfonic acid, 1,1-ditrifluoromethyl-2,2-difluoroethanesulfonic acid, 2,2-ditrifluoromethyl-1,1-difluoroethanesulfonic acid, and the like can be given.

As the 1,1,2,2-tetrafluoroethanesulfonic acid having an alicyclic skeleton at the 2-position, 2-cyclobutyl-1,1,2,2-tetrafluoroethanesulfonic acid,
2-cyclopentyl-1,1,2,2-tetrafluoroethanesulfonic acid,
2-cyclohexyl-1,1,2,2-tetrafluoroethanesulfonic acid,
2-phenyl-1,1,2,2-tetrafluoroethanesulfonic acid,
2-(4-trifluoromethylphenyl)-1,1,2,2-tetrafluoroethanesulfonic acid,
2-(2,3-difluorophenyl)-1,1,2,2-tetrafluoroethanesulfonic acid,
2-(2,4-difluorophenyl)-1,1,2,2-tetrafluoroethanesulfonic acid,
2-(2,5-difluorophenyl)-1,1,2,2-tetrafluoroethanesulfonic acid,
2-(2,6-difluorophenyl)-1,1,2,2-tetrafluoroethanesulfonic acid,
2-(3,4-difluorophenyl)-1,1,2,2-tetrafluoroethanesulfonic acid,
2-(3,5-difluorophenyl)-1,1,2,2-tetrafluoroethanesulfonic acid,
2-(3,6-difluorophenyl)-1,1,2,2-tetrafluoroethanesulfonic acid,
2-(2,3,4,5,6-pentafluorophenyl)-1,1,2,2-tetrafluoroethanesulfonic acid,
2-naphthalen-1-yl-1,1,2,2-tetrafluoroethanesulfonic acid,
2-naphthalen-2-yl-1,1,2,2-tetrafluoroethanesulfonic acid,
2-bicyclo[2.2.1]heptan-2-yl-1,1,2,2-tetrafluoroethanesulfonic acid,
2-(5-hydroxybicyclo[2.2.1]heptan-2-yl)-1,1,2,2-tetrafluoroethanesulfonic acid,
2-(6-hydroxybicyclo[2.2.1]heptan-2-yl)-1,1,2,2-tetrafluoroethanesulfonic acid,
2-(7,7-dimethylbicyclo[2.2.1]heptan-2-yl)-1,1,2,2-tetrafluoroethanesulfonic acid,
2-(tetracyclo[6.2.1.1$^{3,6}$.0$^{2,7}$]dodecan-4-yl)-1,1,2,2-tetrafluoroethanesulfonic acid,
2-(9-hyroxytetracyclo[6.2.1.1$^{3,6}$.0$^{2,7}$]dodecan-4-yl)-1,1,2,2-tetrafluoroethanesulfonic acid,
2-(10-hyroxytetracyclo[6.2.1.1$^{3,6}$.0$^{2,7}$]dodecan-4-yl)-1,1,2,2-tetrafluoroethanesulfonic acid,
2-adamantan-1-yl-1,1,2,2-tetrafluoroethanesulfonic acid,
2-(1-adamantyl)-1,1,2,2-tetrafluoroethanesulfonic acid,
2-adamantan-2-yl-1,1,2,2-tetrafluoroethanesulfonic acid,
2-(3-hydroxyadamantan-1-yl)-1,1,2,2-tetrafluoroethanesulfonic acid,
2-(3-hydroxyadamantan-2-yl)-1,1,2,2-tetrafluoroethanesulfonic acid, and the like can be given.

As specific examples of the acid shown by the above formula (VI), linear or branched fluoroalkyl sulfonic acids, alicyclic skeleton substitutents having an alicyclic skeleton at the 1- or 2-position can be mentioned.

As the linear or branched fluoroalkyl sulfonic acid, 1-fluoroethanesulfonic acid,
1-fluoro-n-propanesulfonic acid, 1-fluoro-n-butanesulfonic acid,
1-fluoro-n-octanesulfonic acid, 1,1-difluoroethanesulfonic acid,
1,1-difluoro-n-propanesulfonic acid, 1,1-difluoro-n-butanesulfonic acid,
1,1-difluoro-n-octanesulfonic acid, 1-trifluoromethyl-n-propanesulfonic acid, 1-trifluoromethyl-n-butanesulfonic acid, 1-trifluoromethyl-n-octanesulfonic acid,
1,1-bis(trifluoromethyl)ethanesulfonic acid, 1,1-bis(trifluoromethyl)-n-propanesulfonic acid, 1,1-bis(trifluoromethyl)-n-butanesulfonic acid,
1,1-bis(trifluoromethyl)-n-octanesulfonic acid, and the like can be given.

As the alicyclic skeleton substitutents having an alicyclic skeleton at the 1- or 2-position, alicyclic skeleton substitutents of a 1,1-difluoromethanesulfonic acid,
1,1-difluoroethanesulfonic-acid, 1-monofluoromethansulfonic acid,
1-monofluoroethanesulfonic-acid, 1-trifluoromethylmethansulfonic acid,
1-trifluoromethylethanesulfonic-acid, 1,1-ditrifluoromethylmethansulfonic acid,
1,1-ditrifluoromethylethanesulfonic acid, and the like can be given.

As the 1,1-difluoromethanesulfonic acid having an alicyclic skeleton at the 1-position, 1-cyclobutyl-1,1-difluoromethanesulfonic acid,
1-cyclopentyl-1,1-difluoromethanesulfonic acid,
1-cyclohexyl-1,1-difluoromethanesulfonic acid, 1-phenyl-1,1-difluoromethanesulfonic acid, 1-(4-trifluoromethylphenyl)-1,1-difluoromethanesulfonic acid,
1-(2,3-difluorophenyl)-1,1-difluoromethanesulfonic acid,
1-(2,4-difluorophenyl)-1,1-difluoromethanesulfonic acid,
1-(2,5-difluorophenyl)-1,1-difluoromethanesulfonic acid,
1-(2,6-difluorophenyl)-1,1-difluoromethanesulfonic acid,
1-(3,4-difluorophenyl)-1,1-difluoromethanesulfonic acid,
1-(3,5-difluorophenyl)-1,1-difluoromethanesulfonic acid,
1-(3,6-difluorophenyl)-1,1-difluoromethanesulfonic acid,
1-(2,3,4,5,6-pentaluorophenyl)-1,1-difluoromethanesulfonic acid,
1-(naphthalen-1-yl)-1,1-difluoromethanesulfonic acid,
1-(naphthalen-1-yl)-1,1-difluoromethanesulfonic acid,
1-(2-bicyclo[2.2.1]heptyl)-1,1-difluoromethanesulfonic acid,
1-(5-hydroxy-2-bicyclo[2.2.1]heptyl)-1,1-difluoromethanesulfonic acid,
1-(6-hydroxy-2-bicyclo[2.2.1]heptyl)-1,1-difluoromethanesulfonic acid,
1-(7,7-dimethyl-2-bicyclo[2.2.1]heptyl)-1,1-difluoromethanesulfonic acid,
1-tetracyclo[6.2.1.1$^{3,6}$.0$^{2,7}$]dodecan-4-yl-1,1-difluoromethansulfonic acid,
1-(9-hyroxytetracyclo[6.2.1.1$^{3,6}$.0$^{2,7}$]dodecan-4-yl)-1,1-difluoromethansulfonic acid,
1-(10-hyroxytetracyclo[6.2.1.1$^{3,6}$.0$^{2,7}$]dodecan-4-yl)-1,1-difluoromethansulfonic acid,
1-adamantan-1-yl-1,1-difluoromethanesulfonic acid,
1-adamantan-2-yl-1,1-difluoromethanesulfonic acid,
1-(3-hydroxyadamantan-1-yl)-1,1-difluoromethanesulfonic acid,
1-(3-hydroxyadamantan-1-yl)-1,1,-difluoromethansulfonic acid, and the like can be given.

As the 1,1-difluoromethanesulfonic acid having an alicyclic skeleton at the 2-position, 2-cyclobutyl-1,1-difluoroethanesulfonic acid,
2-cyclopentyl-1,1-difluoroethanesulfonic acid, 2-cyclohexyl-1,1-difluoroethanesulfonic acid, 2-phenyl-1,1-difluoroethanesulfonic acid,
2-(4-trifluoromethylphenyl)-1,1-difluoroethanesulfonic acid,
2-(2,3-difluorophenyl)-1,1-difluoroethanesulfonic acid,
2-(2,4-difluorophenyl)-1,1-difluoroethanesulfonic acid,
2-(2,5-difluorophenyl)-1,1-difluoroethanesulfonic acid,
2-(2,6-difluorophenyl)-1,1-difluoroethanesulfonic acid,
2-(3,4-difluorophenyl)-1,1-difluoroethanesulfonic acid,
2-(3,5-difluorophenyl)-1,1-difluoroethanesulfonic acid,
2-(3,6-difluorophenyl)-1,1-difluoroethanesulfonic acid,
2-(2,3,4,5,6-pentaluorophenyl)-1,1-difluoroethanesulfonic acid,
2-(naphthalen-1-yl)-1,1-difluoroethanesulfonic acid,
2-(naphthalen-2-yl)-1,1-difluoroethanesulfonic acid,
2-(2-bicyclo[2.2.1]heptyl)-1,1-difluoroethanesulfonic acid,
2-(5-hydroxy-2-bicyclo[2.2.1]heptyl)-1,1-difluoroethanesulfonic acid,
2-(6-hydroxy-2-bicyclo[2.2.1]heptyl)-1,1-difluoroethanesulfonic acid,
2-(7,7-dimethyl-2-bicyclo[2.2.1]heptyl)-1,1-difluoroethanesulfonic acid,
2-tetracyclo[6.2.1.1$^{3,6}$.0$^{2,7}$]dodecan-4-yl-1,1-difluoroethansulfonic acid,
2-(9-hyroxytetracyclo[6.2.1.1$^{3,6}$.0$^{2,7}$]dodecan-4-yl)-1,1-difluoroethansulfonic acid,
2-(10-hyroxytetracyclo[6.2.1.1$^{3,6}$.0$^{2,7}$]dodecan-4-yl)-1,1-difluoroethansulfonic acid,
2-adamantan-1-yl-1,1-difluoroethanesulfonic acid,
2-adamantan-2-yl-1,1-difluoroethanesulfonic acid,
2-(3-hydroxyadamantan-1-yl)-1,1-difluoroethanesulfonic acid,
2-(3-hydroxyadamantan-2-yl)-1,1-difluoroethansulfonic acid, and the like can be given.

As specific examples of the acid represented by the formula (VII), a linear, branched, or cyclic alkyl sulfonic acid, aromatic sulfonic acid, 10-camphor sulfonic acid, an acid in which the substituent Rs is a cyclic hydrocarbon having 3-20 carbon atoms, cyclic fluorohydrocarbon having 3-20 carbon atoms, or a derivative of these hydrocarbons to which a —SO$_3$—H group bonds can be given.

As the linear, branched, or cyclic alkyl sulfonic acid, methanesulfonic acid, ethanesulfonic acid, n-propanesulfonic acid, n-butanesulfonic acid, i-butanesulfonic acid, sec-butanesulfonic acid, t-butanesulfonic acid, n-pentanesulfonic acid, n-hexanesulfonic acid, n-octanesulfonic acid, cyclopentanesulfonic acid, cyclohexanesulfonic acid, and the like can be given.

As the aromatic sulfonic acid, benzenesulfonic acid, p-toluenesulfonic acid, benzylsulfonic acid, α-naphthalenesulfonic acid, β-naphthalenesulfonic acid, and the like can be given.

As specific acids represented by the above formula (VIII), acetic acid, n-propionic acid, butyric acid, isobutyric acid, valeric acid, isovaleric acid, caproic acid, benzoic acid, salicylic acid, phthalic acid, terephthalic acid, α-naphthalenecarboxylic acid, β-naphthalenecarboxylic acid, cyclobutanecarboxylic acid, cyclopentanecarboxylic acid, cyclohexanecarboxylic acid, 1,1-cyclobutanedicarboxylic acid, 1,2-cyclobutanedicarboxylic acid, 1,1-cyclopentanedicarboxylic acid, 1,2-cyclopentanedicarboxylic acid, 1,3-cyclopentanedicarboxylic acid, 1,1-cyclohexanedicarboxylic acid, 1,2-cyclohexanedicarboxylic acid, 1,3-cyclohexanedicarboxylic acid, 1,4-cyclohexanedicarboxylic acid, 2-norbornanecarboxylic acid, 2,3-norbornanedicarboxylic acid, norbornyl-2-acetic acid, 1-adamantanecarboxylic acid, 1-adamantaneacetic acid, 1,3-adamantanedicarboxylic acid, 1,3-adamantanediacetic acid, lithocholic acid, deoxycholic acid, chenodeoxycholic acid, and cholic acid, as well as acids in which the substituent Rc is a cyclic hydrocarbon having 3-20 carbon atoms, cyclic fluorohydrocarbon having 3-20 carbon atoms, or a derivative of these hydrocarbons to which a —COOH group bonds can be given.

As specific examples of the acid represented by the formula (IX), N,N-bis(trifluoromethanesulfonyl)imidic acid, N,N-bis (pentafluoroethanesulfonyl)imidic acid, N,N-bis(heptafluoro-n-propanesulfonyl)imidic acid, N,N-bis(nonafluoro-n-butanesulfonyl)imidic acid, N,N-bis(perfluoro-n-octanesulfonyl)imidic acid, N,N-bis(1,1,2,2-tetrafluoro-n-propanesulfonyl)imidic acid, N,N-bis(1,1,2,2-tetrafluoro-n-butanesulfonyl)imidic acid. N,N-bis(1,1,2,2-tetrafluoro-n-octanesulfonyl)imidic acid, N-trifluoromethanesulfonyl-N-pentafluoroethanesulfonylimidic acid, N-trifluoromethanesulfonyl-N-heptafluoro-n-propanesulfonylimidic acid, N-trifluoromethanesulfonyl-N-nonafluoro-n-butanesulfonylimidic acid, N-pentafluoroethanesulfonyl-N-heptafluoro-n-propanesulfonylimidic acid, N-pentafluoroethanesulfonyl-N-nonafluoro-n-butanesulfonylimidic acid, N-heptafluoro-n-propanesulfonyl-N-nonafluoro-n-butanesulfonylimidic acid, and acids in which the substituent Re is a cyclic hydrocarbon having 3-20 carbon atoms, cyclic fluorohydrocarbon having 3-20 carbon atoms, or a derivative of these hydrocarbons to which a —NH— group bonds can be given.

<2-2> Parent Nucleus

As the parent nucleus generating the acids of the formulas (V) to (IX), onium salts, sulfoneimide compounds, sulfone compounds, sulfonate compounds, disulfonyldiazomethane compounds, disulfonylmethane compounds, oxime sulfonate compounds, hydrazine sulfonate compounds, and the like can be given.

As examples of onium salt parent nuclei, iodonium salts, sulfonium salts (including tetrahydrothiophenium salts), phosphonium salts, diazonium salts, and pyridinium salts can be given.

As the onium salt, diphenyliodonium salt, bis(4-t-butylphenyl)iodonium salt, di(p-tolyl)iodonium salt, di(3,4-dimethylphenyl)iodonium salt, 4-nitrophenyl.phenyliodonium salt, di(3-nitrophenyl)iodonium salt, 4-methoxyphenyl.phenyliodonium salt, di(4-chlorophenyl) iodonium salt, di(4-trifluoromethylphenyl)iodonium salt, biphenyleneiodonium salt, di(2-naphthyl)iodonium salt, 2-chlorobiphenyleneiodonium salt, and the like can be given.

As the sulfonium salt, aryl sulfonium salts such as triphenylsulfonium salt, 4-t-butylphenyl diphenylsulfonium salt, 4-t-butoxyphenyl diphenylsulfonium salt, 4-hydroxyphenyldiphenylsulfonium salt, tri(4-methoxyphenyl)sulfonium salt, di(4-methoxyphenyl)-p-tolylsulfonium salt, phenyl biphenylenesulfonium salt, (4-phenylthiophenyl).diphenylsulfonium salt, and 4,4'-bis(diphenylsulfoniophenyl)sulfide salt; (cyclo)alkylsulfonium salts such as dicyclohexylmethylsulfonium salt, dimethylcyclohexylsulfonium salt and tricyclohexylsulfonium salt; 2-oxosulfonium salts such as cyclohexyl.2-oxocyclohexyl.methylsulfonium salt, dicyclohexyl.2-oxocyclohexylsulfonium salt, 2-oxocyclohexyldimethylsulfonium salt, bicyclo[2.2.1]hept-2-yl.methyl.2.(oxocyclohexyl)sulfonium salt, bicyclo[2.2.1]hept-2-yl.cyclohexyl.(2-oxocyclohexyl)sulfonium salt, 1-(2-naphthalen-1-yl-2-oxoethyl)tetrahydrothiophenium salt, 1-(2-naphthalen-2-yl-2-oxoethyl)tetrahydrothiophenium salt, and 1-(2-oxo-n-butyl)tetrahydrothiophenium salt; dialkyl.naphthalen-1-yl sulfonium salts such as 1-(naphthalen-1-yl)dimethylsulfonium salt, 1-(naphthalen-1-yl)diethylsulfonium salt, 1-(4-cyanonaphthalen-1-yl)dimethylsulfonium salt, 1-(4-cyanonaphthalen-1-yl)diethylsulfonium salt, 1-(4-nitronaphthalen-1-yl)dimethylsulfonium salt, 1-(4-nitronaphthalen-1-yl)diethylsulfonium salt, 1-(4-methylnaphthalen-1-yl)dimethylsulfonium salt, 1-(4-methylnaphthalen-1-yl)diethylsulfonium salt, 1-(4-hydroxynaphthalen-1-yl) tetrahydrothiophenium salt, 1-(4-hydroxynaphthalen-1-yl) dimethylsulfonium salt, 1-(4-hydroxynaphthalen-1-yl) diethylsulfonium salt, and the like can be given.

As the arylthiophenium salt, 1-(4-methoxynaphthalen-1-yl)tetrahydrothiophenium salt, 1-(4-ethoxynaphthalen-1-yl) tetrahydrothiophenium salt, 1-(4-n-butoxynaphthalen-1-yl) tetrahydrothiophenium salt, 1-(4-methoxymethoxynaphthalen-1-yl)tetrahydrothiophenium salt, 1-(4-ethoxymethoxynaphthalen-1-yl)tetrahydrothiophenium salt, 1-[4-(1-methoxyethoxy)naphthalen-1-yl]tetrahydrothiophenium salt, 1-[4-(2-methoxyethoxy) naphthalen-1-yl]tetrahydrothiophenium salt, 1-(4-methoxycarbonyloxynaphthalen-1-yl) tetrahydrothiophenium salt, 1-(4-ethoxycarbonyloxynaphthalen-1-yl)tetrahydrothiophenium salt, 1-(4-n-propoxycarbonyloxynaphthalen-1-yl)tetrahydrothiophenium salt, 1-(4-i-propoxycarbonyloxynaphthalen-1-yl)tetrahydrothiophenium salt, 1-(4-n-butoxycarbonyloxynaphthalen-1-yl)tetrahydrothiophenium salt, 1-(4-t-butoxycarbonyloxynaphthalen-1-yl)tetrahydrothiophenium salt, 1-[4-(2-tetrahydrofuranyloxy)naphthalen-1-yl]tetrahydrothiophenium salt, 1-[4-(2-tetrahydropyranyloxy)naphthalen-1-yl]tetrahydrothiophenium salt, 1-(4-benzyloxynaphthalen-1-yl)tetrahydrothiophenium salt, 4-(4-n-butoxynaphthalen-1-yl)-4-thioniatricyclo[5.2.1.0$^{2,6}$]decane salt, (4-ethoxynaphthalen-1-yl)-4-thioniatricyclo[5.2.1.0$^{2,6}$] decane salt, 1-[4-(bicyclo[2.2.1]hept-2-yl)oxynaphthalen-1-yl]tetrahydrothiophenium salt, 1-(3,5-dimethyl-4-hydroxyphenyl)tetrahydrothiophenium salt, 1-(3,5-dimethyl-4-ethoxyphenyl)tetrahydrothiophenium salt, and 1-(3,5-dimethyl-4-butoxyphenyl)tetrahydrothiophenium salt.

Examples of the sulfonimide compound include, but are not limited to, the compounds shown by the following formula (B1-1), which is formed by a sulfonyloxy bond or ester bond of a parent nucleus shown by the formula (B1-2) with an acid generated.

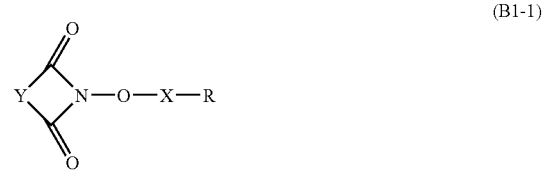

(B1-1)

wherein R indicates a skeleton of an acid shown by the above formula (V), (VI), (VII), (VIII), or (IX), X represents a bonding group originating from the acid generated, and Y represents a divalent organic group.

(B1-2)

wherein Y represents a divalent organic group.

In the above formula (B1-1), when the acid generated is a sulfonic acid, for example, X represents a sulfonyl group, and when the acid generated is a carboxylic acid, X represents a carbonyl group. When the acid generated is an imidic acid, X represents a group N—R', wherein R' represents a sulfonyl group-containing organic group or a carbonyl-group content organic group. The groups R and R' depend on the structure of the generated acid.

Although not specifically limited, the group Y in the above-mentioned formulas (B1-1) and (B1-2) includes alkylene groups such as a methylene group, ethylene group, n-propylene group, isopropylene group, n-butylene group, and isobutylene group; divalent organic groups originating from a cycloalkane or an organic alicyclic structure such as cyclopentane, cyclohexane, cycloheptane, cyclooctane, and bicyclo[2.2.1]heptane; and the like.

As the mother nucleus represented by the above formula (B1-2) forming a sulfonimide compound, N-hydroxysuccinimide, N-hydroxydiphenylmaleimide, N-hydroxybicyclo[2.2.1]hept-5-ene-2,3-dicarboxylmide, N-hydroxy-7-oxabicyclo[2.2.1]hept-5-ene-2,3-dicarboxylmide, N-hydroxybicyclo[2.2.1]heptane-5,6-oxy-2,3-dicarboxylmide, N-hydroxynaphthylimide, N-hydroxyphthalimide, and the like can be given.

As the above sulfone compound, β-ketosulfone, β-sulfonylsulfone, α-diazo compounds of these compounds, and the like can be given.

As the above sulfonate compound, an alkyl sulfonate, haloalkyl sulfonate, aryl sulfonate, imino sulfonates, and the like can be given.

Examples of the above disulfonyl diazomethane compound include, but are not limited to, the compounds shown by the following formula (B2),

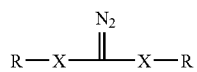

(B2)

wherein R indicates a skeleton of an acid shown by the above formula (V), (VI), (VII), (VIII), or (IX) and X represents a bonding group originating from the acid generated.

In the above formula (B2), when the acid generated is a sulfonic acid, for example, X represents a sulfonyl group, and when the acid generated is a carboxylic acid, X represents a carbonyl group. When the acid generated is an imidic acid, X represents a group N—R', wherein R' represents a sulfonyl group-containing organic group or a carbonyl-group content organic group. The groups R and R' depend on the structure of the generated acid.

Examples of the above disulfonylmethane compound include, but are not limited to, the compounds shown by the following formula (B3),

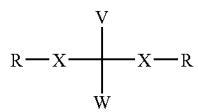

(B3)

wherein R indicates a skeleton of an acid shown by the above formula (V), (VI), (VII), (VIII), or (IX), X represents a bonding group originating from the acid generated, and V and W individually represent an aryl group, in combination form a monocyclic or polycyclic ring containing at least one unsaturated bond, or in combination form a group shown by the following formula (B4).

In the above formula (B3), when the acid generated is a sulfonic acid, for example, X represents a sulfonyl group, and when the acid generated is a carboxylic acid, X represents a carbonyl group. When the acid generated is an imidic acid, X represents a group N—R', wherein R' represents a sulfonyl group-containing organic group or a carbonyl group-containing organic group. The groups R and R' depend on the structure of the generated acid.

(B4)

wherein V' and W', two or more V' groups, or two or more W' groups may be either the same or different and represent a hydrogen atom, halogen atom, alkyl group, cycloalkyl group, aryl group, or aralkyl group, or V' and W' each bonded to the same or different carbon atoms bond to form a monocyclic carbon structure, and n is an integer of 2-10.

Examples of the oxime sulfonimide compound include, but are not limited to, the compounds shown by the following formula (B5) or (B6).

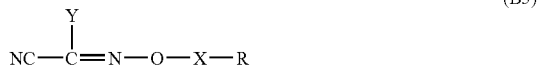

(B5)

wherein R indicates a skeleton of an acid generated shown by the above formula (V), (VI), (VII), (VIII), or (IX), X represents a bonding group originating from the acid generated, and Y represents a monovalent organic group.

In the above formula (B5), when the acid generated is a sulfonic acid, for example, X represents a sulfonyl group, and when the acid generated is a carboxylic acid, X represents a carbonyl group. When the acid generated is an imidic acid, X represents a group N—R', wherein R' represents a sulfonyl group-containing organic group or a carbonyl-group content organic group. The groups R and R' depend on the structure of the generated acid.

As the group Y in the formula (B5), a methyl group, ethyl group, n-propyl group, phenyl group, tosyl group, and the like can be given.

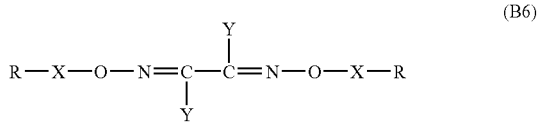

(B6)

wherein R indicates a skeleton of an acid generated shown by the above formula (V), (VI), (VII), (VIII), or (IX), X represents a bonding group originating from the acid generated, and Y individually represents a monovalent organic group.

In the above formula (B6), when the acid generated is a sulfonic acid, for example, X represents a sulfonyl group, and when the acid generated is a carboxylic acid, X represents a carbonyl group. When the acid generated is an imidic acid, X represents a group N—R', wherein R' represents a sulfonyl group-containing organic group or a carbonyl group-containing organic group. The groups R and R' depend on the structure of the generated acid.

As the group Y in the formula (B6), a methyl group, ethyl group, n-propyl group, phenyl group, tosyl group, and the like can be given.

As examples of the hydrazine sulfonate compound, bis(benzene)sulfonylhydrazine, bis(p-toluene)sulfonylhydrazine, bis(trifluoromethane)sulfonylhydrazine, bis(nonafluoro-n-butane)sulfonylhydrazine, bis(n-propane)sulfonylhydrazine, benzenesulfonylhydrazine, p-toluenesulfonylhydrazine, trifluoromethanesulfonylhydrazine, nonafluoro-n-butanesulfonylhydrazine, n-propanesulfonylhydrazine, and trifluoromethanesulfonyl.p-toluenesulfonylhydrazine can be given.

<2-3> Acid Generator (B)

As examples of the acid generator (B) comprising the above acid generated and the above parent nucleus,
diphenyliodonium trifluoromethanesulfonate,
diphenyliodonium nonafluoro-n-butanesulfonate,
diphenyliodonium perfluoro-n-octanesulfonate,
diphenyliodonium 2-bicyclo[2.2.1]hept-2-yl-1,1,2,2-tetrafluoroethanesulfonate,
diphenyliodonium 1,1,2,2-tetrafluoro-2-(5(6)-hydroxybicyclo[2.2.1]hept-2-yl)ethanesulfonate, diphenyliodonium 2-tetracyclo[6.2.1.1$^{3,6}$.0$^{2,7}$]dodecan-4-yl-1,1,2,2-tetrafluoroethanesulfonate,
diphenyliodonium 2-(9(10)-hydroxy-3-tetracyclo[6.2.1.1$^{3,6}$.0$^{2,7}$]dodecan-4-yl)-1,1,2,2-tetrafluoroethanesulfonate, diphenyliodonium N,N-bis(trifluoromethanesulfonyl)imidate,
diphenyliodonium N,N-bis(pentafluoroethanesulfonyl)imidate,
diphenyliodonium N,N-bis(heptafluoro-n-propanesulfonyl)imidate,
diphenyliodonium N,N-bis(nonafluoro-n-butanesulfonyl)imidate,
diphenyliodonium benzenesulfonate,
diphenyliodonium 4-trifluorobenzenesulfonate,
diphenyliodonium 2,4-difluorobenzenesulfonate,
diphenyliodonium 2,3,4,5,6-pentafluorobenzenesulfonate,
diphenyliodonium camphorsulfonate,
bis(4-t-butylphenyl)iodoniumtrifluoromethane sulfonate,
bis(4-t-butylphenyl)iodonium nonafluoro-n-butanesulfonate,
bis(4-t-butylphenyl)iodonium perfluoro-n-octanesulfonate,
bis(4-t-butylphenyl)iodonium 2-bicyclo[2.2.1]hept-2-yl-1,1,2,2-tetrafluoroethanesulfonate,
bis(4-t-butylphenyl)iodonium 1,1,2,2-tetrafluoro-2-(5(6)-hydroxybicyclo[2.2.1]hept-2-yl)ethanesulfonate,
bis(4-t-butylphenyl)iodonium 2-tetracyclo[6.2.1.1$^{3,6}$.0$^{2,7}$]dodecan-4-yl-1,1,2,2-tetrafluoroethanesulfonate,
bis(4-t-butylphenyl)iodonium 2-(9(10)-hydroxytetracyclo[6.2.1.1$^{3,6}$.0$^{2,7}$]dodecan-4-yl)-1,1,2,2-tetrafluoroethanesulfonate, bis(4-t-butylphenyl)iodonium N,N-bis(trifluoromethanesulfonyl)imidate,
bis(4-t-butylphenyl)iodonium N,N-bis(pentafluoroethanesulfonyl)imidate,
bis(4-t-butylphenyl)iodonium N,N-bis(heptafluoro-n-propanesulfonyl)imidate,
bis(4-t-butylphenyl)iodonium N,N-bis(nonafluoro-n-butanesulfonyl)imidate,
bis(4-t-butylphenyl)iodonium benzenesulfonate,
bis(4-t-butylphenyl)iodonium 4-trifluorobenzenesulfonate,
bis(4-t-butylphenyl)iodonium 2,4-difluorobenzenesulfonate,
bis(4-t-butylphenyl)iodonium 2,3,4,5,6-pentafluorobenzenesulfonate,
bis(4-t-butylphenyl)iodonium camphorsulfonate,
triphenylsulfonium trifluoromethanesulfonate,
triphenylsulfonium nonafluoro-n-butanesulfonate,
triphenylsulfonium perfluoro-n-octanesulfonate,
triphenylsulfonium 2-bicyclo[2.2.1]hept-2-yl-1,1,2,2-tetrafluoroethanesulfonate,
triphenylsulfonium 1,1,2,2-tetrafluoro-2-(5(6)-hydroxybicyclo[2.2.1]hept-2-yl)ethanesulfonate,
triphenylsulfonium 2-tetracyclo[6.2.1.1$^{3,6}$.0$^{2,7}$]dodecan-4-yl-1,1,2,2-tetrafluoroethanesulfonate,
triphenyliodonium 2-(9(10)-hydroxytetracyclo[6.2.1.1$^{3,6}$.0$^{2,7}$]dodecan-4-yl)-1,1,2,2-tetrafluoroethanesulfonate,
triphenylsulfonium N,N-bis(trifluoromethanesulfonyl)imidate,
triphenylsulfonium N,N-bis(pentafluoroethanesulfonyl)imidate,
triphenylsulfonium N,N-bis(heptafluoro-n-propanesulfonyl)imidate,
triphenylsulfonium N,N-bis(nonafluoro-n-butanesulfonyl)imidate,
triphenylsulfonium benzenesulfonate,
triphenylsulfonium 4-trifluoromethylbenzenesulfonate,
triphenylsulfonium 2,4-difluorobenzenesulfonate,
triphenylsulfonium 2,3,4,5,6-pentafluorobenzenesulfonate,
triphenylsulfonium camphorsulfonate,
bicyclo[2.2.1]heptan-2-yl.cyclohexyl.(2-oxocyclohexyl)sulfonium trifluoromethanesulfonate,
bicyclo[2.2.1]hept-2-yl.cyclohexyl.(2-oxocyclohexyl)sulfonium nonafluoro-n-butanesulfonate,
bicyclo[2.2.1]hept-2-yl.cyclohexyl.(2-oxocyclohexyl)sulfonium perfluoro-n-octanesulfonate,
bicyclo[2.2.1]hept-2-yl.cyclohexyl.(2-oxocyclohexyl)sulfonium 2-bicyclo[2.2.1]heptan-2-yl-1,1,2,2-tetrafluoroethanesulfonate,
bicyclo[2.2.1]hept-2-yl.cyclohexyl.(2-oxocyclohexyl)sulfonium 1,2,2-tetrafluoro-2-(5 (6)-hydroxybicyclo[2.2.1]hept-2-yl)ethanesulfonate,
bicyclo[2.2.1]hept-2-yl.cyclohexyl.(2-oxocyclohexyl)sulfonium 2-tetracyclo [6.2.1.1$^{3,6}$.0$^{2,7}$]dodecan-4-yl-1,1,2,2-tetrafluoroethanesulfonate,
bicyclo[2.2.1]hept-2-yl.cyclohexyl.(2-oxocyclohexyl)sulfonium 2-(9(10)-hydroxytetracyclo [6.2.1.1$^{3,6}$.0$^{2,7}$]dodecan-4-yl)-1,1,2,2-tetrafluoroethanesulfonate,
bicyclo[2.2.1]hept-2-yl.cyclohexyl.(2-oxocyclohexyl)sulfonium N,N-bis(trifluoromethanesulfonyl)imidate,
bicyclo[2.2.1]hept-2-yl.cyclohexyl.(2-oxocyclohexyl)sulfonium N,N-bis(pentafluoroethanesulfonyl)imidate,
bicyclo[2.2.1]heptan-2-yl.cyclohexyl.(2-oxocyclohexyl)sulfonium N,N-bis(heptafluoro-n-propanesulfonyl)imidate,
bicyclo[2.2.1]hept-2-yl.cyclohexyl.(2-oxocyclohexyl)sulfonium N,N-bis(nonafluoro-n-butanesulfonyl)imidate,
bicyclo[2.2.1]hept-2-yl.cyclohexyl.(2-oxocyclohexyl)sulfonium benzenesulfonate,
bicyclo[2.2.1]hept-2-yl.cyclohexyl.(2-oxocyclohexyl)sulfonium 4-trifluolobenzenesulfonate,
bicyclo[2.2.1]hept-2-yl.cyclohexyl.(2-oxocyclohexyl)sulfonium 2,4-trifluolobenzenesulfonate,
bicyclo[2.2.1]hept-2-yl.cyclohexyl.(2-oxocyclohexyl)sulfonium 2,3,4,5,6-pentafluorobenzenesulfonate,
bicyclo[2.2.1]hept-2-yl.cyclohexyl.(2-oxocyclohexyl)sulfonium camphorsulfonate,
1-(2-naphthalen-1-yl-2-oxoethyl)tetrahydrothiophenium trifluoromethanesulfonate,
1-(2-naphthalen-1-yl-2-oxoethyl)tetrahydrothiophenium nonafluoro-n-butanesulfonate,
1-(2-naphthalen-1-yl-2-oxoethyl)tetrahydrothiophenium perfluoro-n-octanesulfonate, 1-(2-naphthalen-1-yl-2-oxoethyl)tetrahydrothiophenium 2-bicyclo[2.2.1]hept-2-yl-1,1,2,2-tetrafluoroethanesulfonate,
1-(2-naphthalen-1-yl-2-oxoethyl)tetrahydrothiophenium 1,1,2,2-tetrafluoro-2-(5(6)-hydroxybicyclo[2.2.1]hept-2-yl)ethanesulfonate,
1-(2-naphthalen-1-yl-2-oxoethyl)tetrahydrothiophenium 2-tetracyclo[6.2.1.1$^{3,6}$.0$^{2,7}$]dodecan-4-yl-1,1,2,2-tetrafluoroethanesulfonate,
1-(2-naphthalen-1-yl-2-oxoethyl)tetrahydrothiophenium 2-(8(9)-hydroxytetracyclo[6.2.1.1$^{3,6}$.0$^{2,7}$]dodecan-4-yl)-1,1,2,2-tetrafluoroethanesulfonate, 1-(2-naphthalen-1-yl-2-oxoethyl)tetrahydrothiophenium N,N-bis(trifluoromethanesulfonyl)imidate,
1-(2-naphthalen-1-yl-2-oxoethyl)tetrahydrothiophenium N,N-bis(pentafluoroethanesulfonyl)imidate,
1-(2-naphthalen-1-yl-2-oxoethyl)tetrahydrothiophenium N,N-bis(heptafluoro-n-propanesulfonyl)imidate,
1-(2-naphthalen-1-yl-2-oxoethyl)tetrahydrothiophenium N,N-bis(nonafluoro-n-butanesulfonyl)imidate,
1-(2-(naphthalen-1-yl-2-oxoethyl)tetrahydrothiophenium benzenesulfonate,
1-(2-naphthalen-1-yl-2-oxoethyl)tetrahydrothiophenium 4-trifluoromethylbenzenesulfonate,
1-(2-naphthalen-1-yl-2-oxoethyl)tetrahydrothiophenium 2,4-difluorobenzenesulfonate,
1-(2-naphthalen-1-yl-2-oxoethyl)tetrahydrothiophenium 2,3,4,5,6-pentafluorobenzenesulfonate,
1-(2-naphthalen-1-yl-2-oxoethyl)tetrahydrothiophenium camphorsulfonate,
1-(4-hydroxynaphthalen-1-yl)tetrahydrothiophenium trifluoromethanesulfonate,
diphenyliodonium nonafluoro-n-butanesulfonate,
1-(4-hydroxynaphthalen-1-yl)tetrahydrothiophenium perfluoro-n-octanesulfonate,
1-(4-hydroxynaphthalen-1-yl)tetrahydrothiophenium 2-bicyclo[2.2.1]heptan-2-yl-1,1,2,2-tetrafluoroethanesulfonate,
1-(4-hydroxynaphthalen-1-yl)tetrahydrothiophenium 1,1,2,2-tetrafluoro-2-(5(6)-hydroxybicyclo[2.2.1]hept-2-yl)ethanesulfonate,
1-(4-hydroxynaphthalen-1-yl)tetrahydrothiophenium 2-tetracyclo[6.2.1.1$^{3,6}$.0$^{2,7}$]dodecan-4-yl-1,1,2,2-tetrafluoroethanesulfonate,
1-(4-hydroxynaphthalen-1-yl)tetrahydrothiophenium 2-(9(10)-hydroxytetracyclo[6.2.1.1$^{3,6}$.0$^{2,7}$]dodecan-4-yl)-1,1,2,2-tetrafluoroethanesulfonate, 1-(4-hydroxynaphthalen-1-yl)tetrahydrothiophenium N,N-bis(trifluoromethanesulfonyl)imidate,
1-(4-hydroxynaphthalen-1-yl)tetrahydrothiophenium N,N-bis(pentafluoroethanesulfonyl)imidate,
1-(4-hydroxynaphthalen-1-yl)tetrahydrothiophenium N,N-bis(heptafluoro-n-propanesulfonyl)imidate,
1-(4-hydroxynaphthalen-1-yl)tetrahydrothiophenium N,N-bis(nonafluoro-n-butanesulfonyl)imidate,
1-(4-hydroxynaphthalen-1-yl)tetrahydrothiophenium benzenesulfonate, diphenyliodonium 4-trifluorobenzenesulfonate,
1-(4-hydroxynaphthalen-1-yl)tetrahydrothiophenium 2,4-difluorobenzenesulfonate,
1-(4-hydroxynaphthalen-1-yl)tetrahydrothiophenium 2,3,4,5,6-pentafluorobenzenesulfonate,
1-(4-hydroxynaphthalen-1-yl)tetrahydrothiophenium camphorsulfonate,
1-(4-n-butoxynaphthalen-1-yl)tetrahydrothiophenium trifluoromethanesulfonate,
1-(4-n-butoxynaphthalen-1-yl)tetrahydrothiophenium nonafluoro-n-butanesulfonate,
1-(4-n-butoxynaphthalen-1-yl)tetrahydrothiophenium perfluoro-n-octanesulfonate,
1-(4-n-butoxynaphthalen-1-yl)tetrahydrothiophenium 2-bicyclo[2.2.1]heptan-2-yl-1,1,2,2-tetrafluoroethanesulfonate,
1-(4-n-butoxynaphthalen-1-yl)tetrahydrothiophenium 1,1,2,2-tetrafluoro-2-(5 (6)-hydroxybicyclo[2.2.1]hept-2-yl)ethanesulfonate,
1-(4-n-butoxynaphthalen-1-yl)tetrahydrothiophenium 2-tetracyclo[6.2.1.1$^{3,6}$.0$^{2,7}$]dodecan-4-yl-1,1,2,2-tetrafluoroethanesulfonate,
1-(4-n-butoxynaphthalen-1-yl)tetrahydrothiophenium 2-(9(10)-hydroxytetracyclo[6.2.1.1$^{3,6}$.0$^{2,7}$]dodecan-4-yl)-1,1,2,2-tetrafluoroethanesulfonate, 1-(4-n-butoxynaphthalen-1-yl)tetrahydrothiophenium N,N-bis(trifluoromethanesulfonyl)imidate,
1-(4-n-butoxynaphthalen-1-yl)tetrahydrothiophenium N,N-bis(pentafluoroethanesulfonyl)imidate,
1-(4-n-butoxynaphthalen-1-yl)tetrahydrothiophenium N,N-bis(heptafluoro-n-propanesulfonyl)imidate,
1-(4-n-butoxynaphthalen-1-yl)tetrahydrothiophenium N,N-bis(nonafluoro-n-butanesulfonyl)imidate,
1-(4-n-butoxynaphthalen-1-yl)tetrahydrothiophenium benzenesulfonate, 1-(4-n-butoxynaphthalen-1-yl)tetrahydrothiophenium 4-trifluorobenzenesulfonate,
1-(4-n-butoxynaphthalen-1-yl)tetrahydrothiophenium 2,4-difluorobenzenesulfonate,
1-(4-n-butoxynaphthalen-1-yl)tetrahydrothiophenium 2,3,4,5,6-pentafluorobenzenesulfonate,
1-(4-n-butoxynaphthalen-1-yl)tetrahydrothiophenium camphorsulfonate,
(4-n-butoxynaphthalen-1-yl)-4-thioniatricyclo[5.2.1.0$^{2,6}$]decane trifluoromethanesulfonate,
(4-n-butoxynaphthalen-1-yl)-4-thioniatricyclo[5.2.1.0$^{2,6}$]decane nonafluoro-n-butanesulfonate,
(4-n-butoxynaphthalen-1-yl)-4-thioniatricyclo[5.2.1.0$^{2,6}$]decane perfluoro-n-octanesulfonate,
(4-n-butoxynaphthalen-1-yl)-4-thioniatricyclo[5.2.1.0$^{2,6}$]decane 2-bicyclo[2.2.1]hept-2-yl-1,1,2,2-tetrafluoroethanesulfonate,
(4-n-butoxynaphthalen-1-yl)-4-thioniatricyclo[5.2.1.0$^{2,6}$]decane 1,1,2,2-tetrafluoro-2-(5 (6)-hydroxybicyclo[2.2.1]hept-2-yl)ethanesulfonate,
(4-n-butoxynaphthalen-1-yl)-4-thioniatricyclo[5.2.1.0$^{2,6}$]decane 2-tetracyclo[6.2.1.1$^{3,6}$.0$^{2,7}$]dodecan-4-yl-1,1,2,2-tetrafluoroethanesulfonate,
(4-n-butoxynaphthalen-1-yl)-4-thioniatricyclo[5.2.1.0$^{2,6}$]decane 2-(9(10)-hydroxytetracyclo[6.2.1.1$^{3,6}$.0$^{2,7}$]dodecan-4-yl)-1,1,2,2-tetrafluoroethanesulfonate,
(4-n-butoxynaphthalen-1-yl)-4-thioniatricyclo[5.2.1.0$^{2,6}$]decane N,N-bis(trifluoromethanesulfonyl)imidate,
(4-n-butoxynaphthalen-1-yl)-4-thioniatricyclo[5.2.1.0$^{2,6}$]decane N,N-bis(pentafluoroethanesulfonyl)imidate,
(4-n-butoxynaphthalen-1-yl)-4-thioniatricyclo[5.2.1.0$^{2,6}$]decane N,N-bis(heptafluoro-n-propanesulfonyl)imidate,
(4-n-butoxynaphthalen-1-yl)-4-thioniatricyclo[5.2.1.0$^{2,6}$]decane N,N-bis(nonafluoro-n-butanesulfonyl)imidate,
diphenyliodonium benzenesulfonate,
(4-n-butoxynaphthalen-1-yl)-4-thioniatricyclo[5.2.1.0$^{2,6}$]decane 4-trifluorobenzenesulfonate,
(4-n-butoxynaphthalen-1-yl)-4-thioniatricyclo[5.2.1.0$^{2,6}$]decane 2,4-difluorobenzenesulfonate,
(4-n-butoxynaphthalen-1-yl)-4-thioniatricyclo[5.2.1.0$^{2,6}$]decane 2,3,4,5,6-pentafluorobenzenesulfonate, (4-n-butoxynaphthalen-1-yl)-4-thioniatricyclo[5.2.1.0$^{2,6}$]
  decane camphorsulfonate,
1-(3,5-dimethyl-4-hydroxyphenyl)tetrahydrothiophenium
  trifluoromethanesulfonate,
1-(3,5-dimethyl-4-hydroxyphenyl)tetrahydrothiophenium
  nonafluoro-n-butanesulfonate,
1-(3,5-dimethyl-4-hydroxyphenyl)tetrahydrothiophenium
  perfluoro-n-octanesulfonate,
1-(3,5-dimethyl-4-hydroxyphenyl)tetrahydrothiophenium
  2-(bicyclo[2.2.1]hept-2-yl)-1,1,2,2-tetrafluoroethane-
  sulfonate,
1-(3,5-dimethyl-4-hydroxyphenyl)tetrahydrothiophenium
  1,1,2,2-tetrafluoro-2-(5(6)-hydroxybicyclo[2.2.1]hept-2-
  yl)ethanesulfonate,
1-(3,5-dimethyl-4-hydroxyphenyl)tetrahydrothiophenium
  2-tetracyclo[6.2.1.1$^{3,6}$.0$^{2,7}$]dodecan-4-yl-1,1,2,2-tet-
  rafluoroethanesulfonate,
1-(3,5-dimethyl-4-hydroxyphenyl)tetrahydrothiophenium
  2-(9(10)-hydroxytetracyclo[6.2.1.1$^{3,6}$.0$^{2,7}$]dodecan-4-yl)-
  1,1,2,2-tetrafluoroethanesulfonate, 1-(3,5-dimethyl-4-hy-
  droxyphenyl)tetrahydrothiophenium N,N-bis(trifluo-
  romethanesulfonyl)imidate,
1-(3,5-dimethyl-4-hydroxyphenyl)tetrahydrothiophenium
  N,N-bis(pentafluoroethanesulfonyl)imidate,
1-(3,5-dimethyl-4-hydroxyphenyl)tetrahydrothiophenium
  N,N-bis(heptafluoro-n-propanesulfonyl)imidate,
1-(3,5-dimethyl-4-hydroxyphenyl)tetrahydrothiophenium
  N,N-bis(nonafluoro-n-butanesulfonyl)imidate,
1-(3,5-dimethyl-4-hydroxyphenyl)tetrahydrothiophenium
  benzenesulfonate,
1-(3,5-dimethyl-4-hydroxyphenyl)tetrahydrothiophenium
  4-trifluorobenzenesulfonate,
1-(3,5-dimethyl-4-hydroxyphenyl)tetrahydrothiophenium
  2,4-difluorobenzenesulfonate,
1-(3,5-dimethyl-4-hydroxyphenyl)tetrahydrothiophenium
  2,3,4,5,6-pentafluorobenzenesulfonate,
1-(3,5-dimethyl-4-hydroxyphenyl)tetrahydrothiophenium
  camphorsulfonate,
1-(3,5-dimethyl-4-butoxyphenyl)tetrahydrothiophenium tri-
  fluoromethanesulfonate,
1-(3,5-dimethyl-4-butoxyphenyl)tetrahydrothiophenium
  nonafluoro-n-butanesulfonate,
1-(3,5-dimethyl-4-butoxyphenyl)tetrahydrothiophenium
  perfluoro-n-octanesulfonate,
1-(3,5-dimethyl-4-butoxyphenyl)tetrahydrothiophenium
  2-(bicyclo[2.2.1]hept-2-yl)-1,1,2,2-tetrafluoroethane-
  sulfonate,
1-(3,5-dimethyl-4-butoxyphenyl)tetrahydrothiophenium
  1,1,2,2-tetrafluoro-2-(5(6)-hydroxybicyclo[2.2.1]hept-2-
  yl)ethanesulfonate,
1-(3,5-dimethyl-4-butoxyphenyl)tetrahydrothiophenium
  2-tetracyclo[6.2.1.1$^{3,6}$.0$^{2,7}$]dodecan-4-yl-1,1,2,2-tet-
  rafluoroethanesulfonate,
1-(3,5-dimethyl-4-butoxyphenyl)tetrahydrothiophenium
  2-(9(10)-hydroxytetracyclo[6.2.1.1$^{3,6}$.0$^{2,7}$]dodecan-4-yl)-
  1,1,2,2-tetrafluoroethanesulfonate, 1-(3,5-dimethyl-4-bu-
  toxyphenyl)tetrahydrothiophenium N,N-bis(trifluo-
  romethanesulfonyl)imidate,
1-(3,5-dimethyl-4-butoxyphenyl)tetrahydrothiophenium
  N,N-bis(pentafluoroethanesulfonyl)imidate,
1-(3,5-dimethyl-4-butoxyphenyl)tetrahydrothiophenium
  N,N-bis(heptafluoro-n-propanesulfonyl)imidate,
1-(3,5-dimethyl-4-butoxyphenyl)tetrahydrothiophenium
  N,N-bis(nonafluoro-n-butanesulfonyl)imidate,
1-(3,5-dimethyl-4-butoxyphenyl)tetrahydrothiophenium
  benzenesulfonate,
1-(3,5-dimethyl-4-butoxyphenyl)tetrahydrothiophenium
  4-trifluorobenzenesulfonate,
1-(3,5-dimethyl-4-butoxyphenyl)tetrahydrothiophenium
  2,4-difluorobenzenesulfonate,
1-(3,5-dimethyl-4-butoxyphenyl)tetrahydrothiophenium
  2,3,4,5,6-pentafluorobenzenesulfonate,
1-(3,5-dimethyl-4-butoxyphenyl)tetrahydrothiophenium
  camphorsulfonate,
N-(trifluoromethanesulfonyloxy)succinimide,
N-(nonafluoro-n-butanesulfonyloxy)succinimide,
N-(perfluoro-n-octanesulfonyloxy)succinimide,
N-(2-bicyclo[2.2.1]hept-2-yl-1,1,2,2-tetrafluoroethane-
  sulfonyloxy)succinimide,
N-(1,1,2,2-tetrafluoro-2-(5(6)-hydroxybicyclo[2.2.1]hept-2-
  yl)ethanesulfonyloxy)succinimide,
N-(2-tetracyclo[6.2.1.1$^{3,6}$.0$^{2,7}$]dodecan-4-yl)-1,1,2,2-tet-
  rafluoroethanesulfonyloxy) succinimide, N-(2-(9(10)-hy-
  droxytetracyclo[6.2.1.1$^{3,6}$.0$^{2,7}$]dodecan-4-yl)-1,1,2,2-tet-
  rafluoroethanesulfonyloxy)succinimide,
N-(benzenesulfonyloxy)succinimide,
N-(4-trifluoromethylbenzenesulfonyloxy)succinimide,
N-(2,4-difluorobenzenesulfonyloxy)succinimide,
N-(2,3,4,5,6-pentafluorobenzenesulfonyloxy)succinimide,
N-(camphorsulfonyloxy)succinimide,
N-(trifluoromethanesulfonyloxy)bicyclo[2.2.1]hept-5-ene-
  2,3-dicarboxylmide,
N-(nonafluoro-n-butanesulfonyloxy)bicyclo[2.2.1]hept-5-
  ene-2,3-dicarboxylmide,
N-(perfluoro-n-octanesulfonyloxy)bicyclo[2.2.1]hept-5-
  ene-2,3-dicarboxylmide,
N-(2-bicyclo[2.2.1]hept-2-yl-1,1,2,2-tetrafluoroethane-
  sulfonyloxy)bicyclo[2.2.1]hept-5-ene-2,3-dicarboxy-
  lmide,
N-(1,1,2,2-tetrafluoro-2-(5(6)-hydroxybicyclo[2.2.1]hept-2-
  yl)ethanesulfonyloxy) bicyclo[2.2.1]hept-5-ene-2,3-di-
  calboxyimide,
N-(2-tetracyclo[6.2.1.1$^{3,6}$.0$^{2,7}$]dodecan-4-yl-1,1,2,2-tet-
  rafluoroethanesulfonyloxy) bicyclo[2.2.1]hept-5-ene-2,3-
  dicarboxylmide,
N-(2-(9(10)-hydroxytetracyclo[6.2.1.1$^{3,6}$.0$^{2,7}$]dodecan-4-
  yl)-1,1,2,2-tetrafluoroethanesulfonyloxy)bicyclo[2.2.1]
  hept-5-ene-2,3-dicarboxylmide,
N-(benzenesulfonyloxy)bicyclo[2.2.1]hept-5-ene-2,3-dicar-
  boxylmide,
N-(4-trifluoromethylbenzenesulfonyloxy)bicyclo[2.2.1]
  hept-5-ene-2,3-dicarboxylmide,
N-(2,4-difluorobenzenesulfonyloxy)bicyclo[2.2.1]hept-5-
  ene-2,3-dicarboxylmide,
N-(2,3,4,5,6-pentafluorobenzenesulfonyloxy)bicyclo[2.2.1]
  hept-5-ene-2,3-dicarboxylmide, N-(camphorsulfonyloxy)
  bicyclo[2.2.1]hept-5-ene-2,3-dicarboxylmide,
N-(trifluoromethanesulfonyloxy)-7-oxabicyclo[2.2.1]hept-
  5-ene-2,3-dicarboxylmide,
N-(nonafluoro-n-butanesulfonyloxy)-7-oxabicyclo[2.2.1]
  hept-5-ene-2,3-dicarboxylmide,
N-(perfluoro-n-octanesulfonyloxy)-7-oxabicyclo[2.2.1]
  hept-5-ene-2,3-dicarboxylmide,
N-(2-bicyclo[2.2.1]hept-2-yl-1,1,2,2-tetrafluoroethane-
  sulfonyloxy)-7-oxabicyclo[2.2.1]hept-5-ene-2,3-dicar-
  boxylmide,
N-(1,1,2,2-tetrafluoro-2-(5(6)-hydroxybicyclo[2.2.1]hept-2-
  yl)ethanesulfonyloxy)-7-bicyclo[2.2.1]hept-5-ene-2,3-di-
  calboxyimide,
N-(2-tetracyclo[6.2.1.1$^{3,6}$.0$^{2,7}$]dodecan-4-yl-1,1,2,2-tet-
  rafluoroethanesulfonyloxy)-7-oxabicyclo[2.2.1]hept-5-
  ene-2,3-dicarboxylmide, N-(2-(9(10)-hydroxytetracyclo[6.2.1.1$^{3,6}$.0$^{2,7}$]dodecan-4-yl)-1,1,2,2-tetrafluoroethanesulfonyloxy)-7-oxabicyclo[2.2.1]hept-5-ene-2,3-dicarboxylmide,
N-(benzenesulfonyloxy)-7-oxabicyclo[2.2.1]hept-5-ene-2,3-dicarboxylmide,
N-(4-trifluoromethylbenzenesulfonyloxy)-7-oxabicyclo[2.2.1]hept-5-ene-2,3-dicarboxylmide,
N-(2,4-difluorobenzenesulfonyloxy)-7-oxabicyclo[2.2.1]hept-5-ene-2,3-dicarboxylmide,
N-(2,3,4,5,6-pentafluorobenzenesulfonyloxy)-7-oxabicyclo[2.2.1]hept-5-ene-2,3-dicarboxylmide, and
N-(camphorsulfonyloxy)-7-oxabicyclo[2.2.1]hept-5-ene-2,3-dicarboxylmide can be given.

Of these, diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate,
diphenyliodonium 2-tetracyclo[6.2.1.1$^{3,6}$.0$^{2,7}$]dodecan-4-yl-1,1,2,2-tetrafluoroethanesulfonate,
diphenyliodonium N,N-bis(nonafluoro-n-butanesulfonyl)imidate,
diphenyliodonium camphorsulfonate,
bis(4-t-butylphenyl)iodoniumtrifluoromethane sulfonate,
bis(4-t-butylphenyl)iodonium nonafluoro-n-butanesulfonate,
bis(4-t-butylphenyl)iodonium perfluoro-n-octanesulfonate,
bis(4-t-butylphenyl)iodonium 2-bicyclo[2.2.1]hept-2-yl-1,1,2,2-tetrafluoroethanesulfonate, bis(4-t-butylphenyl)iodonium 2-tetracyclo[6.2.1.1$^{3,6}$.0$^{2,7}$]dodecan-4-yl-1,1,2,2-tetrafluoroethanesulfonate,
bis(4-t-butylphenyl)iodonium N,N-bis(nonafluoro-n-butanesulfonyl)imidate,
bis(4-t-butylphenyl)iodonium camphorsulfonate,
triphenylsulfonium trifluoromethanesulfonate,
triphenylsulfonium nonafluoro-n-butanesulfonate,
triphenylsulfonium perfluoro-n-octanesulfonate,
triphenyliodonium 2-bicyclo[2.2.1]hept-2-yl-1,1,2,2-tetrafluoroethanesulfonate,
triphenylsulfonium 2-tetracyclo[6.2.1.1$^{3,6}$.0$^{2,7}$]dodecan-4-yl-1,1,2,2-tetrafluoroethanesulfonate,
triphenylsulfonium N,N-bis(nonafluoro-n-butanesulfonyl)imidate,
triphenylsulfonium camphorsulfonate,
1-(4-n-butoxynaphthalen-1-yl)tetrahydrothiophenium trifluoromethanesulfonate,
1-(4-n-butoxynaphthalen-1-yl)tetrahydrothiophenium nonafluoro-n-butanesulfonate,
1-(4-n-butoxynaphthalen-1-yl)tetrahydrothiophenium perfluoro-n-octanesulfonate,
1-(4-n-butoxynaphthalen-1-yl)tetrahydrothiophenium 2-bicyclo[2.2.1]heptan-2-yl-1,1,2,2-tetrafluoroethanesulfonate,
1-(4-n-butoxynaphthalen-1-yl)tetrahydrothiophenium 2-(tetracyclo[6.2.1.1$^{3,6}$.0$^{2,7}$]dodecan-4-yl-1,1,2,2-tetrafluoroethanesulfonate,
1-(4-n-butoxynaphthalen-1-yl)tetrahydrothiophenium N,N-bis(nonafluoro-n-butanesulfonyl)imidate,
1-(4-n-butoxynaphthalen-1-yl)tetrahydrothiophenium camphorsulfonate,
1-(3,5-dimethyl-4-hydroxyphenyl)tetrahydrothiophenium trifluoromethanesulfonate,
1-(3,5-dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate,
1-(3,5-dimethyl-4-hydroxyphenyl)tetrahydrothiophenium 2-(bicyclo[2.2.1]hept-2-yl)-1,1,2,2-tetrafluoroethanesulfonate,
1-(3,5-dimethyl-4-hydroxyphenyl)tetrahydrothiophenium 2-tetracyclo[6.2.1.1$^{3,6}$.0$^{2,7}$]dodecan-4-yl-1,1,2,2-tetrafluoroethanesulfonate,
1-(3,5-dimethyl-4-hydroxyphenyl)tetrahydrothiophenium N,N-bis(nonafluoro-n-butanesulfonyl)imidate,
1-(3,5-dimethyl-4-hydroxyphenyl)tetrahydrothiophenium camphorsulfonate,
N-(trifluoromethanesulfonyloxy)succinimide,
N-(nonafluoro-n-butanesulfonyloxy)succinimide,
N-(perfluoro-n-octanesulfonyloxy)succinimide,
N-(2-bicyclo[2.2.1]hept-2-yl-1,1,2,2-tetrafluoroethanesulfonyloxy)succinimide,
N-(2-tetracyclo[6.2.1.13, 6.02.7]dodecan-4-yl-1,1,2,2-tetrafluoroethanesulfonyloxy) succinimide,
N-(camphorsulfonyloxy)succinimide,
N-(trifluoromethanesulfonyloxy)bicyclo[2.2.1]hept-5-ene-2,3-dicarboxylmide,
N-(nonafluoro-n-butanesulfonyloxy)bicyclo[2.2.1]hept-5-ene-2,3-dicarboxylmide,
N-(perfluoro-n-octanesulfonyloxy)bicyclo[2.2.1]hept-5-ene-2,3-dicarboxylmide,
N-(2-bicyclo[2.2.1]hept-2-yl-1,1,2,2-tetrafluoroethanesulfonyloxy)bicyclo[2.2.1]hept-5-ene-2,3-dicarboxylmide,
N-(2-tetracyclo[6.2.1.1$^{3,6}$.0$^{2,7}$]dodecan-4-yl-1,1,2,2-tetrafluoroethanesulfonyloxy) bicyclo[2.2.1]hept-5-ene-2,3-dicarboxylmide,
N-(camphorsulfonyloxy)bicyclo[2.2.1]hept-5-ene-2,3-dicarboxylmide, and the like are preferable.

The above acid generators (B) can be used either individually or in combinations of two or more.

The amount of the acid generator (B) in the radiation-sensitive resin composition of the present invention is usually 0.1-20 parts by weight, preferably 0.1-15 parts by weight, and more preferably 0.1-10 parts by weight, for 100 parts by weight of the resin (A). The amount in this range ensures sufficient sensitivity and developability as a resist. If the amount of the acid generator (B) is less than 0.1 part by weight, sensitivity and developability of the resulting resist may decrease. If the amount exceeds 10 parts by weight, it may be difficult to obtain a rectangular resist pattern due to a decrease in transparency to radiation.

(3) Additives

Various additives may be incorporated in the radiation-sensitive resin composition of the present invention. In particular, an acid diffusion controller (C) is preferably added to control diffusion of an acid generated from the acid generator (B) upon exposure in the resist film and prevents unnecessary chemical reactions in the unexposed region.

As the acid diffusion controller, nitrogen-containing organic compounds of which the basicity does not change during exposure or heating when forming a resist pattern are preferable.

Although there are no specific limitations, a compound shown by the following formula (X), quaternary ammonium hydroxide compound, amide group-containing compound, urea compound, and nitrogen-containing heterocyclic compound can be given as examples of the nitrogen-containing organic compound.

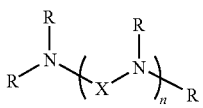 (X)

wherein R individually represents a hydrogen atom, a substituted or unsubstituted, linear, branched, or cyclic alkyl group, substituted or unsubstituted aryl group, or substituted or unsubstituted aralkyl group, X indicates a divalent organic group, and n is an integer of 0-2.

When the substituent R in the formula (X) has a functional group, a hydroxyl group, and the like can be given as examples. Either one functional group or two or more functional groups that are combined together may be used.

A compound of the formula (X) in which n=0 is herein indicated as "nitrogen-containing compound (a)". A compound of the formula (X) in which n=1 or 2 is indicated as "nitrogen-containing compound (b)". Polyamino compounds and polymers having three or more nitrogen atoms are collectively referred to as "nitrogen-containing compound (c)".

Examples of the nitrogen-containing compounds (a) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, dicyclohexylmethylamine, and tricyclohexylamine; and aromatic amines such as aniline, N-methylaniline, N,N-dimethylaniline, 2-methylaniline, 3-methylaniline, 4-methylaniline, 4-nitroaniline, 2,6-dimethylaniline, 2,6-diisopropyl aniline, diphenylamine, triphenylamine, and naphthylamine.

Examples of the nitrogen-containing compound (b) include ethylenediamine, N,N,N',N'-tetramethylethylenediamine, N,N,N',N'-tetrakis(2-hydroxypropyl)ethylenediamine, tetramethylenediamine, 1,3-bis[1-(4-aminophenyl)-1-methylethyl]benzenetetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, and bis(2-diethylaminoethyl)ether.

Examples of the nitrogen-containing compounds (c) include polyethyleneimine, polyallylamine, a polymer of 2-dimethylaminoethylacrylamide, and the like.

As examples of the quaternary ammonium hydroxide compound used as an acid diffusion controller (C) other than the compound of the above formula (X), tetramethylammonium hydroxide, tetraethylammonium hydroxide, tetra-n-propylammonium hydroxide, and tetra-n-butylammonium hydroxide can be given.

As examples of the amide group-containing compounds, N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propioneamide, benzamide, pyrrolidone, N-methylpyrrolidone, and the like can be given.

As examples of the urea compound, urea, methylurea, 1,1-dimethylurea, 1,3-dimethylurea, 1,1,3,3-tetramethylurea, 1,3-diphenylurea, and tri-n-butylthiourea can be given.

Examples of the nitrogen-containing heterocyclic compounds include: imidazoles such as imidazole, 4-methylimidazole, 1-benzyl-2-methylimidazole, 4-methyl-2-phenylimidazole, benzimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2-hydroxyethyl)piperazine; and pyrazine, pyrazole, pyridazine, quinoxaline, purine, pyrrolidine, piperidine, 3-piperidino-1,2-propanediol, morpholine, 4-methylmorpholine, 1,4-dimethylpiperazine, and 1,4-diazabicyclo[2.2.2]octane.

Of these nitrogen-containing organic compounds, the amide group-containing compound and the nitrogen-containing heterocyclic compound are preferable. As the amide group-containing compound, N-t-butoxycarbonyl group-containing amino compound is preferable. As the nitrogen-containing heterocyclic compound, imidazoles are preferable. These nitrogen-containing organic compounds can be used either individually or in combination of two or more.

The amount of the acid diffusion controller (C) to be added is usually 0.001-15 parts by weight, preferably 0.01-10 parts by weight, and more preferably 0.01-5 parts by weight for 100 parts by weight of the resin (A). The addition of the acid diffusion controller (C) in the amount of the above range ensures further improved storage stability of the resulting radiation-sensitive resin composition. The addition of the acid diffusion controller further improves resolution as a resist and prevents the line width of the resist pattern from changing due to variation of post-exposure delay (PED) from exposure to development, whereby a composition with remarkably superior process stability can be obtained.

If the amount of the acid diffusion controller (C) exceeds 15 parts by weight, sensitivity as a resist and developability of the exposed area tend to decrease. If the amount is less than 0.001 part by weight, the pattern shape or dimensional accuracy as a resist may decrease depending on the process conditions.

Preferable proportions of the resin (A), acid generator (B), and acid diffusion controller (C) in the radiation-sensitive resin composition of the present invention is as follows. For 100 parts by weight of the resin (A), usually 0.1-20 parts by weight of the acid generator (B) and 0.001-15 parts by weight of the acid diffusion controller (C), preferably 0.1-15 parts by weight of the acid generator (B) and 0.01-10 parts by weight of the acid diffusion controller (C), and more preferably 0.1-10 parts by weight of the acid generator (B) and 0.01-5 parts by weight of the acid diffusion controller (C) are added.

Additives with an effect of improving dry etching resistance, pattern shape, adhesion to substrate, and the like may be added to the radiation-sensitive resin composition of the present invention. Such additives may or may not have an acid-dissociable functional group. As examples of such additives, adamantane derivatives such as t-butyl 1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane;

deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylate such as dimethyl adipate, diethyl adipate, dipropyl adipate, di-n-butyl adipate, and di-t-butyl adipate;

and the like can be given. Of these, t-butyl 1-adamantanecarboxylate, di-t-butyl 1,3-adamantanedicarboxylate, t-butyl 1-adamantaneacetate, 2,5-dimethyl-2,5-di(adamantylcarbonyloxy)-n-hexane, t-butyl deoxycholate, t-butoxycarbonylmethyl deoxycholate, t-butyl lithocholate, t-butoxycarbonylmethyl lithocholate, and di-n-butyl adipate are preferable. These compounds can be used either individually or in combination of two or more.

The amount of the above additives to be added is usually 50 parts by weight or less, and preferably 1-30 parts by weight for 100 parts by weight of the resin (A). If the amount of the above additives exceeds 50 parts by weight, heat resistance as a resist tends to decrease.

A surfactant which improves applicability, developability, and the like may be added to the radiation-sensitive resin composition of the present invention. Any surfactants including anionic surfactants, cationic surfactants, and nonionic surfactants can be used. Of these, nonionic surfactants are preferable. As examples, polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, polyethylene glycol distearate, and the like can be given. As commercially available products, KP341 (manufactured by Shin-Etsu Chemical Co., Ltd.), Polyflow No. 75, No. 95 (manufactured by Kyoeisha Chemical Co., Ltd.), FTOP EF301, EF303, EF352 (manufactured by TOHKEM PRODUCTS CORPORATION), MEGAFAC F171, F173 (manufactured by Dainippon Ink and Chemicals, Inc.), Fluorard FC430, FC431 (manufactured by Sumitomo 3 M Ltd.), Asahi Guard AG710, Surflon S-382, SC-101, SC-102, SC-103, SC-104, SC-105, SC-106 (manufactured by Asahi Glass Co., Ltd.), and the like can be given. These surfactants can be used either individually or in combination of two or more.

The amount of the above surfactants to be added is usually two parts by weight or less, and preferably 0.001-2 parts by weight for 100 parts by weight of the total sum of the resin (A) and acid generator (B).

A photosensitizer which improves sensitivity and the like may be added to the radiation-sensitive resin composition of the present invention. As examples, carbazoles, benzophenones, rose bengals, anthracenes, phenols, and the like can be given. These compounds can be used either individually or in combination of two or more.

The amount of the above photosensitizers to be added is usually 50 parts by weight or less, and preferably 1-20 parts by weight for 100 parts by weight of the resin (A).

As other additives that can be incorporated into the radiation-sensitive resin composition of the present invention, halation inhibitors, adhesion promoters, storage stabilizers, anti-foaming agents, and the like can be given.

(4) Solvent

The radiation-sensitive resin composition of the present invention may be in the form of a solution of the resin (A), acid generator (B), and the like in a solvent. As the solvent, linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; alcohols such as n-propylalcohol, i-propylalcohol, n-butylalcohol, t-butylalcohol, and cyclohexanol;

alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, and propylene glycol mono-n-propyl ether;

aromatic solvents such as toluene and xylene;

ethyl 2-hydroxy-2-methylpropionate, ethyl ethoxyacetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, g-butyrolactone, ethylene carbonate, and propylene carbonate.

Of these, linear or branched ketones, cyclic ketones, propylene glycol monoalkyl ether acetates, alkyl 2-hydroxypropionates, alkyl 3-alkoxypropionates, γ-butyrolactone, and the like are preferable. These solvents can be used either individually or in combination of two or more.

(5) Preparation of Composition

The radiation-sensitive resin composition of the present invention can be generally obtained by dissolving all components in a solvent so that the total solid content is usually 3-50 wt %, and preferably 5-25 wt %, and filtering the solution using a filter with a pore diameter of about 0.2 µm.

(6) Resist Pattern Forming Method

The radiation-sensitive resin composition of the present invention is particularly useful as a chemically-amplified resist.

In the chemically-amplified resist, an acid-dissociable group in the resin (A) dissociates by the action of an acid generated from the acid generator (B) upon exposure, thereby producing an alkali-soluble functional group represented by a carboxyl group. As a result, solubility of the exposed part of the resist in an alkaline developer increases, whereby the exposed part is dissolved in the alkaline developer and removed to obtain a positive-tone resist pattern.

<6-1> Formation of Resist Pattern

A resist pattern is formed from the radiation-sensitive resin composition of the present invention by applying the composition solution to a substrate such as a silicon wafer or a wafer coated with aluminum using an appropriate application method such as rotational coating, cast coating, roll coating, and spray coating to form a resist film. The resist film is then optionally pre-baked (hereinafter called "PB") and exposed to form a predetermined resist pattern. As the radiation used in this instance, ultraviolet rays, deep ultraviolet rays such as KrF excimer laser (wavelength: 248 nm), ArF excimer laser (wavelength: 193 nm), $F_2$ excimer laser (wavelength: 157 nm), and EUV (extreme ultraviolet rays, wavelength: 13 nm, etc.), charged particle rays such as electron beams, X-rays such as synchrotron radiation, and the like can be given. Of these, deep ultraviolet rays and electron beams are preferable. The exposure conditions such as the light exposure are appropriately determined depending on the composition of the radiation-sensitive resin composition, types of additives, and the like.

It is preferable to perform post exposure bake (hereinafter called "PEB") in order to stably form a highly-accurate minute pattern. PEB ensures smooth dissociation of the acid-dissociable functional group in the resin (A). The heating temperature for the PEB is usually 30-200° C., and preferably 50-170° C. and heating time is 0.1-5 minutes, and preferably 0.2-3 minutes, although the heating conditions are changed depending on the content of the components in the radiation-sensitive resin composition.

To derive potential capability of the radiation-sensitive resin composition of the present invention to the maximum extent, an organic or inorganic antireflection film may be formed on a substrate used as disclosed, for example, in JP-A-59-93448. In addition, a protective film may be provided on the resist film in order to prevent an adverse effect of basic impurities and the like that are present in the environmental atmosphere using a method described in, for example, JP-A-5-188598.

The exposed resist film is then developed to form a prescribed resist pattern.

<6-2> Development

Although there are no specific limitations to the developer used for development, an alkaline aqueous solution prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, 1,5-diazabicyclo-[4.3.0]-5-nonene, and the like can be given. As the above-mentioned alkaline compound, tetramethyl ammonium hydroxide is preferable.

The concentration of the alkaline compound in the above alkaline aqueous solution is usually 10 wt % or less. If the concentration of the alkaline compound exceeds 10 wt %, an unexposed part may be dissolved in the developer.

An organic solvent may be added to the developer. As examples, linear, branched, or cyclic ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonitrile, acetone, and dimethylformamide can be given. These organic solvents can be used either individually or in combination of two or more.

The amount of the above organic solvent to be added is usually 100 parts by weight or less, and preferably 0.01-20 parts by weight for 100 parts by weight of the developer. The amount of the organic solvent exceeding 100 parts by weight may decrease developability, giving rise to a large undeveloped portion in the exposed area.

A surfactant and the like may be appropriately added to the developer.

After development using an alkaline aqueous solution developer, the resist film is preferably washed with water and dried.

The resist obtained from the radiation-sensitive resin composition of the present invention has sensitivity of 270 $J/m^2$ or less, preferably 260 $J/m^2$ or less, etching resistance of 0.8-1.0, and development defects of 10 or less, all determined by the methods described in the Example.

BEST MODE FOR CARRYING OUT THE INVENTION

The present invention is described below in more detail by examples. However, these examples should not be construed as limiting the present invention. In the examples, part(s) refers to part(s) by weight unless otherwise indicated.

1. Various Measuring Methods

The following measuring methods and evaluation methods were used in the Examples.

(1) Weight Average Molecular Weight (Mw) of Resin (A)

The Mw was measured by gel permeation chromatography (GPC) using directly connected GPC columns (manufactured by Tosoh Corp., G2000H$^{XL}$×2, G3000H$^{XL}$×1, G4000H$^{XL}$×1) under the following conditions. Flow rate: 1.0 ml/min., eluate: tetrahydrofuran, column temperature: 40° C., standard reference material: monodispersed polystyrene (2) Radiation Transmittance The composition was applied onto a quartz glass plate by spin coating and pre-baked for 60 seconds on a hot plate at 130° C. to form a resist film with a thickness of 0.34 μm. The radiation transmittance of the film calculated from the absorbance of light with a wavelength of 193 nm was used as a standard of transparency in a deep ultraviolet region.

(3) Sensitivity

<1> In the cases of Examples 1-14 and Comparative Example 1

A silicon wafer (ARC 25, manufactured by Brewer Science) with a film having a thickness of 820 Å formed on the surface was used. A composition solution was applied to a substrate by spin coating and post-baked on a hot plate under the conditions shown in Tables to obtain resist films with a thickness of 0.34 μm. The films were exposed through a mask pattern using an ArF excimer laser exposure apparatus (manufactured by Nikon Corp., lens openings: 0.55). After performing PEB under the conditions shown in the Tables, the resist film was developed at 25° C. for 60 seconds in a 2.38 wt % tetramethylammonium hydroxide aqueous solution, washed with water, and dried to form a positive-tone resist pattern. An optimum dose capable of forming a 0.16 μm line-and-space pattern (1L1S) with a 1:1 line width was taken as sensitivity.

<2> In the Cases of Examples 15-28 and Comparative Example 2

A silicon wafer (ARC 29A, manufactured by Brewer Science) with a film having a thickness of 770 Å formed on the surface was used. A composition solution was applied to a substrate and post-baked on a hot plate under the conditions shown in the Tables to obtain resist films with a thickness of 0.20 μm. The films were exposed through a mask pattern using a full field reduction projection exposure system (S306C, manufactured by Nikon Corp., lens openings: 0.75). After performing PEB under the conditions shown in the Tables, the resist film was developed at 25° C. for 60 seconds in a 2.38 wt % tetramethylammonium hydroxide aqueous solution, washed with water, and dried to form a positive-tone resist pattern. An optimum dose at which a 1:1 line-and-space pattern with a line width of 110 nm was formed was taken as sensitivity.

(4) Resolution

Minimum dimensions of the resist pattern resolved at the optimum dose were taken as the resolution.

(5) Dry-Etching Resistance

A composition was applied to a silicon wafer by spin coating and dried to form a resist film with a thickness of 0.5 μm. Then, the resist film was dry-etched using a dry-etching device (Pinnacle 8000, manufactured by PMT Co.) and $CF_4$ as an etching gas at a flow rate of 75 sccm and an output of 2,500 W under a gas pressure of 2.5 m Torr. A relative etching rate was evaluated based on the relative value of the etching rate of a sample to the etching rate of the film prepared using the composition of Comparative Example 1. The smaller the etching rate, the better the dry-etching resistance.

(6) Pattern Configuration

<1> In the Cases of Examples 1-14 and Comparative Example 1

The length of the bottom (Lb) and the top (La) of a square cross-section of a line-and-space (1L1S) pattern with a line width of 0.16 μm was measured by a scanning electron microscope. The pattern configuration was judged as "Good" when $0.85 \leq L_a/L_b \leq 1$ was satisfied and the pattern did not have a skirt-like extension, and as "Tapered" when $0.85 > L_a/L_b$. In the case of using other exposure systems, the pattern shape was evaluated by a line-and-space pattern with a line width of 0.22 μm.

<2> In the Cases of Examples 15-28 and Comparative Example 2

The pattern configuration was evaluated in the same manner as in the cases of Examples 1-14 and Comparative Example 1, except that a line-and-space pattern with a line width of 110 nm (0.11 μm) was measured.

(7) Development Defect

Development defect was evaluated by both a method of observing the presence or absence of the defective development using an optical microscope, and a method using a KLA defect inspection system (manufactured by KLA-TENCOR JAPAN LTD.).

The total number of defective clusters and unclusters extracted from the difference caused by superposing the pixels and a reference image was detected by observation at an array mode. The total number of defect was detected by adjusting the sensitivity of the system so that the system can detect the defects with 0.15 mm or more. In the evaluation, 12% of the total number of defects per wafer in the method of using the above-mentioned KLA defect inspection system was determined.

2. Preparation of Resin (A)

Synthesis Example 1

A monomer solution, prepared by dissolving 18.40 g (30 mol %) of 1-methylcyclopentyl acrylate with a structure shown by the following formula (S-2) and 55.09 g (40 mol %) of a compound of the following formula (S-3) in 73.48 g of 2-butanone, and further adding 7.32 g of dimethylazobisisobutyrate, was placed in a dropping funnel. 26.52 g (30 mol %) of the following compound (S1) and 26.52 g of 2-butanone were placed in a 500 ml three-neck flask. The mixture was purged with nitrogen for 30 minutes. After nitrogen purge, the monomer solution was added dropwise over two hours while controlling the temperature of the reaction solution at 80° C. with stirring, followed by polymerization reaction for three further hours. After the polymerization, the polymer solution was cooled with water to 30° C. or less. The cooled polymer solution was placed in a 1,000 ml separating funnel. After the addition of 200 g of ethyl acetate, 150 g of methanol, and 200 g of water, the mixture was stirred for five minutes and allowed to stand for one hour. Then, 250 g of the lower layer was removed. The lower layer polymer solution was replaced with a propylene glycol monomethyl ether acetate solution using an evaporator to obtain 200 g of a 39% polymer solution. The yield was 82%.

The resin obtained was a copolymer with a Mw of 7,206 in which the ratio of the recurring units derived from the compound (S-1), compound (S-2), and compound (S-3) was 28.1/31.2/39.7 (mol %). This resin is called "resin (A-1)".

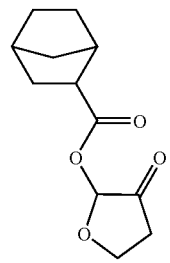

(S-1)

-continued

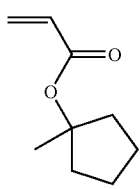
(S-2)

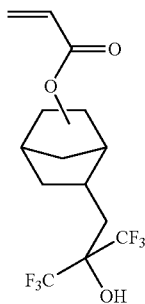
(S-3)

Synthesis Example 2

A monomer solution, prepared by dissolving 28.38 g (30 mol %) of 2-methyladamantan-2-yl acrylate and 59.48 g (40 mol %) of the above compound (S-3) in 87.87 g of 2-butanone, and further adding 7.91 g of dimethylazobisisobutyrate, was placed in a dropping funnel. 112.13 g (30 mol %) of bicyclo[2.2.1]hept-2-ene (S-4) with the following formula and 12.13 g of 2-butanone were placed in a 500 ml three-neck flask. The mixture was purged with nitrogen for 30 minutes. After nitrogen purge, the monomer solution was added dropwise over two hours while controlling the temperature of the reaction solution at 80° C. with stirring, followed by polymerization reaction for three further hours. After the polymerization, the polymer solution was cooled with water to 30° C. or less, diluted with 200 g of 2-butanone, and poured into 2,000 g of methanol to obtain white precipitate. After filtration, the obtained white powder in the form of slurry was washed twice with 400 g of methanol. The white powder collected by filtration was dried for 17 hours at 50° C. to obtain 75 g of a white powdery resin. The yield was 75%.

The resulting resin was a copolymer with a Mw of 6,900 in which the ratio of the recurring units derived from the compound (S-4), compound (S-5), and compound (S-3) was 29.2/30.4/40.4 (mol %). This resin is called "resin (A-2)".

(S-4)

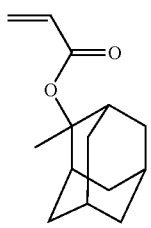
(S-5)

Synthesis Example 3

A monomer solution, prepared by dissolving 12.54 g (20 mol %) of the above compound (S-2), 42.25 g (30 mol %) of the above compound (S-3), and 18.08 g (20 mol %) of 3-hydroxyadamantan-1-yl acrylate (S-6) in 72.88 g of 2-butanone, and further adding 7.49 g of dimethylazobisisobutyrate, was placed in a dropping funnel. 27.12 g (30 mol %) of the above compound (S-1) and 27.12 g of 2-butanone were placed in a 500 ml three-neck flask. The mixture was purged with nitrogen for 30 minutes. After nitrogen purge, the monomer solution was added dropwise over two hours while controlling the temperature of the reaction solution at 80° C. with stirring, followed by heating for three further hours. After polymerization, the polymer solution was cooled with water to 30° C. or less. The cooled polymer solution was placed in a 1,000 ml separating funnel. After the addition of 200 g of ethyl acetate, 150 g of methanol, and 200 g of water, the mixture was stirred for five minutes and allowed to stand for one hour. Then, 250 g of the lower layer was removed. The lower layer polymer solution was replaced with a propylene glycol monomethyl ether acetate solution using an evaporator to obtain 200 g of a 40% polymer solution. The yield was 80%.

The resin obtained was a copolymer with a Mw of 64,000 in which the ratio of the recurring units derived from the compound (S-1), compound (S-2), compound (S-3), and compound (S-6) was 27.8/22.1/30.0/20.1 (mol %). This resin is called "resin (A-3)".

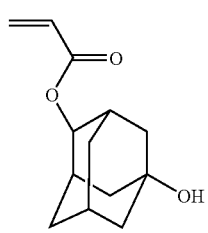
(S-6)

Synthesis Example 4

A monomer solution, prepared by dissolving 65.27 g (55 mol %) of a compound (S-7) shown below and 34.73 g (45 mol %) of 2-methyladamantan-2-yl methacrylate (S-8) in 200 g of butanone, and further adding 3.03 g of dimethylazobisisobutyrate, was placed in a dropping funnel. 100 g of 2-butanone was placed in a 1,000 ml three-neck flask and purged with nitrogen for 30 minutes. After nitrogen purge, the monomer solution was added dropwise at a rate of 2 ml/minute while heating the reaction solution at 80° C. with stirring. The mixture was allowed to react for five hours after start of the reaction. After polymerization, the polymer solution was cooled with water to 30° C. or less and poured into 2,000 g of methanol to obtain white precipitate. After filtration, the obtained white powder in the form of slurry was washed twice with 400 g of methanol. The white powder collected by filtration was dried for 17 hours at 50° C. to obtain 71 g of a white powdery resin. The yield was 71%.

The resin obtained was a copolymer with a Mw of 11,200 in which the ratio of the recurring units derived from the compound (S-7) and compound (S-8) was 57.8/42.2 (mol %). This resin is called "resin (A-4)".

(S-7)

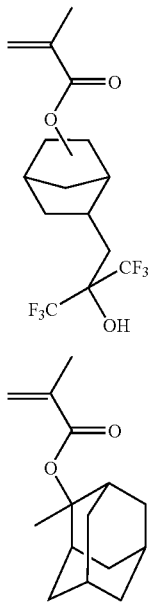

(S-8)

Synthesis Example 5

A monomer solution, prepared by dissolving 63.94 g (55 mol %) of the compound (S-7) and 36.06 g (45 mol %) of 2-ethyladamantan-2-yl methacrylate (S-9) in 200 g of 2-butanone, and further adding 2.97 g of dimethylazobisisobutyrate, was placed in a dropping funnel. 100 g of 2-butanone was placed in a 1,000 ml three-neck flask and purged with nitrogen for 30 minutes. After nitrogen purge, the monomer solution was added dropwise at a rate of 2 ml/minute while heating the reaction solution at 80° C. with stirring. The mixture was allowed to react for five hours after start of the reaction. After polymerization, the polymer solution was cooled with water to 30° C. or less and poured into 2,000 g of methanol to obtain white precipitate. After filtration, the obtained white powder in the form of slurry was washed twice with 400 g of methanol. The white powder collected by filtration was dried for 17 hours at 50° C. to obtain 65 g of a white powdery resin. The yield was 65%.

The resin obtained was a copolymer with a Mw of 10,900 in which the ratio of the recurring units derived from the compound (S-7) and compound (S-9) was 59.9/40.1 (mol %). This resin is referred to as "resin (A-5)".

(S-9)

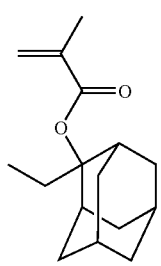

Synthesis Example 6

A monomer solution, prepared by dissolving 67.72 g (55 mol %) of a compound (S-10) shown below and 32.28 g (45 mol %) of the compound (S-8) in 200 g of 2-butanone, and further adding 2.66 g of dimethylazobisisobutyrate, was placed in a dropping funnel. 100 g of 2-butanone was placed in a 1,000 ml three-neck flask and purged with nitrogen for 30 minutes. After nitrogen purge, the monomer solution was added dropwise at a rate of 2 ml/minute while heating the reaction solution at 80° C. with stirring. The mixture was allowed to react for five hours after start of the reaction. After polymerization, the polymer solution was cooled with water to 30° C. or less and poured into 2,000 g of methanol to obtain white precipitate. After filtration, the obtained white powder in the form of slurry was washed twice with 400 g of methanol. The white powder collected by filtration was dried for 17 hours at 50° C. to obtain 68 g of a white powdery resin. The yield was 68%.

The resin obtained was a copolymer with a Mw of 11,900 in which the ratio of the recurring units derived from the compound (S-10) and compound (S-8) was 59.9/40.1 (mol %). This resin is referred to as "resin (A-6)".

(S-10)

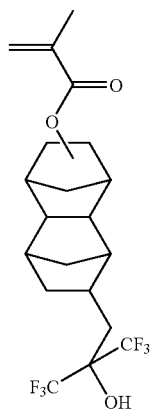

Synthesis Example 7

A monomer solution, prepared by dissolving 37.69 g (25 mol %) of the above compound (S-7), 41.42 g (50 mol %) of the above compound (S-8), and 20.89 g (25 mol %) of 3-hydroxyadamantan-1-yl methacrylate (S-11) in 200 g of 2-butanone, and further adding 3.25 g of dimethylazobisisobutyrate, was placed in a dropping funnel. 100 g of 2-butanone was placed in a 1,000 ml three-neck flask and purged with nitrogen for 30 minutes. After nitrogen purge, the monomer solution was added dropwise at a rate of 2 ml/minute while heating the reaction solution at 80° C. with stirring. The mixture was allowed to react for five hours after start of the reaction. After polymerization, the polymer solution was cooled with water to 30° C. or less and poured into 2,000 g of methanol to obtain white precipitate. After filtration, the obtained white powder in the form of slurry was washed twice with 400 g of methanol. The white powder collected by filtration was dried for 17 hours at 50° C. to obtain 69 g of a white powdery resin. The yield was 69%.

The resin obtained was a copolymer with a Mw of 9,200 in which the ratio of the recurring units derived from the compound (S-7), compound (S-8), and compound (S-11) was 29.9/45.1/25.0 (mol %). This resin is referred to as "resin (A-7)".

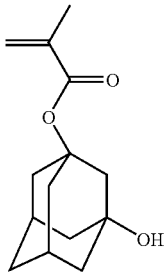

(S-11)

Synthesis Example 8

A monomer solution, prepared by dissolving 36.78 g (25 mol %) of the above compound (S-10), 42.84 g (50 mol %) of the above compound (S-9), and 20.38 g (25 mol %) of the above compound (S-11) in 200 g of 2-butanone, and further adding 3.18 g of dimethylazobisisobutyrate, was placed in a dropping funnel. 100 g of 2-butanone was placed in a 1,000 ml three-neck flask and purged with nitrogen for 30 minutes. After nitrogen purge, the monomer solution was added dropwise at a rate of 2 ml/minute while heating the reaction solution at 80° C. with stirring. The mixture was allowed to react for five hours after start of the reaction. After polymerization, the polymer solution was cooled with water to 30° C. or less and poured into 2,000 g of methanol to obtain white precipitate. After filtration, the obtained white powder in the form of slurry was washed twice with 400 g of methanol. The white powder collected by filtration was dried for 17 hours at 50° C. to obtain 66 g of a white powdery resin. The yield was 66%.

The resulting resin was a copolymer with a Mw of 9,400 in which the ratio of the recurring units derived from the compound (S-10), compound (S-9), and compound (S-11) was 30.2/44.2/25.4 (mol %). This resin is referred to as a "resin (A-8)".

Synthesis Example 9

A monomer solution, prepared by dissolving 23.06 g (16 mol %) of the above compound (S-7), 44.05 g (47 mol %) of the above compound (S-8), and 32.89 g (37 mol %) of a compound (S-12) shown below in 150 g of 2-butanone, and further adding 3.68 g of dimethylazobisisobutyrate, was placed in a dropping funnel. 100 g of 2-butanone was placed in a 500 ml three-neck flask and purged with nitrogen for 30 minutes. After nitrogen purge, the monomer solution was added dropwise at a rate of 1.4 ml/minute while heating the reaction solution at 80° C. with stirring. The mixture was allowed to react for five hours after start of the reaction. After polymerization, the polymer solution was cooled with water to 30° C. or less and poured into 2,000 g of n-heptane to obtain white precipitate. After filtration, the obtained white powder in the form of slurry was washed twice with 400 g of n-heptane. The white powder collected by filtration was dried for 17 hours at 60° C. to obtain 85.5 g of a white powdery resin. The yield was 85.5%.

The resin obtained was a copolymer with a Mw of 12,000 in which the ratio of the recurring units derived from the compound (S-7), compound (S-8), and compound (S-12) was 15.2/44.7/50.1 (mol %). This resin is referred to as "resin (A-9)".

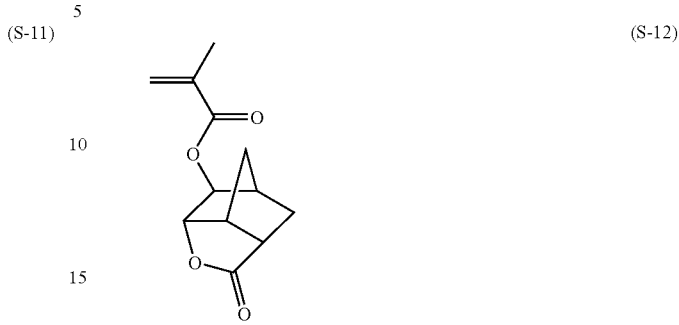

(S-12)

Synthesis Example 10

A monomer solution, prepared by dissolving 22.70 g (16 mol %) of the above compound (S-7), 36.18 g (37 mol %) of the above compound (S-9), and 41.12 g (47 mol %) of the above compound (S-12) in 150 g of 2-butanone, and further adding 3.62 g of dimethylazobisisobutyrate, was placed in a dropping funnel. 100 g of 2-butanone was placed in a 500 ml three-neck flask and purged with nitrogen for 30 minutes. After nitrogen purge, the monomer solution was added dropwise at a rate of 1.4 ml/minute while heating the reaction solution at 80° C. with stirring. The mixture was allowed to react for five hours after start of the reaction. After polymerization, the polymer solution was cooled with water to 30° C. or less and poured into 2,000 g of n-heptane to obtain white precipitate. After filtration, the obtained white powder in the form of slurry was washed twice with 400 g of n-heptane. The white powder collected by filtration was dried for 17 hours at 60° C. to obtain 89.9 g of a white powdery resin. The yield was 89.9%.

The resin obtained was a copolymer with a Mw of 11,500 in which the ratio of the recurring units derived from the compound (S-7), compound (S-9), and compound (S-12) was 15.2/33.1/51.7 (mol %). This resin is referred to as "resin (A-10)".

Synthesis Example 11

A monomer solution, prepared by dissolving 22.24 g (16 mol %) of the above compound (S-7), 37.46 g (37 mol %) of 1-adamantan-1-yl-1-methylethyl methacrylate (S-13), and 40.30 g (47 mol %) of the above compound (S-12) in 150 g of 2-butanone, and further adding 3.54 g of dimethylazobisisobutyrate, was placed in a dropping funnel. 100 g of 2-butanone was placed in a 500 ml three-neck flask and purged with nitrogen for 30 minutes. After nitrogen purge, the monomer solution was added dropwise at a rate of 1.4 ml/minute while heating the reaction solution at 80° C. with stirring. The mixture was allowed to react for five hours after start of the reaction. After polymerization, the polymer solution was cooled with water to 30° C. or less and poured into 2,000 g of n-heptane to obtain white precipitate. After filtration, the obtained white powder in the form of slurry was washed twice with 400 g of n-heptane. The white powder collected by filtration was dried for 17 hours at 60° C. to obtain 97.1 g of a white powdery resin. The yield was 97.1%.

The resin obtained was a copolymer with a Mw of 18,000 in which the ratio of the recurring units derived from the compound (S-7), compound (S-13), and compound (S-12) was 15.1/35.3/49.6 (mol %). This resin is referred to as "resin (A-11)".

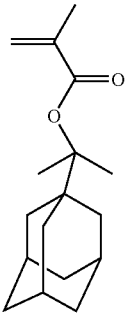

(S-13)

Synthesis Example 12

A monomer solution, prepared by dissolving 23.09 g (16 mol %) of the above compound (S-3), 36.13 g (37 mol %) of 2-ethyladamantan-2-yl acrylate (S-14), and 40.78 g (47 mol %) of the above compound (S-15) in 150 g of 2-butanone, and further adding 3.84 g of dimethylazobisisobutyrate, was placed in a dropping funnel. 100 g of 2-butanone was placed in a 500 ml three-neck flask and purged with nitrogen for 30 minutes. After nitrogen purge, the monomer solution was added dropwise at a rate of 1.4 ml/minute while heating the reaction solution at 80° C. with stirring. The mixture was allowed to react for five hours after start of the reaction. After polymerization, the polymer solution was cooled with water to 30° C. or less and poured into 2,000 g of n-heptane to obtain white precipitate. After filtration, the obtained white powder in the form of slurry was washed twice with 400 g of n-heptane. The white powder collected by filtration was dried for 17 hours at 60° C. to obtain 90.5 g of a white powdery resin. The yield was 90.5%.

The resin was a copolymer with a Mw of 10,600 in which the ratio of the recurring units derived from the compound (S-3), compound (S-14), and compound (S-15) was 15.0/34.2/50.8 (mol %). This resin is referred to as "resin (A-12)".

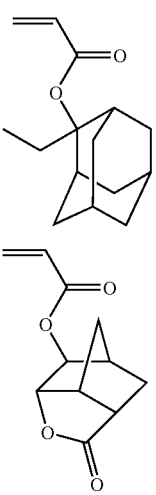

(S-14)

(S-15)

Synthesis Example 13

A monomer solution, prepared by dissolving 22.60 g (16 mol %) of the above compound (S-3), 37.48 g (37 mol %) of 1-adamantan-1-yl-1-methylethyl acrylate (S-16), and 39.92 g (47 mol %) of the above compound (S-15) in 150 g of 2-butanone, and further adding 3.75 g of dimethylazobisisobutyrate, was placed in a dropping funnel. 100 g of 2-butanone was placed in a 500 ml three-neck flask and purged with nitrogen for 30 minutes. After nitrogen purge, the monomer solution was added dropwise at a rate of 1.4 ml/minute while heating the reaction solution at 80° C. with stirring. The mixture was allowed to react for five hours after start of the reaction. After polymerization, the polymer solution was cooled with water to 30° C. or less and poured into 2,000 g of n-heptane to obtain white precipitate. After filtration, the obtained white powder in the form of slurry was washed twice with 400 g of n-heptane. The white powder collected by filtration was dried for 17 hours at 60° C. to obtain 95.5 g of a white powdery resin. The yield was 95.5%.

The resin was a copolymer with a Mw of 16,600 in which the ratio of the recurring units derived from the compound (S-3), compound (S-16), and compound (S-15) was 14.8/35.1/50.1 (mol %). This resin is referred to as "resin (A-13)".

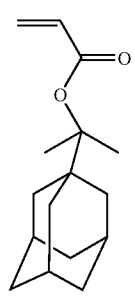

(S-16)

Synthesis Example 14

A monomer solution, prepared by dissolving 23.97 g (25 mol %) of the above compound (S-10), 50.55 g (50 mol %) of the above compound (S-8), and 25.49 g (25 mol %) of the above compound (S-11) in 200 g of 2-butanone, and further adding 3.97 g of dimethylazobisisobutyrate, was placed in a dropping funnel. 100 g of 2-butanone was placed in a 1,000 ml three-neck flask and purged with nitrogen for 30 minutes. After nitrogen purge, the monomer solution was added dropwise at a rate of 2 ml/minute while heating the reaction solution at 80° C. with stirring. The mixture was allowed to react for five hours after start of the reaction. After polymerization, the polymer solution was cooled with water to 30° C. or less and poured into 2,000 g of methanol to obtain white precipitate. After filtration, the obtained white powder in the form of slurry was washed twice with 400 g of methanol. The white powder collected by filtration was dried for 17 hours at 50° C. to obtain 74 g of a white powdery resin. The yield was 74%.

The resin was a copolymer with a Mw of 9,800 in which the ratio of the recurring units derived from the compound (S-10), compound (S-8), and compound (S-11) was 29.2/45.2/25.6 (mol %). This resin is referred to as "resin (A-14)".

Synthesis Example 15

A monomer solution, prepared by dissolving 23.97 g (25 mol %) of the above compound (S-12), 50.55 g (50 mol %) of the above compound (S-8), and 25.49 g (25 mol %) of the above compound (S-11) in 200 g of 2-butanone, and further adding 3.97 g of dimethylazobisisobutyrate, was placed in a dropping funnel. 100 g of 2-butanone was placed in a 1,000 ml three-neck flask and purged with nitrogen for 30 minutes. After nitrogen purge, the monomer solution was added dropwise at a rate of 2 ml/minute while heating the reaction solution at 80° C. with stirring. The mixture was allowed to react for five hours after start of the reaction. After polymerization, the polymer solution was cooled with water to 30° C. or less and poured into 2,000 g of methanol to obtain white precipitate. After filtration, the obtained white powder in the form of slurry was washed twice with 400 g of methanol. The white powder collected by filtration was dried for 17 hours at 50° C. to obtain 74 g of a white powdery resin. The yield was 74%.

The resin was a copolymer with a Mw of 9,800 in which the ratio of the recurring units derived from the compound (S-12), compound (S-8), and compound (S-11) was 29.2/45.2/25.6 (mol %). This resin is referred to as "resin (a-1)".

Synthesis Example 16

A monomer solution, prepared by dissolving 24.15 g (16 mol %) of the above compound (S-7), 34.45 g (37 mol %) of the above compound (S-12), and 41.41 g (47 mol %) of a compound (S-17) shown below in 200 g of 2-butanone, and further adding 3.86 g of dimethylazobisisobutyrate, was placed in a dropping funnel. A 500 ml three-neck flask containing 100 g of 2-butanone was purged with nitrogen for 30 minutes and heated to 80° C. while stirring. Then, the above monomer solution was added dropwise to the flask using a dripping funnel in two hours. The mixture was allowed to react for six hours after start of the reaction. After polymerization, the polymer solution was cooled to 30° C. or less and poured into 2,000 g of n-hexane to obtain white precipitate. After filtration, the obtained white solid was washed twice with 400 g of n-hexane. The white powder collected by filtration was dried for 17 hours at 60° C. to obtain 79 g of a white powdery resin. The yield was 79%.

The resin was a copolymer with a Mw of 12,600 in which the ratio of the recurring units derived from the compound (S-7), compound (S-12), and compound (S-17) was 15.6/39.2/45.2 (mol %). This resin is referred to as "resin (A-15)".

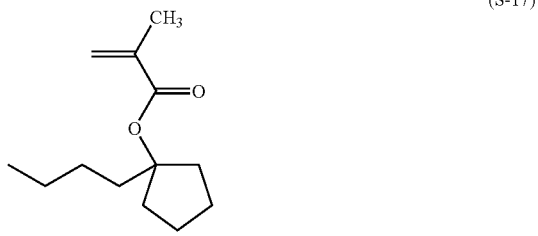

(S-17)

Synthesis Example 17

A monomer solution, prepared by dissolving 26.33 g (16 mol %) of the above compound (S-7), 37.56 g (37 mol %) of the above compound (S-12), and 36.11 g (47 mol %) of a compound (S-18) shown below in 200 g of 2-butanone, and further adding 4.20 g of dimethylazobisisobutyrate, was placed in a dropping funnel. A 500 ml three-neck flask containing 100 g of 2-butanone was purged with nitrogen for 30 minutes and heated to 80° C. while stirring. Then, the above monomer solution was added dropwise to the flask using a dripping funnel over two hours. The mixture was allowed to react for six hours after start of the reaction. After polymerization, the polymer solution was cooled to 30° C. or less and poured into 2,000 g of n-hexane to obtain white precipitate. After filtration, the obtained white solid was washed twice with 400 g of n-hexane. The white powder collected by filtration was dried for 17 hours at 60° C. to obtain 71 g of a white powdery resin. The yield was 71%.

The resin was a copolymer with a Mw of 12,100 in which the ratio of the recurring units derived from the compound (S-7), compound (S-12), and compound (S-18) was 15.1/39.1/45.8 (mol %). This resin is referred to as "resin (A-16)".

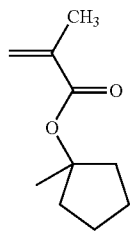

(S-18)

Synthesis Example 18

A monomer solution, prepared by dissolving 23.59 g (16 mol %) of the above compound (S-7), 33.65 g (37 mol %) of the above compound (S-12), and 42.76 g (47 mol %) of a compound (S-19) shown below in 200 g of 2-butanone, and further adding 3.77 g of dimethylazobisisobutyrate, was placed in a dropping funnel. A 500 ml three-neck flask containing 100 g of 2-butanone was purged with nitrogen for 30 minutes and heated to 80° C. while stirring. Then, the above monomer solution was added dropwise to the flask using a dripping funnel over two hours. The mixture was allowed to react for six hours after start of the reaction. After polymerization, the polymer solution was cooled to 30° C. or less and poured into 2,000 g of n-hexane to obtain white precipitate. After filtration, the obtained white solid was washed twice with 400 g of n-hexane. The white powder collected by filtration was dried for 17 hours at 60° C. to obtain 73 g of a white powdery resin. The yield was 73%.

The resin was a copolymer with a Mw of 11,800 in which the ratio of the recurring units derived from the compound (S-7), compound (S-12), and compound (S-19) was 14.9/40.3/44.8 (mol %). This resin is referred to as "resin (A-17)".

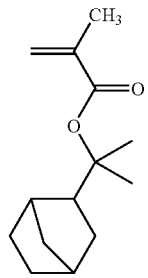

(S-19)

Synthesis Example 19

A monomer solution, prepared by dissolving 82.18 g (70 mol %) of the above compound (S-7) and 17.82 g (30 mol %) of a compound (S-20) shown below in 200 g of 2-butanone, and further adding 3.21 g of azobisisobutyronitrile, was placed in a dropping funnel. A 500 ml three-neck flask containing 100 g of 2-butanone was purged with nitrogen for 30 minutes and heated to 80° C. while stirring. Then, the above monomer solution was added dropwise to the flask using a dripping funnel over two hours. The mixture was allowed to react for six hours after start of the reaction. After polymerization, the polymer solution was cooled to 30° C. or less and poured into 4,000 g of n-hexane to obtain white precipitate. After filtration, the obtained white solid was washed twice with 400 g of n-hexane. The white powder collected by filtration was dried for 17 hours at 60° C. to obtain 72 g of a white powdery resin. The yield was 72%.

The resin was a copolymer with a Mw of 11,500 in which the ratio of the recurring units derived from the compound (S-7) and compound (S-20) was 69.5/30.5 (mol %). This resin is referred to as "resin (A-18)".

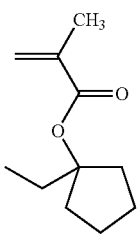

(S-20)

Synthesis Example 20

A monomer solution, prepared by dissolving 73.41 g (60 mol %) of the above compound (S-7), 18.57 g (30 mol %) of the above compound (S-20), and 8.02 g (10 mol %) of the above compound (S-11) in 200 g of 2-butanone, and further adding 3.35 g of azobisisobutyronitrile, was placed in a dropping funnel. A 500 ml three-neck flask containing 100 g of 2-butanone was purged with nitrogen for 30 minutes and heated to 80° C. while stirring. Then, the above monomer solution was added dropwise to the flask using a dripping funnel over two hours. The mixture was allowed to react for six hours after start of the reaction. After polymerization, the polymer solution was cooled to 30° C. or less and poured into 4,000 g of n-hexane to obtain white precipitate. After filtration, the obtained white solid was washed twice with 400 g of n-hexane. The white powder collected by filtration was dried for 17 hours at 60° C. to obtain 77 g of a white powdery resin. The yield was 77%.

The resin was a copolymer with a Mw of 10,900 in which the ratio of the recurring units derived from the compound (S-7), compound (S-20), and compound (S-11) was 60.2/29.5/10.3 (mol %). This resin is referred to as "resin (A-19)".

Synthesis Example 21

A monomer solution, prepared by dissolving 73.81 g (60 mol %) of the above compound (S-7), 18.67 g (30 mol %) of the above compound (S-20), and 7.52 g (10 mol %) of a compound (S-21) shown below in 200 g of 2-butanone, and further adding 3.36 g of azobisisobutyronitrile, was placed in a dropping funnel. A 500 ml three-neck flask containing 100 g of 2-butanone was purged with nitrogen for 30 minutes and heated to 80° C. while stirring. Then, the above monomer solution was added dropwise to the flask using a dripping funnel over two hours. The mixture was allowed to react for six hours after start of the reaction. After polymerization, the polymer solution was cooled to 30° C. or less and poured into 4,000 g of n-hexane to obtain white precipitate. After filtration, the obtained white solid was washed twice with 400 g of n-hexane. The white powder collected by filtration was dried for 17 hours at 60° C. to obtain 64 g of a white powdery resin. The yield was 64%.

The resin was a copolymer with a Mw of 11,300 in which the ratio of the recurring units derived from the compound (S-7), compound (S-20), and compound (S-21) was 61.3/30.9/7.8 (mol %). This resin is referred to as "resin (A-20)".

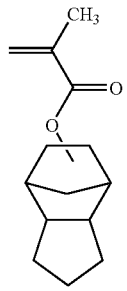

(S-21)

Synthesis Example 22

A monomer solution, prepared by dissolving 73.43 g (60 mol %) of the above compound (S-7), 18.57 g (30 mol %) of the above compound (S-20), and 7.99 g (10 mol %) of a compound (S-22) shown below in 200 g of 2-butanone, and further adding 3.36 g of azobisisobutyronitrile, was placed in a dropping funnel. A 500 ml three-neck flask containing 100 g of 2-butanone was purged with nitrogen for 30 minutes and heated to 80° C. while stirring. Then, the above monomer solution was added dropwise to the flask using a dripping funnel over two hours. The mixture was allowed to react for six hours after start of the reaction. After polymerization, the polymer solution was cooled to 30° C. or less and poured into 4,000 g of n-hexane to obtain white precipitate. After filtration, the obtained white solid was washed twice with 400 g of n-hexane. The white powder collected by filtration was dried for 17 hours at 60° C. to obtain 67 g of a white powdery resin. The yield was 67%.

The resin was a copolymer with a Mw of 11,300 in which the ratio of the recurring units derived from the compound (S-7), compound (S-20), and compound (S-22) was 61.1/30.6/8.3 (mol %). This resin is referred to as "resin (A-21)".

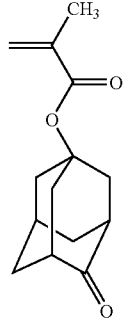

(S-22)

Synthesis Example 23

A monomer solution, prepared by dissolving 74.33 g (60 mol %) of the above compound (S-7), 17.94 g (30 mol %) of a compound (S-23) shown below, and 7.73 g (10 mol %) of a compound (S-24) shown below in 200 g of 2-butanone, and further adding 1.15 g of azobisisobutyronitrile and 1.41 g of n-dodecylmercaptan, was placed in a dropping funnel. A 500 ml three-neck flask containing 100 g of 2-butanone was purged with nitrogen for 30 minutes and heated to 80° C. while stirring. Then, the above monomer solution was added dropwise to the flask using a dripping funnel over two hours. The mixture was allowed to react for six hours after start of the reaction. After polymerization, the polymer solution was cooled to 30° C. or less and concentrated to 200 g. The concentrate was transferred to a 1 l separation funnel and mixed with 200 g of methanol and 1,000 g of n-hexane. After being allowed to stand for 30 minutes, the lower layer was extracted to confirm that the weight was 226 g. 24 g of 2-butanone and 150 g of methanol were added to this solution. The mixture was transferred to a separation funnel and washed with 1,000 g of n-hexane. After being allowed to stand for 30 minutes, the lower layer was extracted and transformed into a propylene glycol monomethyl ether acetate solution using an evaporator. The yield was 75%.

The resin was a copolymer with a Mw of 10,900 in which the ratio of the recurring units derived from the compound (S-7), compound (S-23), and compound (S-24) was 60.1/30.2/9.7 (mol %). This resin is referred to as "resin (A-22)".

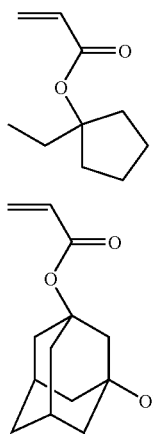

Synthesis Example 24

A monomer solution, prepared by dissolving 74.54 g (60 mol %) of the above compound (S-7), 14.38 g (30 mol %) of a compound (S-25) shown below, and 8.09 g (10 mol %) of the above compound (S-24) in 200 g of 2-butanone, and further adding 1.19 g of azobisisobutyronitrile and 1.48 g of n-dodecylmercaptan, was placed in a dropping funnel. A 500 ml three-neck flask containing 100 g of 2-butanone was purged with nitrogen for 30 minutes and heated to 80° C. while stirring. Then, the above monomer solution was added dropwise to the flask using a dripping funnel over two hours. The mixture was allowed to react for six hours after start of the reaction. After polymerization, the polymer solution was cooled to 30° C. or less and concentrated to 200 g. The concentrate was transferred to a 1 l separation funnel and mixed with 200 g of methanol and 1,000 g of n-hexane. After being allowed to stand for 30 minutes, the lower layer was extracted to confirm that the weight was 243 g. 7 g of 2-butanone and 150 g of methanol were added to this solution. The mixture was transferred to a separation funnel and washed with 1,000 g of n-hexane. After being allowed to stand for 30 minutes, the lower layer was extracted and transformed into a propylene glycol monomethyl ether acetate solution using an evaporator. The yield was 75%.

The resin was a copolymer with a Mw of 10,130 in which the ratio of the recurring units derived from the compound (S-7), compound (S-25), and compound (S-24) was 59.6/30.8/9.6 (mol %). This resin is referred to as "resin (A-23)".

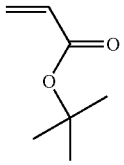

3. Examples 1-22 and Comparative Examples 1-2

The resins (A-1) to (A-23) and resin (a-1) prepared above, acid generators (B), acid diffusion controllers (C), additives (D), and solvents (E) were mixed at proportions shown in Tables 1-5 to prepare a homogeneous solution and filtered through a membrane filter with a pore diameter of 0.2 μm to obtain radiation-sensitive resin compositions. Various properties were evaluated according to the above methods. The results are shown in Tables 1-5.

Acid Generator (B)

B-1: 1-(4-n-butoxynaphthyl)tetrahydrothiophenium nonafluoro-n-butanesulfonate

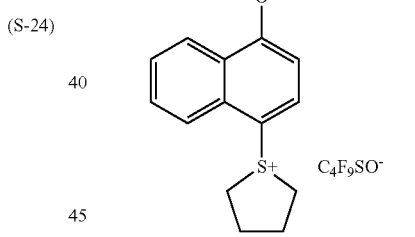

B-2: triphenylsulfonium nonafluorobutanesulfonate

B-3: 1-(4-n-butoxynaphthyl)tetrahydrothiophenium perfluorooctanesulfonate

B-4: 1-(4-n-butoxynaphthyl)tetrahydrothiophenium 2-bicyclo[2.2.1]hept-2-yl)-1,1,2,2-tetrafluoroethanesulfonate B-5: bis(4-t-butylphenyl)iodonium nonafluorobutanesulfonate B-6: N-nonafluorobutanesulfonyloxybicyclo[2.2.1]hept-5-ene-2,3-dicarboxylmide Acid Diffusion Controller (C)
C-1: 2-phenylbenzimidazole
C-2: N-t-butoxycarbonyl-2-phenylbenzimidazole
C-3: N-t-butoxycarbonyl-4-hydroxypiperidine Additives (D)
D1: 2,5-dimethyl-2,5-di(adamantanecarbonyloxy)hexane Solvent (E)
E-1: propylene glycol monomethyl ether acetate
E-2: γ-butyrolactone

TABLE 1

| | Example 1 | | Example 2 | | Example 3 | | Example 4 | |
|---|---|---|---|---|---|---|---|---|
| Resin (A) | A-1 | 100 | A-2 | 100 | A-3 | 100 | A-4 | 100 |
| Acid generator (B) | B-1 | 5 | B-1 | 5 | B-1 | 5 | B-1 | 5 |
| Acid diffusion controller (C) | C-1 | 0.3 | C-1 | 0.3 | C-1 | 0.3 | C-1 | 0.3 |
| Solvent (E) | E-1 | 600 | E-1 | 600 | E-1 | 600 | E-1 | 600 |
| Film thickness (mm) | 0.34 | | 0.34 | | 0.34 | | 0.34 | |
| Substrate | ARC25 | | ARC25 | | ARC25 | | ARC25 | |
| PB | 130° C. | 90 sec | 130° C. | 90 sec | 130° C. | 90 sec | 130° C. | 90 sec |
| PEB | 120° C. | 90 sec | 130° C. | 90 sec | 120° C. | 90 sec | 130° C. | 90 sec |
| Radiation transmittance (%) | 71 | | 72 | | 72 | | 71 | |
| Sensitivity (J/m$^2$) | 242 | | 248 | | 253 | | 232 | |
| Resolution (μm) | 0.13 | | 0.13 | | 0.13 | | 0.13 | |
| Dry-etching resistance | 0.9 | | 0.8 | | 0.8 | | 0.9 | |
| Development defects (number) | 0 | | 0 | | 0 | | 0 | |
| Pattern configuration | Good | | Good | | Good | | Good | |

| | Example 5 | | Example 6 | | Example 7 | | Example 8 | |
|---|---|---|---|---|---|---|---|---|
| Resin (A) | A-5 | 100 | A-6 | 100 | A-7 | 100 | A-8 | 100 |
| Acid generator (B) | B-1 | 5 | B-1 | 5 | B-1 | 5 | B-1 | 5 |
| Acid diffusion controller (C) | C-1 | 0.3 | C-2 | 0.3 | C-1 | 0.3 | C-1 | 0.3 |
| Solvent (E) | E-1 | 600 | E-1 | 600 | E-1 | 600 | E-1 | 600 |
| Film thickness (mm) | 0.34 | | 0.34 | | 0.34 | | 0.34 | |
| Substrate | ARC25 | | ARC25 | | ARC25 | | ARC25 | |
| PB | 130° C. | 90 sec | 130° C. | 90 sec | 130° C. | 90 sec | 130° C. | 90 sec |
| PEB | 110° C. | 90 sec | 130° C. | 90 sec | 130° C. | 90 sec | 110° C. | 90 sec |
| Radiation transmittance (%) | 70 | | 72 | | 70 | | 71 | |
| Sensitivity (J/m$^2$) | 236 | | 231 | | 225 | | 226 | |
| Resolution (μm) | 0.13 | | 0.13 | | 0.13 | | 0.13 | |
| Dry-etching resistance | 1.0 | | 0.8 | | 1.0 | | 0.9 | |
| Development defects (number) | 0 | | 0 | | 0 | | 0 | |
| Pattern configuration | Good | | Good | | Good | | Good | |

TABLE 2

| | Example 9 | | Example 10 | | Example 11 | | Example 12 | | Example 13 | | Example 14 | | Comparative Example 1 | |
|---|---|---|---|---|---|---|---|---|---|---|---|---|---|---|
| Resin (A) | A-9 | 100 | A-10 | 100 | A-11 | 100 | A-12 | 100 | A-13 | 100 | A-14 | 100 | a-1 | 100 |
| Acid generator (B) | B-1 | 5 | B-1 | 5 | B-1 | 5 | B-1 | 5 | B-1 | 5 | B-1 | 5 | B-1 | 5 |
| Acid diffusion controller (C) | C-1 | 0.3 | C-1 | 0.3 | C-1 | 0.3 | C-1 | 0.3 | C-1 | 0.3 | C-1 | 0.3 | C-1 | 0.3 |
| Solvent (E) | E-1 | 600 | E-1 | 600 | E-1 | 600 | E-1 | 600 | E-1 | 600 | E-1 | 600 | E-1 | 600 |
| Film thickness (mm) | 0.34 | | 0.34 | | 0.34 | | 0.34 | | 0.34 | | 0.34 | | 0.34 | |
| Substrate | ARC25 | | ARC25 | | ARC25 | | ARC25 | | ARC25 | | ARC25 | | ARC25 | |
| PB | 130° C. | 90 sec | 130° C. | 90 sec | 130° C. | 90 sec | 130° C. | 90 sec | 130° C. | 90 sec | 130° C. | 90 sec | 130° C. | 90 sec |
| PEB | 120° C. | 90 sec | 120° C. | 90 sec | 100° C. | 90 sec | 100° C. | 90 sec | 100° C. | 90 sec | 100° C. | 90 sec | 130° C. | 90 sec |
| Radiation transmittance (%) | 72 | | 71 | | 72 | | 71 | | 72 | | 71 | | 70 | |
| Sensitivity (J/m$^2$) | 290 | | 310 | | 272 | | 240 | | 264 | | 226 | | 274 | |
| Resolution (μm) | 0.13 | | 0.13 | | 0.13 | | 0.13 | | 0.13 | | 0.13 | | 0.13 | |
| Dry-etching resistance | 0.9 | | 0.9 | | 0.9 | | 0.9 | | 1.0 | | 1.0 | | 1.0 | |
| Development defects (number) | 0 | | 0 | | 0 | | 0 | | 0 | | 0 | | 526 | |

TABLE 2-continued

|  | Example | | | | | | Comparative Example |
|---|---|---|---|---|---|---|---|
|  | 9 | 10 | 11 | 12 | 13 | 14 | 1 |
| Pattern configuration | Good | Good | Good | Good | Good | Good | Good |

TABLE 3

|  | Example | | | | |
|---|---|---|---|---|---|
|  | 15 | 16 | 17 | 18 | 19 |
| Resin (A) | A-9 100 | A-15 100 | A-16 100 | A-17 100 | A-18 100 |
| Acid generator (B) | B-1 4 | B-1 4 | B-1 4 | B-1 4 | B-1 4 |
|  | B-2 1 | B-2 1 | B-2 1 | B-2 1 | B-2 1 |
| Acid diffusion controller (C) | C-1 0.334 | C-1 0.334 | C-1 0.334 | C-1 0.334 | C-1 0.334 |
| Solvent (E) | E-1 850 | E-1 850 | E-1 850 | E-1 850 | E-1 850 |
| Film thickness (μm) | 0.2 | 0.2 | 0.2 | 0.2 | 0.2 |
| Substrate | ARC29A | ARC29A | ARC29A | ARC29A | ARC29A |
| PB | 130° C. 90 sec | 120° C. 90 sec | 130° C. 90 sec | 110° C. 90 sec | 105° C. 90 sec |
| PEB | 130° C. 90 sec | 110° C. 90 sec | 130° C. 90 sec | 100° C. 90 sec | 105° C. 90 sec |
| Radiation transmittance (%) | 72 | 71 | 70 | 70 | 75 |
| Sensitivity (J/m$^2$) | 280 | 265 | 250 | 285 | 290 |
| Resolution (nm) | 90 | 90 | 90 | 90 | 90 |
| Dry-etching resistance | 0.9 | 0.9 | 0.9 | 0.9 | 1.0 |
| Development defects (number) | 0 | 0 | 0 | 0 | 0 |
| Pattern configuration | Good | Good | Good | Good | Good |

TABLE 4

|  | Example | | | Comparative Example |
|---|---|---|---|---|
|  | 20 | 21 | 22 | 2 |
| Resin (A) | A-19 100 | A-20 100 | A-21 100 | a-1 100 |
| Acid generator (B) | B-1 4 | B-1 4 | B-1 4 | B-1 4 |
|  | B-2 1 | B-2 1 | B-2 1 | B-2 1 |
| Acid diffusion controller (C) | C-1 0.334 | C-1 0.334 | C-1 0.334 | C-1 0.334 |
| Solvent (E) | E-1 850 | E-1 850 | E-1 850 | E-1 850 |
| Film thickness (μm) | 0.2 | 0.2 | 0.2 | 0.2 |
| Substrate | ARC29A | ARC29A | ARC29A | ARC29A |
| PB | 105° C. 90 sec | 105° C. 90 sec | 105° C. 90 sec | 130° C. 90 sec |
| PEB | 105° C. 90 sec | 105° C. 90 sec | 105° C. 90 sec | 130° C. 90 sec |
| Radiation transmittance (%) | 73 | 72 | 73 | 70 |
| Sensitivity (J/m$^2$) | 265 | 280 | 265 | 275 |
| Resolution (nm) | 90 | 90 | 90 | 100 |
| Dry-etching resistance | 1.0 | 1.0 | 1.0 | 1.0 |
| Development defects (number) | 0 | 0 | 0 | 526 |
| Pattern configuration | Good | Good | Good | Good |

TABLE 5

|  | Example | | | | | |
|---|---|---|---|---|---|---|
|  | 23 | 24 | 25 | 26 | 27 | 28 |
| Resin (A) | A-9 70 | A-9 10 | A-22 100 | A-23 100 | A-22 100 | A-23 100 |
|  | A-17 30 | A-16 90 |  |  |  |  |
| Acid generator (B) | B-3 5 | B-1 4 | B-1 4 | B-1 4 | B-5 2.5 | B-5 2.5 |
|  |  | B-2 1 | B-2 1 | B-2 1 | B-6 2.5 | B-6 2.5 |
|  |  | B-4 2 |  |  |  |  |
| Acid diffusion controller (C) | C-2 0.374 | C-2 0.715 | C-2 0.334 | C-2 0.334 | C-3 0.084 | C-3 0.084 |
| Additive (D) | — | — | — | — | D-1 5 | D-1 5 |
| Solvent (E) | E-1 850 | E-1 900 | E-1 900 | E-1 900 | E-1 900 | E-1 900 |
|  | E-3 30 |  |  |  |  |  |
| Film thickness (μm) | 0.2 | 0.2 | 0.2 | 0.2 | 0.2 | 0.2 |

TABLE 5-continued

| | Example | | | | | |
|---|---|---|---|---|---|---|
| | 23 | 24 | 25 | 26 | 27 | 28 |
| Substrate | ARC29A | ARC29A | ARC29A | ARC29A | ARC29A | ARC29A |
| PB | 110° C. 90 sec | 110° C. 90 sec | 105° C. 90 sec | 105° C. 90 sec | 120° C. 90 sec | 120° C. 90 sec |
| PEB | 115° C. 90 sec | 120° C. 90 sec | 105° C. 90 sec | 115° C. 90 sec | 105° C. 90 sec | 115° C. 90 sec |
| Radiation transmittance (%) | 73 | 71 | 76 | 75 | 77 | 75 |
| Sensitivity (J/m$^2$) | 325 | 306 | 314 | 309 | 283 | 272 |
| Resolution (nm) | 90 | 90 | 90 | 90 | 90 | 90 |
| Dry-etching resistance | 1.0 | 1.1 | 1.1 | 1.0 | 1.0 | 1.1 |
| Development defects (number) | 0 | 0 | 0 | 0 | 0 | 0 |
| Pattern configuration | Good | Good | Good | Good | Good | Good |

INDUSTRIAL APPLICABILITY

The radiation-sensitive resin composition of the present invention exhibits high resolution, excels in sensitivity, pattern configuration, and etching resistance, and exhibits only minimal fluctuation of patterns after etching. In addition, the radiation-sensitive resin composition of the present invention exhibits excellent solubility in developers and produces development defects only to a minimal extent. Furthermore, the radiation-sensitive resin composition of the present invention exhibits excellent adhesion with substrates and produces a superior skirt configuration. Therefore, the radiation-sensitive resin composition of the present invention can be used, for example, in manufacturing integrated circuit elements which are demanded to become further micronized in the future.

The invention claimed is:

1. A radiation-sensitive resin composition comprising:

(A) a resin which comprises from 5 to 90 mole percent of a recurring unit (1-1) shown by the following formula (I-1):

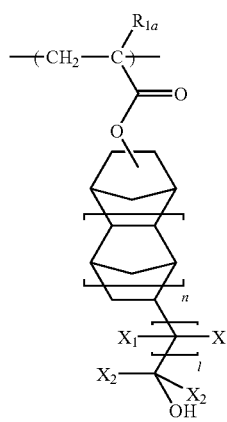

(I-1)

wherein $R_{1a}$ represents a hydrogen atom, a methyl group, a hydroxyalkyl group having 1-4 carbon atoms, or a perfluoroalkyl group having 1-4 carbon atoms, $X_1$ and $X_2$ individually represent a hydrogen atom, a fluorine atom, an alkyl group having 1-4 carbon atoms, or a fluoroalkyl group having 1-4 carbon atoms, l is an integer of 0-5, and n is an integer of 0-2, the resin being insoluble or scarcely soluble in alkali, but becoming alkali soluble by the action of an acid, and (B) a photoacid generator comprising at least one compound selected from the group consisting of 1-(4-n-butoxynaphthalen-1-yl)tetrahydrothiophenium nonafluoro-n-butanesulfonate and bis(4-t-butylphenyl) iodonium nonafluoro-n-butanesulfonate, wherein the resin does not comprise an aromatic ring.

2. A radiation-sensitive resin composition comprising:

(A) a resin which comprises a recurring unit (1-1) shown by the following formula (I-1):

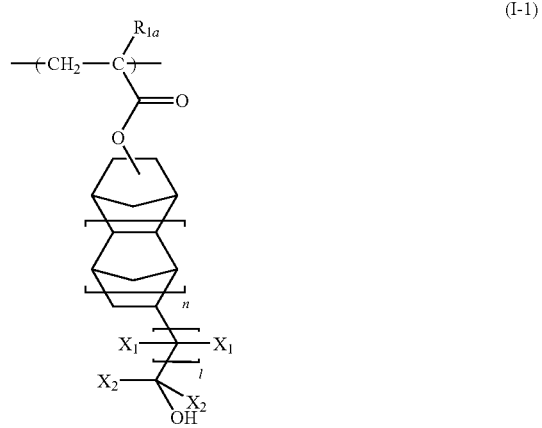

(I-1)

wherein $R_{1a}$ represents a hydrogen atom, a methyl group, a hydroxyalkyl group having 1-4 carbon atoms, or a perfluoroalkyl group having 1-4 carbon atoms, $X_1$ and $X_2$ individually represent a hydrogen atom, a fluorine atom, an alkyl group having 1-4 carbon atoms, or a fluoroalkyl group having 1-4 carbon atoms, l is an integer of 0-5, and n is an integer of 0-2, and a recurring unit (1-2) shown by the following formula (I-2):

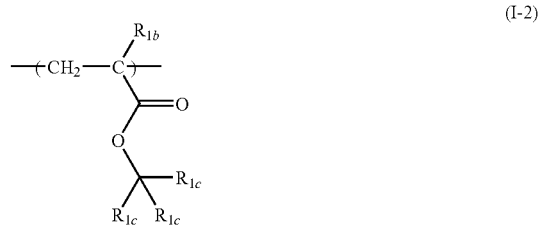

(I-2)

wherein $R_{1b}$ represents a hydrogen atom or a methyl group, $R_{1c}$ individually represents a monovalent alicyclic hydrocarbon group having 4-20 carbon atoms or a derivative thereof, or a linear or branched alkyl group having 1-4 carbon atoms, provided that (1) at least one of the $R_{1c}$ groups is a monovalent alicyclic hydrocarbon group having 4-20 carbon atoms, or (2) any two of the $R_{1c}$ groups form, in combination and together with the carbon atom with which these groups bond, a divalent alicyclic hydrocarbon group having 4-20 carbon atoms or a derivative thereof, with the other $R_{1c}$ group being a monovalent alicyclic hydrocarbon group having 4-20 carbon atoms or a derivative thereof, or a linear or branched alkyl group having 1-4 carbon atoms the resin being insoluble or scarcely soluble in alkali, but becoming alkali soluble by the action of an acid, and (B) a photoacid generator comprising at least one compound selected from the group consisting of 1-(4-n-butoxynaphthalen-1-yl)tetrahydrothiophenium nonafluoro-n-butanesulfonate and bis(4-t-butylphenyl) iodonium nonafluoro-n-butanesulfonate, wherein the resin does not comprise an aromatic ring.

3. The radiation sensitive resin composition according to claim 2, wherein the group —C($R_{1c}$)$_3$ in the formula (I-2) is a 1-alkyl-1-cycloalkyl group, 2-alkyl-2-adamantyl group, (1-alkyl-1-adamantyl)alkyl group, or (1-alkyl-1-norbornyl)alkyl group.

4. The radiation-sensitive resin composition according to claim 1, wherein the resin does not contain a lactone ring.

5. A radiation-sensitive resin composition comprising:

(A) a resin which comprises a recurring unit (1-1) shown by the following formula (I-1):

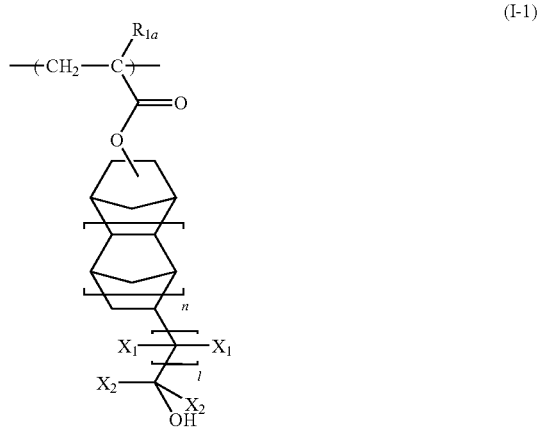

(I-1)

wherein $R_{1a}$ represents a hydrogen atom, a methyl group, a hydroxyalkyl group having 1-4 carbon atoms, or a perfluoroalkyl group having 1-4 carbon atoms, $X_1$ and $X_2$ individually represent a hydrogen atom, a fluorine atom, an alkyl group having 1-4 carbon atoms, or a fluoroalkyl group having 1-4 carbon atoms, l is an integer of 0-5, and n is an integer of 0-2, the resin being insoluble or scarcely soluble in alkali, but becoming alkali soluble by the action of an acid, and (B) a photoacid generator comprising at least one compound selected from the group consisting of 1-(4-n-butoxynaphthalen-1-yl)tetrahydrothiophenium nonafluoro-n-butanesulfonate and bis(4-t-butylphenyl) iodonium nonafluoro-n-butanesulfonate, wherein the resin does not comprise a lactone ring wherein the resin does not comprise an aromatic ring, and wherein the content of the recurring unit (1-1) in the resin is 40-90 mol % in 100 mol % of the total recurring units forming the resin.

6. A radiation-sensitive resin composition comprising:

(A) a resin which comprises a recurring unit (1-1) shown by the following formula (I-1):

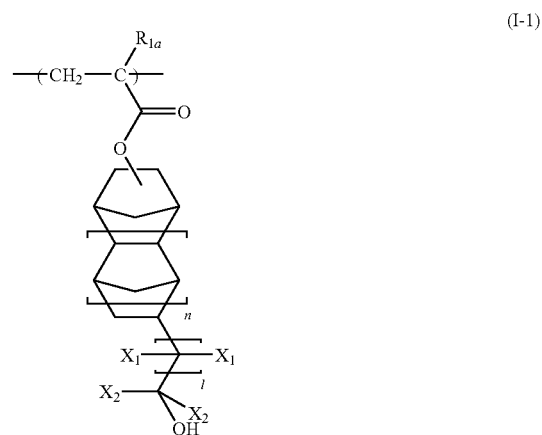

(I-1)

wherein $R_{1a}$ represents a hydrogen atom, a methyl group, a hydroxyalkyl group having 1-4 carbon atoms, or a perfluoroalkyl group having 1-4 carbon atoms, $X_1$ and $X_2$ individually represent a hydrogen atom, a fluorine atom, an alkyl group having 1-4 carbon atoms, or a fluoroalkyl group having 1-4 carbon atoms, l is an integer of 0-5, and n is an integer of 0-2, and a recurring unit (1-3) shown by the following formula (I-3):

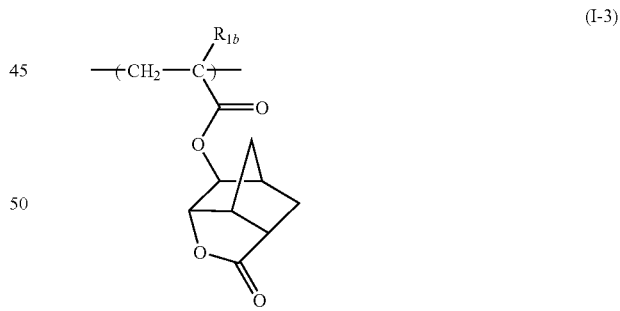

(I-3)

wherein $R_{1b}$ represents a hydrogen atom or a methyl group, the resin being insoluble or scarcely soluble in alkali, but becoming alkali soluble by the action of an acid, and (B) a photoacid generator wherein the resin does not comprise an aromatic ring.

7. The radiation-sensitive resin composition according to claim 6, wherein the content of the recurring unit (1-1) in the resin is 5-25 mol % in 100 mol % of the total recurring units forming the resin.

8. A radiation-sensitive resin composition comprising:
(A) a resin which comprises a recurring unit (1-1) shown by the following formula (I-1):

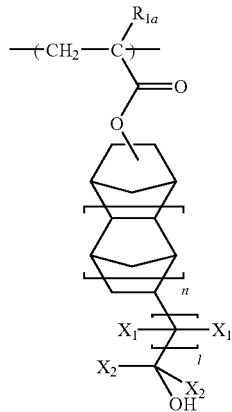

(I-1)

wherein $R_{1a}$ represents a hydrogen atom, a methyl group, a hydroxyalkyl group having 1-4 carbon atoms, or a perfluoroalkyl group having 1-4 carbon atoms, $X_1$ and $X_2$ individually represent a hydrogen atom, a fluorine atom, an alkyl group having 1-4 carbon atoms, or a fluoroalkyl group having 1-4 carbon atoms, l is an integer of 0-5, and n is an integer of 0-2, and a recurring unit (1-4) shown by the following formula (I-4):

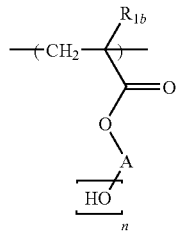

(I-4)

wherein $R_{1b}$ represents a hydrogen atom or a methyl group, A represents a linear or branched alkyl or alkylene group having 1-4 carbon atoms or a monovalent or divalent alicyclic hydrocarbon group having 4-20 carbon atoms or a derivative thereof, and n is an integer of 0-2, the resin being insoluble or scarcely soluble in alkali, but becoming alkali soluble by the action of an acid, and
(B) a photoacid generator comprising at least one compound selected from the group consisting of 1-(4-n-butoxynaphthalen-1-yl)tetrahydrothiophenium nonafluoro-n-butanesulfonate and bis(4-t-butylphenyl) iodonium nonafluoro-n-butanesulfonate
wherein the resin does not comprise an aromatic ring.

9. The radiation-sensitive resin composition according to claim 1, further comprising (C) an acid diffusion controller.

10. A radiation-sensitive resin composition comprising:
(A) a resin which comprises a recurring unit (1-1) shown by the following formula (I-1):

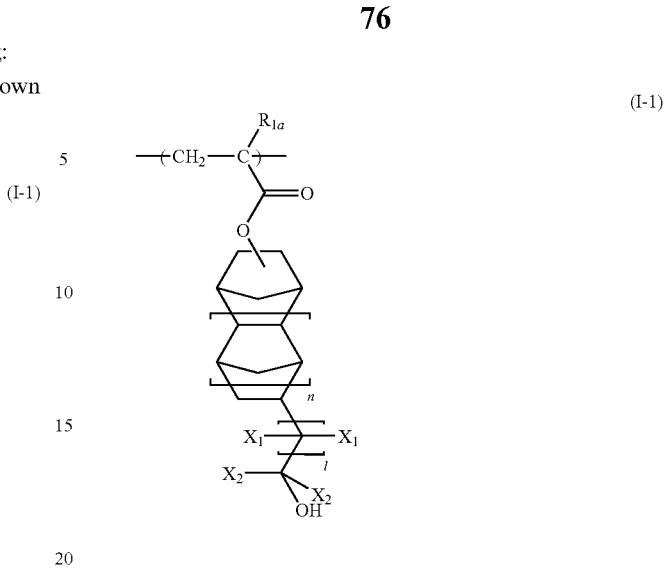

(I-1)

wherein $R_{1a}$ represents a hydrogen atom, a methyl group, a hydroxyalkyl group having 1-4 carbon atoms, or a perfluoroalkyl group having 1-4 carbon atoms, $X_1$ and $X_2$ individually represent a hydrogen atom, a fluorine atom, an alkyl group having 1-4 carbon atoms, or a fluoroalkyl group having 1-4 carbon atoms, l is an integer of 0-5, and n is an integer of 0-2, the resin being insoluble or scarcely soluble in alkali, but becoming alkali soluble by the action of an acid,
(B) a photoacid generator comprising at least one compound selected from the group consisting of 1-(4-n-butoxynaphthalen-1-yl)tetrahydrothiophenium nonafluoro-n-butanesulfonate and bis(4-t-butylphenyl) iodonium nonafluoro-n-butanesulfonate, and
(C) an acid diffusion controller
wherein the resin does not comprise an aromatic ring.

11. A radiation-sensitive resin composition comprising:
(A) a resin which comprises a recurring unit (1-1) shown by the following formula (I-1):

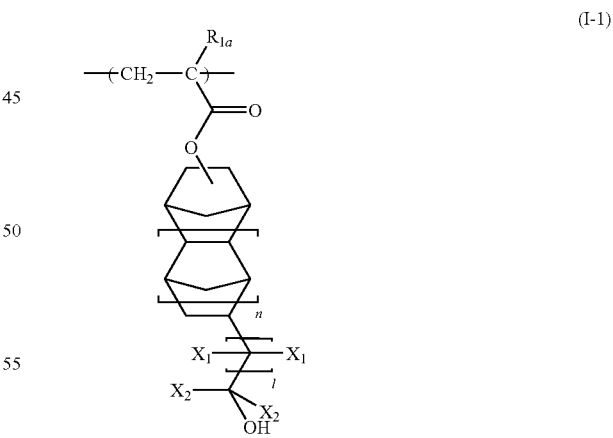

(I-1)

wherein $R_{1a}$ represents a hydrogen atom, a methyl group, a hydroxyalkyl group having 1-4 carbon atoms, or a perfluoroalkyl group having 1-4 carbon atoms, $X_1$ and $X_2$ individually represent a hydrogen atom, a fluorine atom, an alkyl group having 1-4 carbon atoms, or a fluoroalkyl group having 1-4 carbon atoms, l is an integer of 0-5, and n is 1 or 2, the resin being insoluble or scarcely soluble in alkali, but becoming alkali soluble by the action of an acid, and (B) a photoacid generator comprising at least one compound selected from the group consisting of 1-(4-n-butoxynaphthalen-1-yl)tetrahydrothiophenium nonafluoro-n-butanesulfonate and bis(4-t-butylphenyl)iodonium nonafluoro-n-butanesulfonate,
wherein the resin does not comprise an aromatic ring.

12. The radiation-sensitive resin composition of claim 11, wherein n is 1, l is 1, each $X_1$ is H and each $X_2$ is $CF_3$.

13. The radiation-sensitive resin composition of claim 6, further comprising (C) an acid diffusion controller.

14. The radiation-sensitive resin composition of claim 6, wherein the resin (A) comprises a recurring unit (1-2) shown by the following formula (I-2):

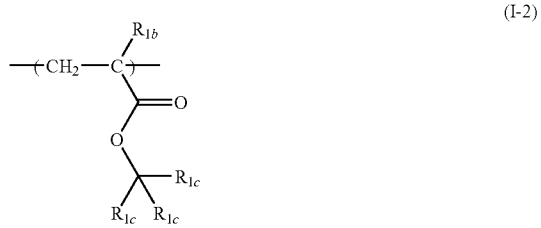

(I-2)

wherein $R_{1b}$ represents a hydrogen atom or a methyl group, $R_{1c}$ individually represents a monovalent alicyclic hydrocarbon group having 4-20 carbon atoms or a derivative thereof, or a linear or branched alkyl group having 1-4 carbon atoms, provided that (1) at least one of the $R_{1c}$ groups is a monovalent alicyclic hydrocarbon group having 4-20 carbon atoms, or (2) any two of the $R_{1c}$ groups form, in combination and together with the carbon atom with which these groups bond, a divalent alicyclic hydrocarbon group having 4-20 carbon atoms or a derivative thereof, with the other $R_{1c}$ group being a monovalent alicyclic hydrocarbon group having 4-20 carbon atoms or a derivative thereof, or a linear or branched alkyl group having 1-4 carbon atoms.

15. The radiation sensitive resin composition of claim 14, wherein the group —$C(R_{1c})_3$ in the formula (I-2) is a 1-alkyl-1-cycloalkyl group, a 2-alkyl-2-adamantyl group, a (1-alkyl-1-adamantyl)alkyl group, or a (1-alkyl-1-norbornyl)alkyl group.

* * * * *